(12) United States Patent
Tezuka et al.

(10) Patent No.: US 7,923,314 B2
(45) Date of Patent: Apr. 12, 2011

(54) FIELD EFFECT TRANSISTOR AND METHOD FOR MANUFACTURING THE SAME

(75) Inventors: Tsutomu Tezuka, Yokohama (JP); Eiji Toyoda, Niigata-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 12/234,526

(22) Filed: Sep. 19, 2008

(65) Prior Publication Data

US 2009/0090934 A1    Apr. 9, 2009

(30) Foreign Application Priority Data

Oct. 5, 2007    (JP) ................. 2007-262344

(51) Int. Cl.
*H01L 21/00*    (2006.01)
(52) U.S. Cl. ........ 438/157; 438/142; 438/151; 438/283; 257/190; 257/347; 257/E21.403
(58) Field of Classification Search .............. 257/15–20, 257/347–349, 353, 401, 190
See application file for complete search history.

(56) References Cited

U.S. PATENT DOCUMENTS

| 6,630,389 | B2 | 10/2003 | Shibata et al. |
| 6,774,390 | B2 | 8/2004 | Sugiyama et al. |
| 2008/0001171 | A1 | 1/2008 | Tezuka et al. |

FOREIGN PATENT DOCUMENTS

| JP | 2001-298194 | 10/2001 |
| JP | 2003-229479 | 8/2003 |
| JP | 2003-282869 | 10/2003 |
| JP | 2005-39171 | 2/2005 |

OTHER PUBLICATIONS

Detailed translation of JP-A-2001-298194.*
First Notification of Reasons for Rejection issued by the Chinese Patent Office on Dec. 11, 2009, for Chinese Patent Application No. 200810161763.9, and English-language translation thereof.
Notification of Reasons for Rejection issued by the Japanese Patent Office on Aug. 21, 2009, for Japanese Patent Application No. 2007-262344, and English-language translation thereof.
T. Ernst et al., "Novel 3D Integration Process for Highly Scalable Nano-Beam Stacked-Channels GAA (NBG) FinFETs with HfO$_2$/TiN Gate Stack", IEDM Tech., Dig., 2006/IEDM. 2006.346955, (4 pages).

(Continued)

*Primary Examiner* — N Drew Richards
*Assistant Examiner* — Mamadou Diallo
(74) *Attorney, Agent, or Firm* — Finnegan, Henderson, Farabow, Garrett & Dunner, L.L.P.

(57) ABSTRACT

A method for manufacturing a field effect transistor, includes: forming a mask of an insulating film on a semiconductor layer containing Si formed on a semiconductor substrate; forming the semiconductor layer into a mesa structure by performing etching with the use of the mask, the mesa structure extending in a direction parallel to an upper face of the semiconductor substrate; narrowing a distance between two sidewalls of the mesa structure and flattening the sidewalls by performing a heat treatment in a hydrogen atmosphere, the two sidewalls extending in the direction and facing each other; forming a gate insulating film covering the mesa structure having the sidewalls flattened; forming a gate electrode covering the gate insulating film; and forming source and drain regions at portions of the mesa structure, the portions being located on two sides of the gate electrode.

9 Claims, 36 Drawing Sheets

OTHER PUBLICATIONS

W. Xiong et al., "Improvement of FinFET Electrical Characteristics by Hydrogen Annealing", IEEE Electron Device Letters, vol. 25, No. 8, pp. 541-543, Aug. 2004.

J. Lee et al., "Hydrogen Annealing Effect on DC and Low-Frequency Noise Characteristics in CMOS FinFETs", IEEE Electron Device Letters, vol. 24, No. 3, pp. 186-188, Mar. 2003.

H. Habuka et al., "Roughness of Silicon Surface Heated in Hydrogen Ambient", J. Electrochem. Soc., vol. 142, No. 9, pp. 3092-3097, Sep. 1995, The Electrochemical Society, Inc.

L. K. Bera et al., "Three Dimensionally Stacked SiGe Nanowire Array and Gate-All-Around p-MOSFETs", IEDM Tech. Dig., 2006/IEDM. 2006.346841 (4 pages).

M. Lee et al., "3D Silicon Transformation Using Hydrogen Annealing", Solid-State Sensor, Actuator and Microsystems Workshop, Hilton Head Island, South Carolina, pp. 19-22, Jun. 6-10, 2004.

Decision of Final Rejection issued by the Japanese Patent Office on Nov. 10, 2009, for Japanese Patent Application No. 2007-262344, and English-language translation thereof.

* cited by examiner

AFTER 5-minute ANNEALING IN ATMOSPHERIC-PRESSURE H2 GAS AT 1000°C AFTER RIE

AFTER MESA ETCHING BY RIE

MEAN MESA(FIN)WIDTH 34 nm AFTER 5-minute ANNEALING IN ATMOSPHERIC-PRESSURE H2 GAS AT 1000°C AFTER RIE MEAN MESA(FIN)WIDTH 65 nm AFTER MESA ETCHING BY RIE

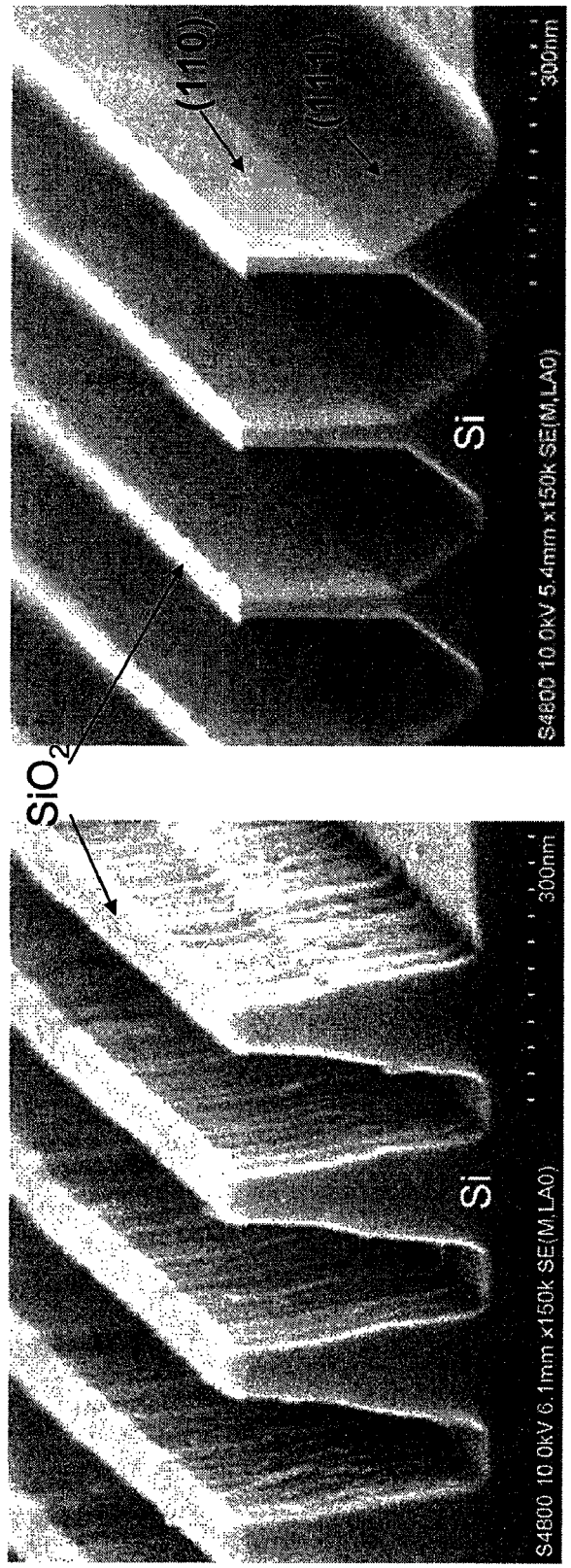
FIG. 34B AFTER 5-minute ANNEALING IN ATMOSPHERIC-PRESSURE H₂ GAS AT 950°C AFTER RIE
FIG. 34A AFTER FIN PROCESSING BY RIE THERMAL OXIDIZATION AFTER 5-minute ANNEALING IN ATMOSPHERIC-PRESSURE H₂ GAS AT 1000°C

THERMAL OXIDIZATION WITHOUT HYDROGEN THERMAL ETCHING

FIELD EFFECT TRANSISTOR AND METHOD FOR MANUFACTURING THE SAME

CROSS-REFERENCE TO RELATED APPLICATION

This application is based upon and claims the benefit of priority from prior Japanese Patent Application No. 2007-262344 filed on Oct. 5, 2007 in Japan, the entire contents of which are incorporated herein by reference.

BACKGROUND OF THE INVENTION

1. Field of the Invention

The present invention relates to a field effect transistor and a method for manufacturing the field effect transistor.

2. Related Art

Conventionally, the driving current per unit gate length is increased by reducing the gate length of each transistor and thinning each gate insulating film, so as to form more sophisticated CMOS circuit devices with higher performance. In this trend, the transistor size that can obtain the necessary driving current has become smaller, and high integration can be achieved. At the same time, the driving voltage has become lower, and the power consumption per unit device can be reduced.

However, as the gate lengths have become smaller, the technical hurdle that needs to be crossed to achieve higher performances is rapidly becoming higher. To counter this difficult situation, a structure including two or more gate electrodes is effective. For example, a double-gate structure having gate electrodes above and below the channel, and a gate-all-around structure that has gate electrodes surrounding the channel are effective. Among gate-all-around structures, those with channels having diameters of 10 nm or less are also known as nanowire transistors. Structures each having a gate formed at either side of the channel (fin) of a mesa structure that is perpendicular to the substrate and has a plate-like shape are called Fin FETs, and structures each having a gate formed on each of the three faces (the two sidewalls and the upper face) are called tri-gate FETs. Those structures are collectively called multi-gate structures. By virtue of the gates, each of those structures has greater electro-static controllability of the channel carriers than that of a regular planar-type single-gate structure. Thus, those structures can effectively prevent the short-channel effects even when the impurity concentration in the channels is restricted to a low value.

Only with a single multi-gate channel, the ON current per FET occupation area might not exceed the ON current of a regular planar-type MOSFET. Therefore, there has been a structure in which multi-gate channels are stacked in the vertical direction to obtain a sufficient ON current (see T. Ernst, et al., IEDM Tech. Dig., 2006/IEDM.2006.346955, for example). According to T. Ernst, et al., IEDM Tech. Dig., 2006/IEDM.2006.346955, Si layers and SiGe layers are alternately stacked in advance, and RIE (Reactive Ion Etching) is performed to form fins and mesas. After that, selective etching is performed to remove only the SiGe layers from the sidewalls.

The channels of those multi-gate MOSFETs are normally formed with mesa structures or fins formed on a SOI substrate or a bulk Si substrate by a lithography technique and RIE. Here, there exist two technical problems: 1) size and shape variations are caused; and 2) the widths of fins need to be reduced to approximately 10 nm or less, which is smaller than the limit in terms of lithography.

The problem of variations as the first problem can be divided into two factors. One is the shape and size variations in the plane of the substrate. The shape and size variations are caused due to the line width variation caused by the lithography and line edge roughness (LER). The other factor concerns the variation in the shapes of cross sections perpendicular to the substrate, and is caused by the variation in mesa width in the vertical direction caused by RIE. The width variations result in variations in electric characteristics such as threshold voltages, and the uneven surfaces of the sidewalls cause an increase in carrier scattering and a decrease in driving current.

To avoid the adverse influence, there are reported cases where high-temperature annealing was performed on Fin FETs having Si channels in a hydrogen atmosphere after RIE was performed. For example, a decrease in leakage by virtue of the hydrogen annealing performed on the sidewalls of Fin FETs has been reported (see W. Xiong, et al., IEEE Electron Device Lett. 25, 541 (2004), for example). This was achieved as the corners of the cross sections of fins were rounded by the surface migration of the Si atoms caused by the hydrogen annealing, and the field concentration was relaxed. An increase in ON current and a reduction in noise have also been reported (see J-S Lee, et al., IEEE Electron Device Lett. 24, 186 (2003), for example). However, this technique is also based on the surface flattening effect of the surface migration of Si atoms.

To counter the problem of the need to reduce fin widths as the second problem, sacrifice oxidation is normally performed. However, it is difficult to reduce the widths while maintaining the rectangular shapes of the fins, because of the stress in the oxide films and the dependence of the oxidation rate on the surface orientation.

By a conventional hydrogen annealing technique, however, the cross sections of the sidewalls tend to have round corners due to the surface migration. Therefore, the conventional hydrogen annealing technique is not suitable for controlling the shapes of cross sections of Fin FETs having smaller fin widths that are required in more minute CMOS. Furthermore, the effect of the hydrogen annealing to reduce the line edge roughness caused by the lithographic process is not clearly disclosed as technical information.

In a case where a conventional hydrogen annealing technique is used to form a structure having channels stacked in the vertical direction, the channel width of each upper layer differs from the channel width of each lower layer, since the shapes of the etched cross sections are not rectangular, and variations might be caused among the threshold values of the channels and the likes.

In a case where SiGe-Fin FETs or nanowire FETs are produced by performing a Ge-condensation by oxidization process on SiGe fins, the Ge composition varies with the variation in line width, and variations might be caused in ON current and threshold voltage value. Furthermore, there has not been a report that the variation in line width was reduced by flattening the sidewalls of SiGe fins by a conventional hydrogen annealing technique. As described above, to counter the problem of the need to reduce fin widths, a sacrifice oxide film is normally used. However, it is difficult to reduce the fin widths while maintaining the rectangular shapes of the fins, due to the stress in the oxide film and the dependence of the oxidation rate on the plane direction.

SUMMARY OF THE INVENTION

The present invention has been made in view of these circumstances, and an object thereof is to provide a field effect transistor and method for manufacturing the field effect transistor that has the smallest possible size and shape variation among channels and the smallest possible channel width.

A method for manufacturing a field effect transistor according to a first aspect of the present invention includes: forming a mask of an insulating film on a semiconductor layer containing Si formed on a semiconductor substrate; forming the semiconductor layer into a mesa structure by performing etching with the use of the mask, the mesa structure extending in a direction parallel to an upper face of the semiconductor substrate; narrowing a distance between two sidewalls of the mesa structure and flattening the sidewalls by performing a heat treatment in a hydrogen atmosphere, the two sidewalls extending in the direction and facing each other; forming a gate insulating film covering the mesa structure having the sidewalls flattened; forming a gate electrode covering the gate insulating film; and forming source and drain regions at portions of the mesa structure, the portions being located on two sides of the gate electrode.

A method for manufacturing a field effect transistor according to a second aspect of the present invention includes: forming first and second masks of insulating films on first and second semiconductor layers of Si, the first and second semiconductor layers formed in different regions from each other on a semiconductor substrate; forming the first semiconductor layer into a first mesa structure and the second semiconductor layer into a second mesa structure by performing etching with the use of the first and second masks, the first mesa structure extending in a first direction parallel to an upper face of the semiconductor substrate, the second mesa structure extending in a second direction parallel to the upper face of the semiconductor substrate; narrowing each distance between two first sidewalls of the first mesa structure and flattening the first sidewalls by performing a heat treatment in a hydrogen atmosphere, the two first sidewalls extending in the first direction and facing each other, and narrowing each distance between two second sidewalls of the second mesa structure and flattening the second sidewalls by performing the heat treatment in the hydrogen atmosphere, the two second sidewalls extending in the second direction and facing each other; forming a third mask that covers the first mesa structure and leaves the flattened second sidewalls of the second mesa structure exposed; forming a SiGe film on each of the flattened second sidewalls of the second mesa structure; performing thermal oxidization to turn the second mesa structure and the SiGe film into a third mesa structure made of SiGe and a silicon oxide film, the third mesa structure being thinner than the second mesa structure and the silicon oxide film covering sidewalls of the third mesa structure; removing the silicon oxide film; forming first and second gate insulating films covering the first and third mesa structures, respectively; forming first and second gate electrodes covering the first and second gate insulating films, respectively; forming first source and drain regions at portions of the first mesa structure, the portions being located on two sides of the first gate electrode; and forming second source and drain regions at portions of the third mesa structure, the portion being located on two sides of the second gate electrode.

A method for manufacturing a field effect transistor according to a third aspect of the present invention includes: forming first and second masks made of insulating films on a Si layer and a SiGe layer, the Si layer and the SiGe layer formed in different regions from each other on a semiconductor substrate; forming the Si layer into a first mesa structure and the SiGe layer into a second mesa structure by performing etching with the use of the first and second masks, the first mesa structure extending in a first direction parallel to an upper face of the semiconductor substrate, the second mesa structure extending in a second direction parallel to the upper face of the semiconductor substrate; narrowing each distance between two first sidewalls of the first mesa structure and flattening the first sidewalls by performing a heat treatment in a hydrogen atmosphere, the two first sidewalls extending in the first direction and facing each other, and narrowing each distance between two second sidewalls of the second mesa structure and flattening the second sidewalls by performing the heat treatment in the hydrogen atmosphere, the two second sidewalls extending in the second direction and facing each other; forming first and second gate insulating films covering the first and second mesa structures having the sidewalls flattened, respectively; forming first and second gate electrodes covering the first and second gate insulating films, respectively; forming first source and drain regions at portions of the first mesa structure, the portions being located on two sides of the first gate electrode; and forming second source and drain regions at portions of the second mesa structure, the portions being located on two sides of the second gate electrode.

A field effect transistor according to a fourth aspect of the present invention includes: a semiconductor mesa structure on a Si substrate having a $\{001\}$ plane as a principal surface, having a rectangular parallelepiped shape, contains Si, having an upper face formed with a $\{001\}$ plane, and having two sidewalls facing each other and being formed with $\{110\}$ planes; a source region and a drain region formed at a distance from each other in a longitudinal direction of the mesa structure; a gate insulating film formed on a portion of the mesa structure, the portion being between the source region and the drain region; and a gate electrode formed on the gate insulating film, a connecting portion between each of the sidewalls of the mesa structure and the Si substrate being formed with a $\{111\}$ plane.

BRIEF DESCRIPTION OF THE DRAWINGS

FIGS. 1(a) to 2(f) illustrate the manufacturing procedures according to a manufacture method of a first embodiment;

FIGS. 4(a) to 6(f) illustrate the manufacturing procedures according to a manufacture method of a second embodiment;

FIGS. 8(a) to 9(f) illustrate the manufacturing procedures according to a manufacture method of a fourth embodiment;

FIGS. 10(a) to 11(f) illustrate the manufacturing procedures according to a manufacture method of a fifth embodiment;

FIGS. 12(a) to 13(d) illustrate the manufacturing procedures according to a manufacture method of a sixth embodiment;

FIGS. 14(a) to 18(b) illustrate the manufacturing procedures according to a manufacture method of a seventh embodiment;

FIGS. 19(a) to 23(b) illustrate the manufacturing procedures according to a manufacture method of an eighth embodiment;

FIGS. 24(a) to 27(b) illustrate the manufacturing procedures according to a manufacture method of a ninth embodiment;

FIGS. 28(a) to 30(b) illustrate the manufacturing procedures according to a manufacture method of a tenth embodiment;

FIGS. 34A and 34B show SEM images for explaining the effects of an embodiment of the present invention;

DETAILED DESCRIPTION OF THE INVENTION

First, before describing the embodiments of the present invention, the course of events for achieving the present invention will be described below.

The inventors conducted various hydrogen annealing experiments on minute mesa structures that were tens to hundreds of nanometers (nm) in height and width, and were made of Si or SiGe.

Figure 31:
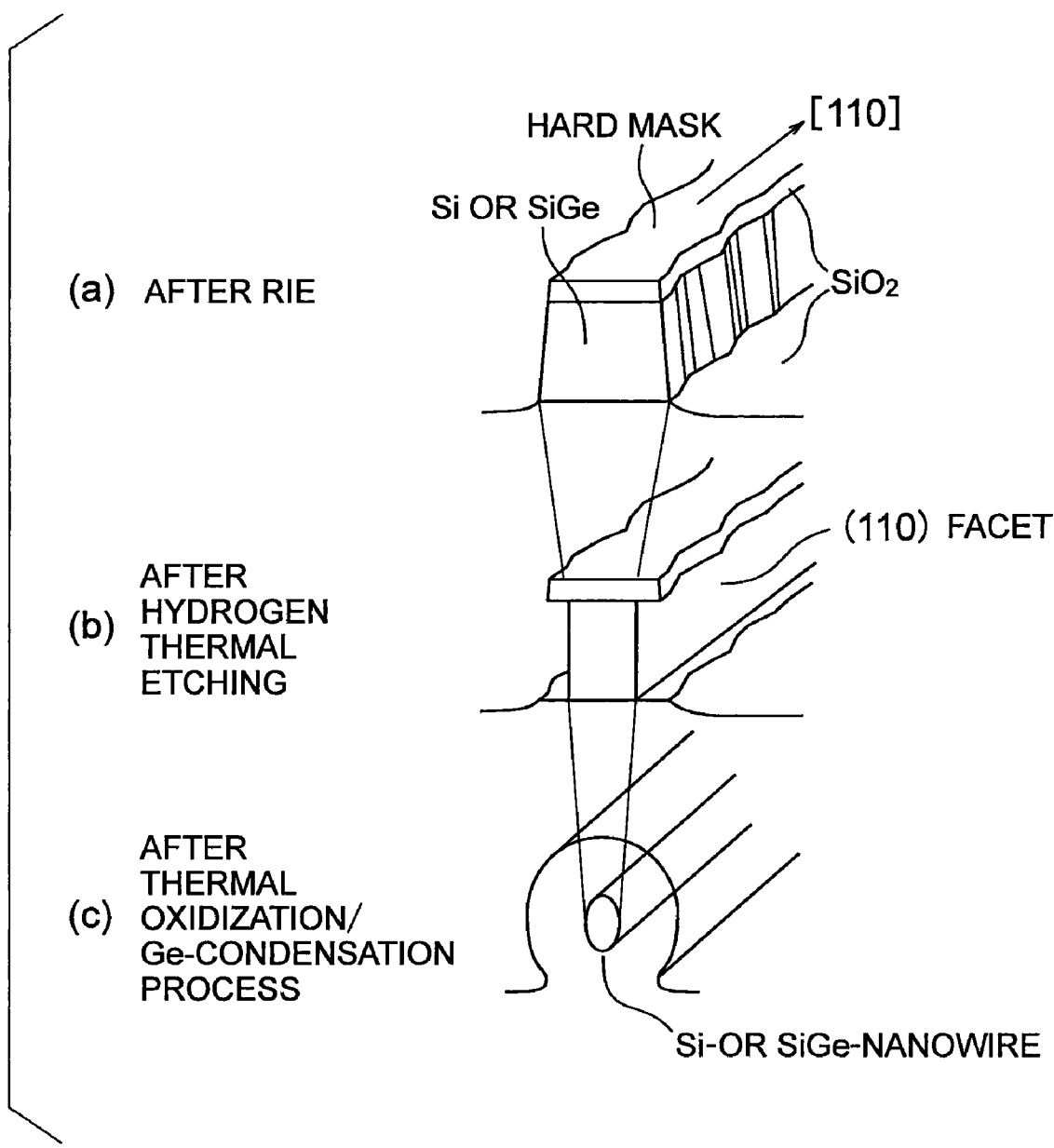
FIGS. 31(a) to 31(c) illustrate an embodiment of the present invention.

More specifically, samples of semiconductor layers that were made of Si or SiGe and each had a (001) plane as the principal surface were prepared on a substrate, as shown in FIG. 31(a). Hard masks of insulating films were formed on the sample semiconductor layers. With the use of the hard masks, patterning was performed on the semiconductor layers by RIE, so as to form mesa structures. Each of the samples had the hard mask remaining on the mesa structure.

Next, five mixed gas atmospheres each containing hydrogen gas and Ar gas with hydrogen gas partial pressures of 100%, 50%, 20%, 10%, and 1% were prepared. Here, the total pressure of each of those mixed gas atmospheres was the atmospheric pressure ($=1.01 \times 10^5$ Pa), and the temperature was 1000° C. The above described samples were left in the mixed atmospheres, and hydrogen annealing was performed for five minutes. As a result, the widths of the mesas of the samples subjected to the heat treatment in the atmospheres with the hydrogen gas partial pressures of 100%, 50%, and 20% became smaller, and a series of flat low-index planes (such as {100} planes, {110} planes, or {111} planes) appeared on each sidewall of the mesas. The inventors consider that the reduction of the width of each mesa and the appearance of flat low-index planes (such as {100} planes, {110} planes, or {111} planes) were caused by virtue of the Si thermal etching with hydrogen rather than by virtue of the flattening effect of the surface migration of Si atoms observed in conventional cases. The etching width is approximately 10 nm to 50 nm for each sidewall after the etching for several minutes, which is effective for thinning 50-nm wide fins or mesa structure produced by a lithography technique to approximately 10 nm.

However, the above effects were not achieved with the samples subjected to the heat treatment in the atmospheres with hydrogen gas partial pressures of 10% and 1%.

When the temperature of the mixed gas atmospheres each containing a hydrogen gas was changed to 950° C., the same effects as above were achieved with the hydrogen gas partial pressures of 100%, 50%, and 20%.

Accordingly, it became apparent that, when hydrogen annealing was performed at a higher temperature (950° C. or higher) with a high hydrogen partial pressure ($0.2 \times 10^5$ Pa), the sidewalls of each mesa were etched to reduce the width of the mesa, and flat low-index planes (such as {100} planes, {110} planes, or {111} planes) appeared on each sidewall, by virtue of the Si thermal etching effect of hydrogen.

The same effects as above were observed not only in mesas formed with lattice relaxed Si, but in mesas formed with strained Si or SiGe. The inventors discovered that fin thinning and sidewall flattening could be achieved at the same time by performing hydrogen annealing under the above conditions on minute mesa structures formed with Si, strained Si, or SiGe.

Figure 32B:
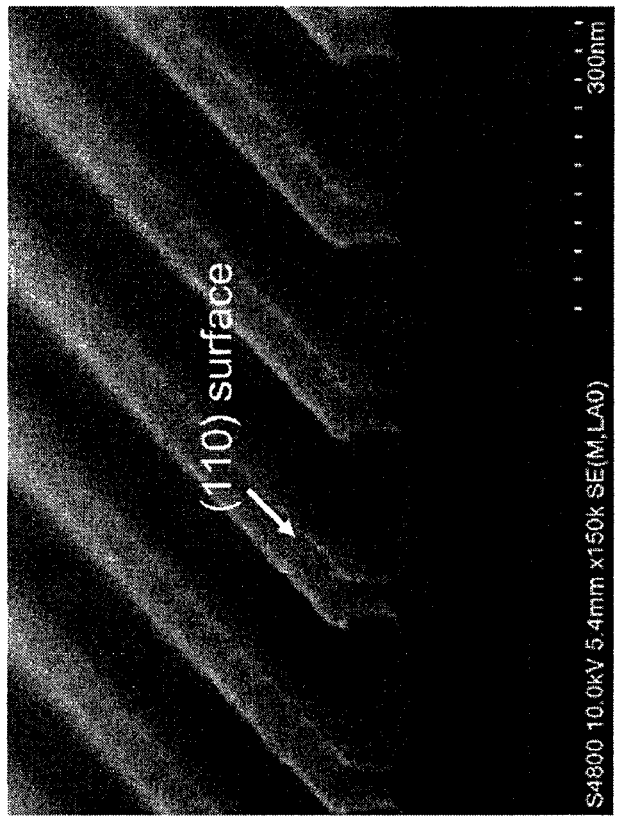
FIGS. 32A and 32B show SEM images for explaining the effects of an embodiment of the present invention.
Figure 32A:
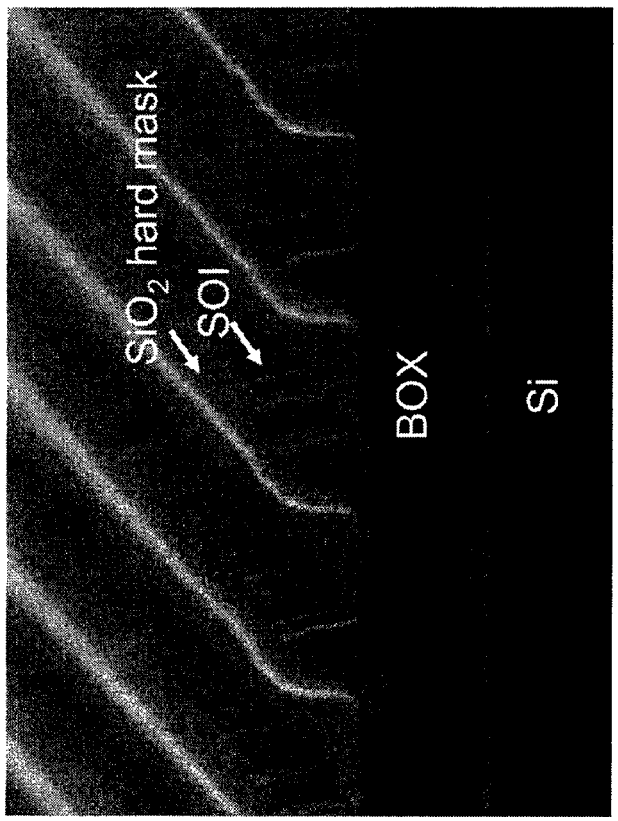
Figure 33B:
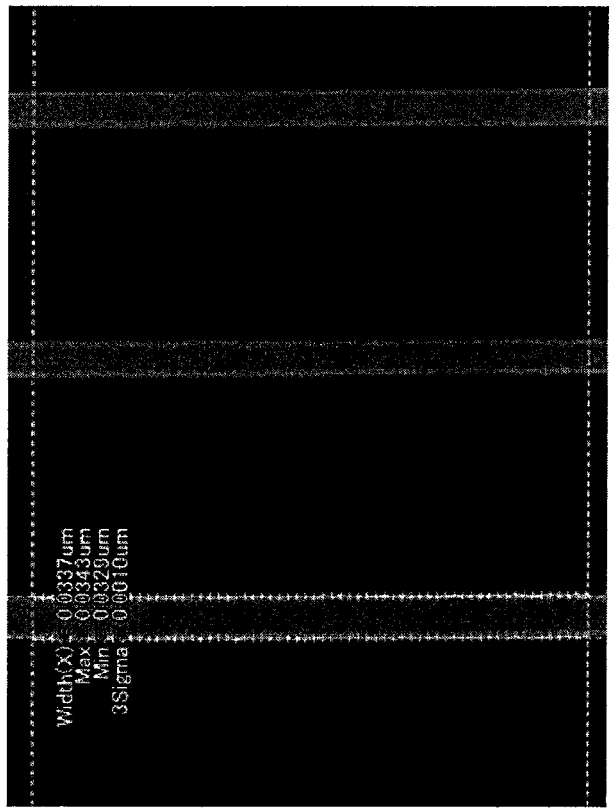
FIGS. 33A and 33B show SEM images for explaining the effects of an embodiment of the present invention.
Figure 33A:
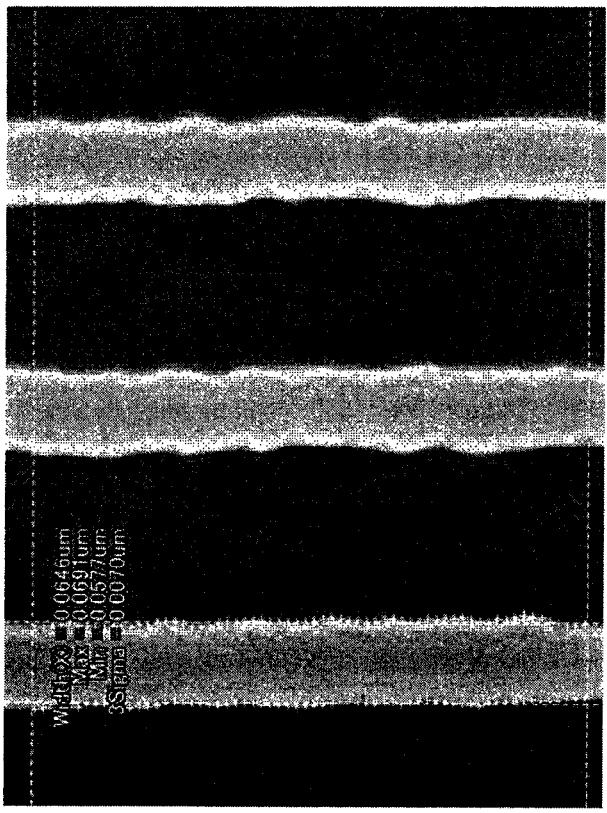

The above mesa structures were formed by RIE on a SOI substrate that includes a supporting substrate made of Si, a buried oxide film (BOX), and a SOI layer having a (001) plane as the principal surface. FIG. 32A shows a SEM (Scanning Electron Microscopy) image of the mesa structures. After that, hydrogen thermal etching was performed on the mesa structures in an atmospheric-pressure $H_2$ gas atmosphere at 1000° C. for 5 minutes. FIG. 32B shows a SEM image of the mesa structures at this point. FIGS. 33A and 33B are SEM images of the mesa structures shown in FIGS. 32A and 32B, seen from the top. As can be seen from FIGS. 32A and 33A, the sidewalls of the mesa structures are not flat before the hydrogen thermal etching, and there is a variation in shapes (widths) of the mesa structures. However, after the hydrogen thermal etching, the sidewalls of the mesa structures (fins) are substantially perpendicular to the substrate and are flat, and there are no variations in shapes (widths) of the mesa structure (fins), as can be seen from FIGS. 32B and 33B. The width variation (3σ) was measured. As a result, the width variation 3σ was 7 nm before the hydrogen thermal etching, but was 1 nm after the hydrogen thermal etching. Here, σ is the standard deviation of the mesa width.

Also, fins were formed by performing RIE on a bulk Si substrate having a (001) plane as the principal surface. FIG. 34A shows a SEM image of the fins. After that, hydrogen thermal etching was performed on the fins in an atmospheric-pressure hydrogen gas atmosphere at 950° C. for 10 minutes. FIG. 34B shows a SEM image of the fins at this point. As can be seen from FIGS. 34A and 34B, the widths of the mesa structures become smaller after the hydrogen thermal etching than the widths observed before the hydrogen thermal etching. Also, after the hydrogen thermal etching, flat [110] planes that were substantially perpendicular to the substrate appeared on each sidewall of the mesa structures (fins). {111} planes also appear at the connecting portion between each sidewall of the fins and the surface of the substrate. The reason for the appearance of the {111} planes will be explained in the description of a sixth embodiment.

Thermal oxidation is further performed on the mesa structures (fins) having flat sidewalls after the hydrogen thermal etching. As a result, a nanowire structure with uniform widths and minimum line edge roughness can be obtained, as shown in FIG. 31(c).

Figure 35B:
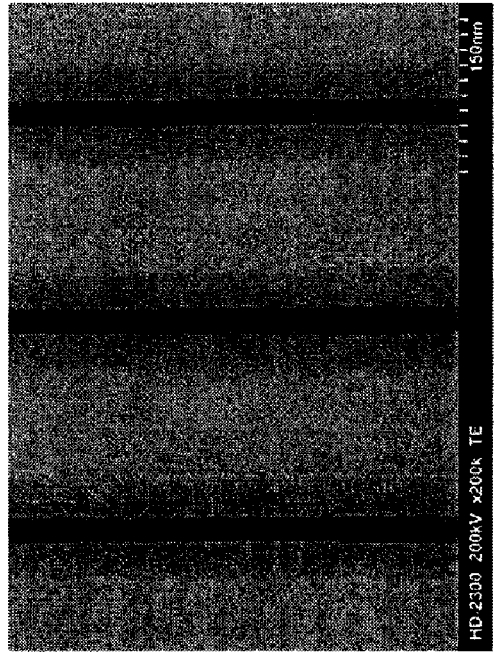
FIGS. 35A and 35B show SEM images for explaining the effects of an embodiment of the present invention.
Figure 35A:
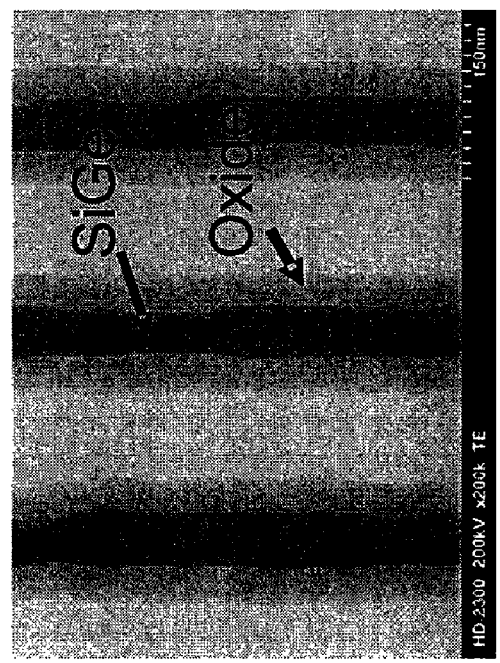

Further, mesa structures are formed by performing RIE on a semiconductor layer made of SiGe, with the use of hard masks formed with insulating films. Thermal oxidation (thermal concentration) is then performed on the mesa structures without and with the hydrogen thermal etching. FIG. 35A shows a STEM (Scanning Transmission Electron Microscopy) image of the nanowire structures (fins) made of SiGe without the hydrogen thermal etching. FIG. 35B shows a STEM image of the nanowire structures (fins) made of SiGe that are thermally oxidized after subjected to hydrogen thermal etching. As can be seen from FIG. 35A, in the case where hydrogen thermal etching is not performed, oxidation progresses while the width variation remains as before. On the other hand, in the case where oxidation is performed after the hydrogen thermal etching, thermal oxidation progresses while the uniformity of the widths of the fins is maintained and the SiGe nanowires having uniform widths are formed.

The present invention has been made based on the above findings, and embodiments of the present invention are described below, with reference to the accompanying drawings.

First Embodiment

Referring to FIGS. 1(a) to 2(f), a method for manufacturing a field effect transistor in accordance with a first embodiment of the present invention is described. FIGS. 1(a), 1(b), 1(d), 2(a), 2(c), and 2(e) are cross-sectional views illustrating procedures to be carried out by the method for manufacturing the field effect transistor in accordance with this embodiment. FIGS. 1(c), 1(e), 2(b), 2(d), and 2(f) are plan views. FIGS. 1(b), 1(d), 2(a), 2(c), and 2(e) are cross-sectional views, taken along each line A-A of FIGS. 1(c), 1(e), 2(b), 2(d), and 2(f).

The field effect transistor manufactured by the manufacture method in accordance with this embodiment is a Fin FET that has a channel made of Si.

First, as shown in FIG. 1(a), a SOI substrate 4 having a supporting substrate 1, a buried oxide film 2, and a 50-nm thick SOI layer 3 having a (001) plane as the principal surface is prepared. A 2-nm thick silicon oxide film 5 and a 20-nm thick silicon nitride film 6 are deposited in this order on the SOI layer 3.

A hard mask 9 formed with a silicon oxide film 5 and a silicon nitride film 6 is formed on source and drain portions 7 and a portion 8 by a lithography technique using an electron beam or an excimer laser and reactive ion etching (RIE). The portion 8 is to be a channel region. Here, the channel direction (the direction perpendicular to the line A-A of FIG. 1(c)) is the <1-10> direction, and the width of the hard mask 9 at the portion 8 to be the channel region is 40 nm. With the hard mask 9 being used as a mask, RIE is performed to form the source and drain portions 7 and the portion 8 to be the channel region into a mesa structure, as shown in FIGS. 1(b) and 1(c). In this embodiment, the mesa structure may be a trapezoidal structure having the smaller width at the upper portion and the greater width at the portion closer to the substrate 4 in section, as shown in FIGS. 33(a) and 34(a). Alternatively, the mesa may be a trapezoidal structure having the greater width at the upper portion and the smaller width at the portion closer to the substrate 4 in section, or may be a lentoid structure having the smaller width at the upper and lower portions than the width at the center portion, or may be a rectangular structure.

After the native oxide film on each sidewall of the mesa is removed with the use of diluted hydrofluoric acid, the SOI substrate is subjected to 5-minute annealing in a 100%-hydrogen atmosphere with atmospheric pressure ($1.0 \times 10^5$ Pa) at 1000° C. As a result, a fin 10 having a flat (110) plane 10a that is located on each sidewall of the channel portion of the mesa and is perpendicular to the principal surface of the substrate 4 is formed as shown in FIGS. 1(d) and 1(e). This is the effect of etching of the sidewalls (thermal etching with hydrogen) that is caused as hydrogenated silicon is generated from a reaction between hydrogen and Si and vaporizes. Since the etching rate of {110} planes is lower than those of the other high-index planes, (110) and (-1-10) planes appear. The etching effect is in a competitive relationship with the surface migration of Si. To make the etching effect dominant, it is preferable that the temperature is increased to 950° C. or higher, and the hydrogen partial pressure is to $0.2 \times 10^5$ Pa or higher. Further, to maintain the mesa structure, particularly, to maintain the fin structure having a high aspect ratio at the channel portion, it is preferable that the hard mask 9 is formed on the upper face. If one of those requirements is not satisfied, the appearance of {110} planes might not be observed. After the thermal etching with hydrogen, the width of the fin 10 becomes 18 nm. The width of the fin 10 can be further reduced to 10 nm or less by prolonging the etching period. Since the (110) plane 10a appears on each sidewall of the fin 10 to be the channel, eaves 9a are formed at the lower portion of the hard mask 9, as shown in FIG. 1(d).

Next, as shown in FIGS. 2(a) and 2(b), etching is performed on the eaves 9a of the hard mask 9 with hot phosphoric acid and diluted hydrofluoric acid. At this point, the silicon nitride film 6 of the hard mask 9 is not completely removed but is partially left. As shown in FIGS. 2(c) and 2(d), to round the corners of the fin 10, a thermal oxide film 11 is formed on the exposed surface of the fin 10 through 30—second rapid terminal oxidization at 1050° C. After that, the thermal oxide film 11 is removed with diluted hydrofluoric acid. As a result, the width of the fin 10 becomes 10 nm.

A gate oxide film 12 made of $HfO_2$ is then formed to cover the surface of the fin 10, and a polysilicon film is further deposited. As shown in FIGS. 2(e) and 2(f), the polysilicon film is patterned by a photolithography technique, so as to form a gate electrode 13. The regions of the fin 10 outside the formation region of the gate electrode 13 serve as source and drain regions, and connect to the source and drain portions 7.

A thermal oxide film of 2 nm in film thickness (not shown) is then formed by RTO on the exposed sidewalls of the fin 10 and at the side portions of the gate electrode 13. After that, impurity ions (arsenic for the n-channel, and boron for the p-channel) are injected into the source and drain portions 7 and the gate electrode 13 made of polysilicon. At this point, the SOI substrate is tilted at approximately 30 degrees on the channel direction axis, so as to inject sufficient impurities into the side portions at left and right sides of the fin 10.

A silicon oxide film of 5 nm in film thickness (not shown) and a silicon nitride film of 15 nm in film thickness (not shown) are then deposited by CVD (Chemical Vapor Deposition), and etching is performed on the silicon nitride film and the silicon oxide film by RIE, so as to form gate sidewalls formed with the silicon nitride film and the silicon oxide film at the side portions of the gate electrode 13. After that, impurity ions (arsenic for the n-channel, and boron for the p-channel) are again injected, and activation is also performed by RTA, so as to form the source and drain regions. In this ion implantation, the SOI substrate is also tilted at approximately 30 degrees on the channel direction axis, so as to inject sufficient impurities into the side portions at left and right sides of the fin 10.

Lastly, an interlayer insulating film (not shown) is deposited, and contact holes (not shown) continuing to the source and drain regions and the gate electrode are formed through the interlayer insulating film. The contact holes are filled with a conductive material to form the respective electrodes. Wires are then formed on the interlayer insulating film, so as to complete a circuit having the MOS transistor.

In this embodiment, a fin having the {110}-planes sidewalls is formed on a semiconductor substrate having the (001) plane as the principal surface. However, a fin having sidewalls formed with {110}planes equivalent to (110) planes may be formed on a semiconductor substrate having a {001} plane equivalent to the (001) plane as the principal surface. Here, a {001} plane is a comprehensive representation of the Miller's index indicating any of a (001) plane, a (010) plane, a (100) plane, a (00-1) plane, a (0-10) plane, and a (-100) plane. A {110} plane is a comprehensive representation of the Miller's index indicating any of a (110) plane, a (101) plane, a (011)

plane, a (−1-10) plane, a (−10-1) plane, a (0-1-1) plane, a (−110) plane, a (1-10) plane, a (10-1) plane, and a (−101) plane. A {111} plane is a comprehensive representation of the Miller's index indicating any of a (111) plane, a (−111) plane, a (1-11) plane, a (11-1) plane, a (−1-1-1) plane, a (1-1-1) plane, a (−11-1) plane, and a (−1-11) plane. In the following, a ( . . . ) plane can be replaced with any plane represented by the { . . . } plane equivalent to the ( . . . ) plane.

The manufacture method can also be used to produce a complementary MOSFET (CMOSFET) circuit consisting of many p-channel and n-channel Fin FETs.

The manufacture method in accordance with this embodiment can be used to produce a field effect transistor having a fin-like channel patterned in one of the [110] directions on a (001) substrate The manufacture method in accordance with this embodiment is particularly effective in producing a p-channel MOSFET to achieve greater driving current, as the sidewalls of the fin are formed with {110} planes having higher hole mobility than on the {100} planes.

Other than that, the manufacture method in accordance with this embodiment can be used to produce a field effect transistor having a channel patterned in one of the [100] directions on a (001) substrate. In such a case, the manufacture method is particularly effective in producing an n-channel MOSFET to achieve greater driving current, as flat {010} planes appear on each sidewall of the fin.

The manufacture method can also be used to produce a field effect transistor having a channel in the <−110> direction on a (110) substrate. In such a case, the manufacture method is particularly effective in producing an n-channel MOSFET to achieve greater driving current, as flat {001} plane appears on each sidewall of the fin.

The manufacture method can also be used to produce a field effect transistor having a channel patterned in the <−112> direction on a (110) substrate. In such a case, flat {111} planes appears on each sidewall of the fin, and therefore, the same driving current can be achieved in both a p-channel MOSFET and an n-channel MOSFET. Thus, the circuit design becomes simpler.

The manufacture method in accordance with this embodiment can also be used to produce a field effect transistor having a channel in the <001> direction on a (110) substrate. In such a case, the manufacture method is particularly effective in producing a p-channel MOSFET to achieve greater driving current, as flat {110} planes appear on each sidewall of the fin.

The manufacture method in accordance with this embodiment can also be used to produce a field effect transistor having a channel in the [−211] direction on a (111) substrate. In such a case, the manufacture method is particularly effective in producing a p-channel MOSFET to achieve greater driving current, as flat {011} planes appear on each sidewall of the fin.

In this embodiment, if a SOI substrate including a SOI layer that is a silicon layer having tensile strain in the plane (a strained SOI substrate) is used, a Fin FET having tensile strain in the channel direction is formed through the same procedures as above. In such a case, the electron mobility becomes high by virtue of the uniaxial stain in the channel direction, and particularly, the ON current of an n-channel MOSFET becomes higher.

As described above, in accordance with this embodiment, size and shape variations among channels are made as small as possible, and field effect transistors having the smallest possible channel widths can be obtained.

(Modification)

Figure 1:
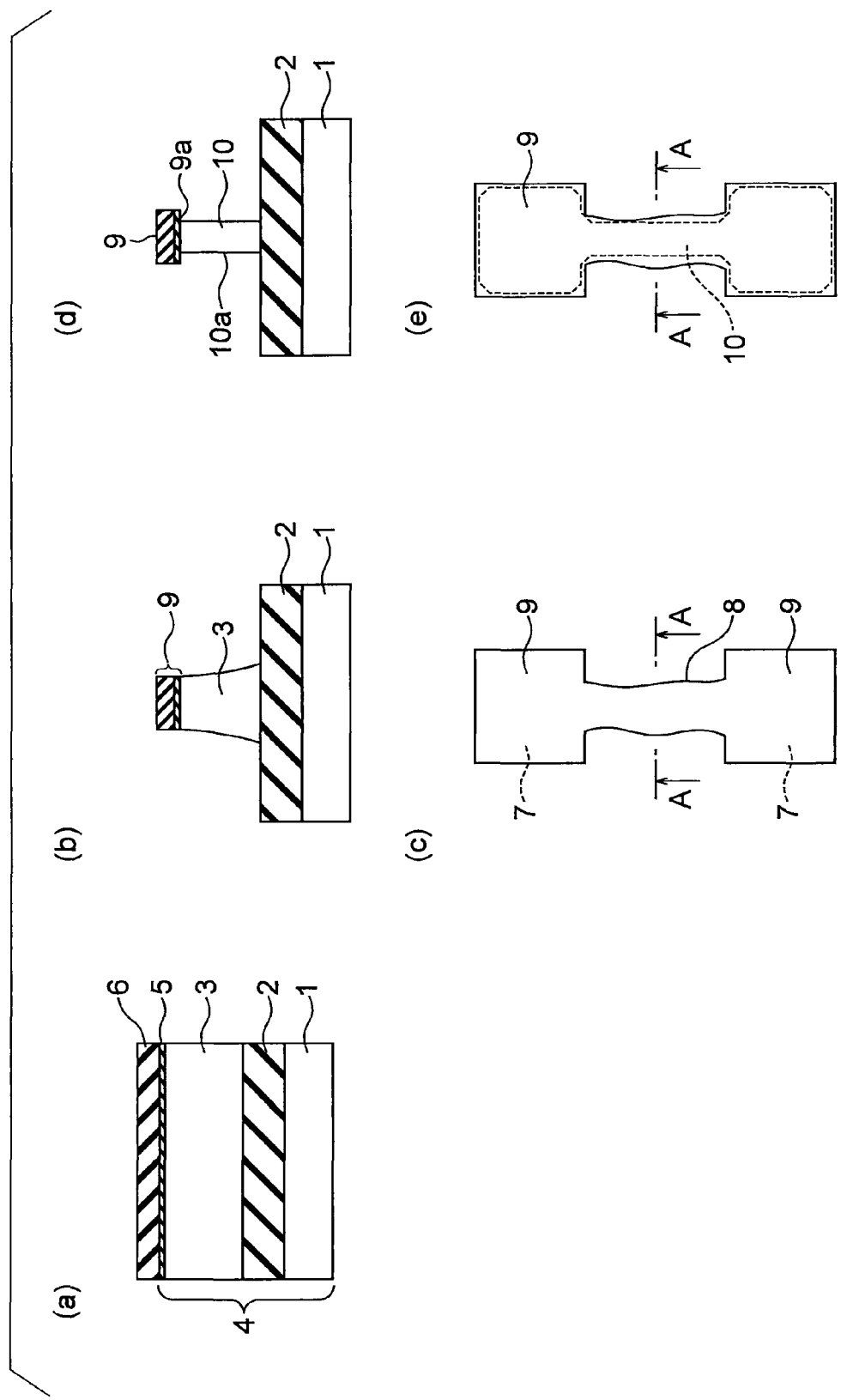
Figure 2:
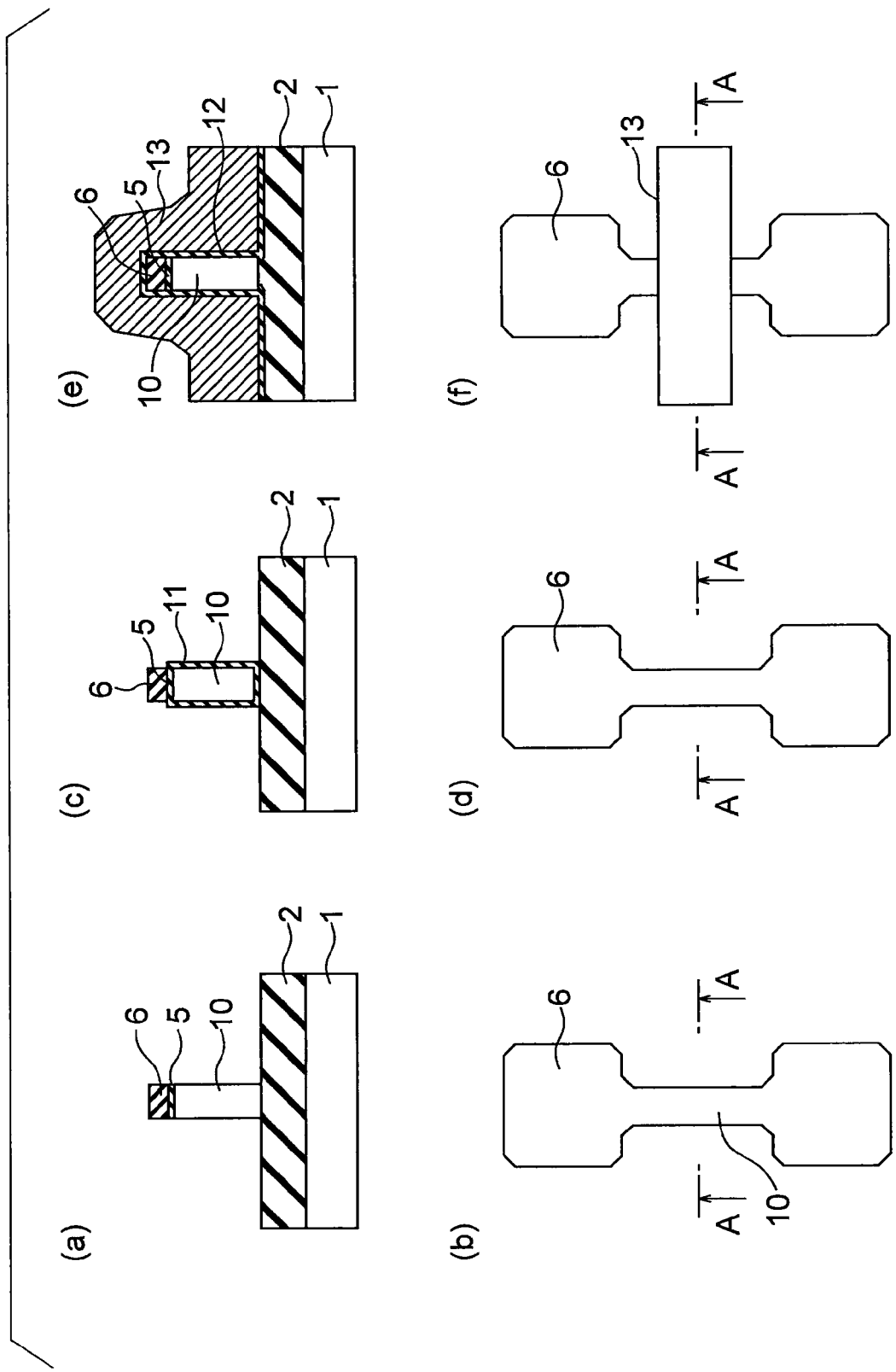
Figure 3:
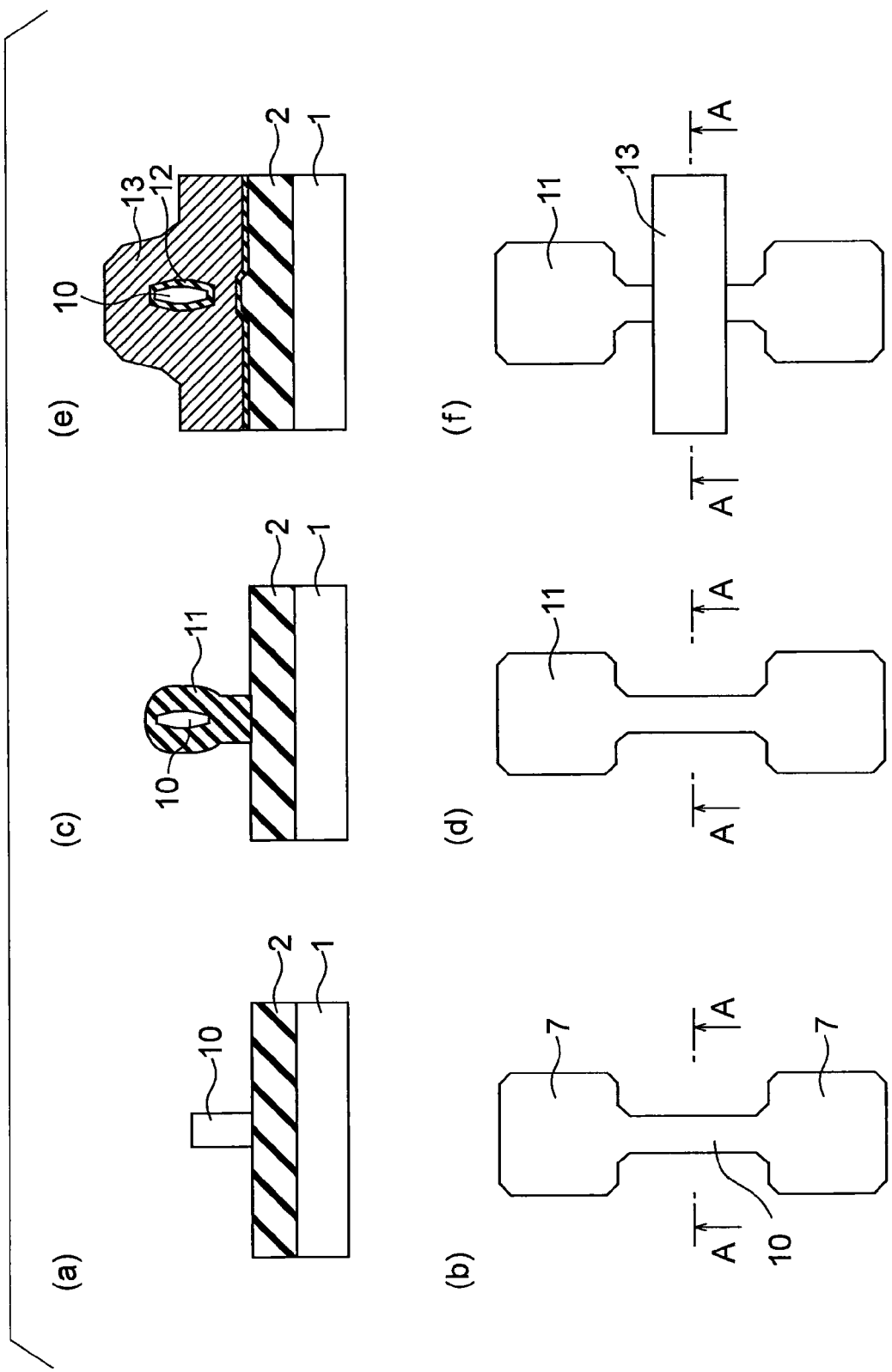
FIGS. 3(a) to 3(f) illustrate the manufacturing procedures according to a manufacture method as a modification of the first embodiment.

Referring now to FIGS. 3(a) to 3(f), a method for manufacturing a field effect transistor in accordance with a modification of this embodiment is described. FIGS. 3(a), 3(c), and 3(e) are cross-sectional views illustrating procedures to be carried out by the method for manufacturing the field effect transistor in accordance with this modification. FIGS. 3(b), 3(d), and 3(f) are plan views. FIGS. 3(a), 3(c), and 3(e) are cross-sectional views, taken along each line A-A of FIGS. 3(b), 3(d), and 3(f).

By the manufacture method in accordance with this modification, the same procedures as those of the first embodiment illustrated in FIGS. 1(d) and 1(e) are carried out. More specifically, the same procedures as those procedures for performing thermal etching with hydrogen are carried out so as to form the fin 10 having a (110) plane 10a on each sidewall of the mesa structure and the eaves 9a in the hard mask 9.

After that, the hard mask 9 is completely removed, as shown in FIGS. 3(a) and 3(b). One-minute rapid thermal oxidization is then performed at a temperature between 1050° C. and 1200° C., more preferably at 1100° C., so as to form a thermal oxide film 11 on the surface of the fin 10, as shown in FIGS. 3(c) and 3(d). Through the thermal oxidization, the sidewalls are formed into convex-lens shapes including planes tilted with respect to a (110) plane (such as a (311) plane and a (111) plane) (see FIGS. 3(c) and 3(d)). After that, the thermal oxide film 11 is removed with diluted hydrofluoric acid, so as to expose the fin 10. As a result, the fin 10 is put into a floating state above the buried oxide film 2.

A gate oxide film 12 made of $HfO_2$ is then formed to cover the surface of the fin 10, and a polysilicon film is further deposited. Patterning is then performed on the polysilicon film by a photolithography technique, so as to form a gate electrode 13, as shown in FIGS. 3(e) and 3(f).

The procedures after that are the same as those of the first embodiment. As a result, the channel become nanowires that form two {100} planes on the upper face and the lower face, and two sidewalls having the shapes of convex lenses. Accordingly, the contribution of the (110) plane having the lowest electron mobility can be reduced. By applying this method to an n-channel transistor, the driving current can be made higher than the driving current of a Fin FET that has a channel having sidewalls on (110) planes. Also, as the channel has a gate-all-around structure completely covered with the gate, the OFF current can also be reduced.

Figure 36:
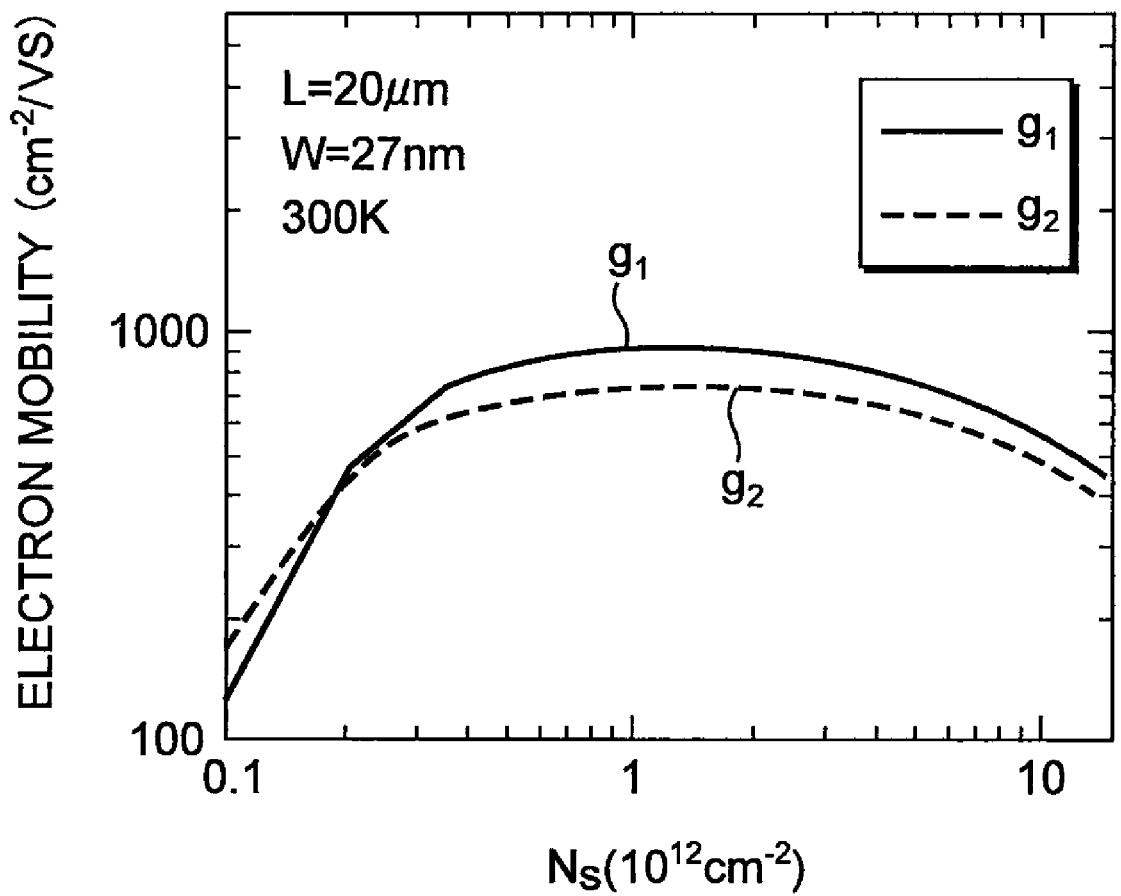
FIG. 36 illustrates the effects of the modification of the first embodiment.

FIG. 36 shows the result of measurement of the electron mobility in a nanowire channel having two sidewalls in the form of convex lenses as in this modification (indicated by graph $g_1$), and the result of measurement of the electron mobility in a nanowire channel having two flat sidewalls (indicated by graph $g_2$). The temperature at the time of measurement is 300 K. The channel is formed with strained Si, and includes 500 nanowires each having a channel length L of 20 μm and a channel width W of 27 nm. The abscissa axis indicates the value of averaged surface carrier density, Ns ($cm^{-2}$), obtained by dividing the number of carriers in the channel by the surface area of the channel, and the ordinate axis indicates the electron mobility. The shapes of the sidewalls of the nanowires are controlled by adjusting the thermal oxidization temperature after the 5-minute hydrogen thermal etching in hydrogen gas with atmospheric pressure at 1000° C. The thermal oxidization temperature is 1100° C. in the case of graph $g_1$, and is 1050° C. in the case of graph $g_2$. As can be seen from FIG. 36, in the generally used Ns range ($1 \times 10^{12}$ $cm^{-2}$ to $10 \times 10^{12}$ $cm^{-2}$), the electron mobility in the nanowire channel having the two sidewalls in the form of convex lenses is higher than the electron mobility in the nanowire channel having the flat sidewalls.

Second Embodiment

Figure 4:
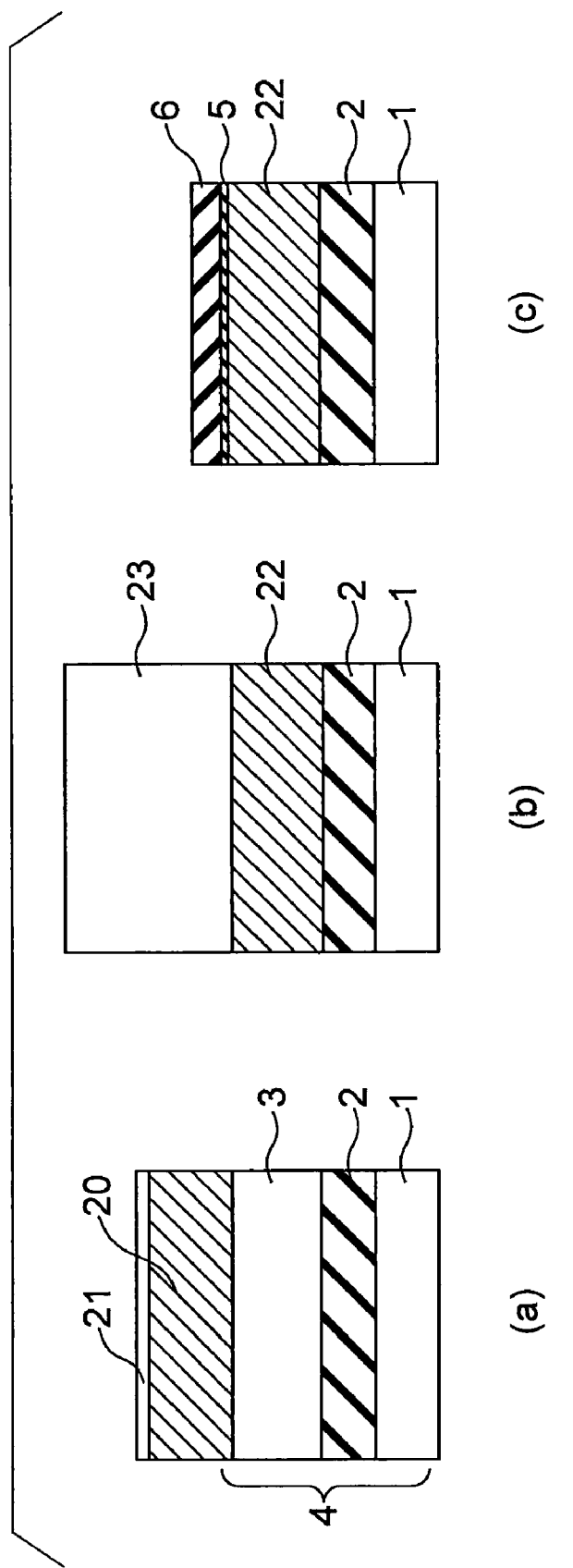
Figure 5:
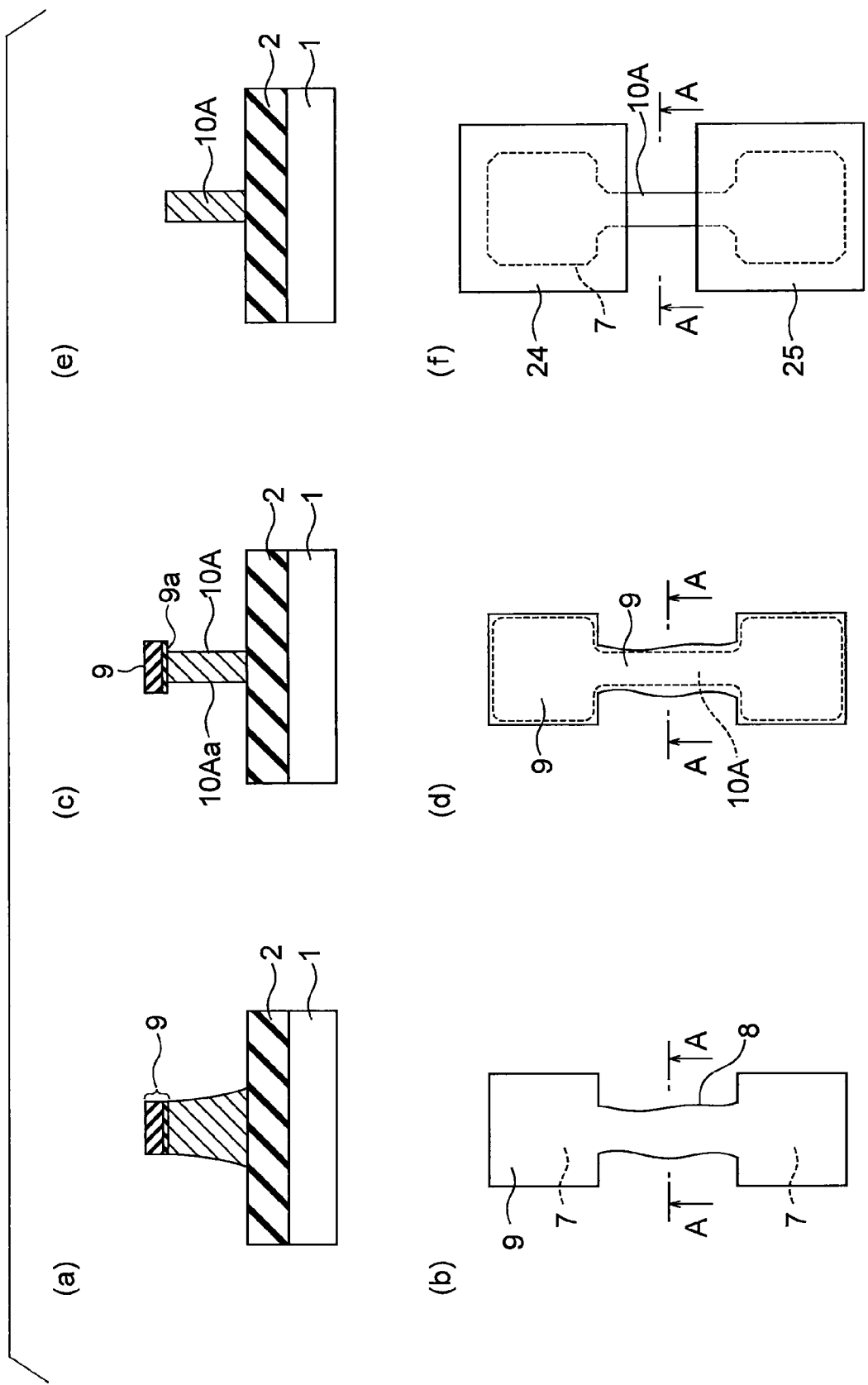
Figure 6:
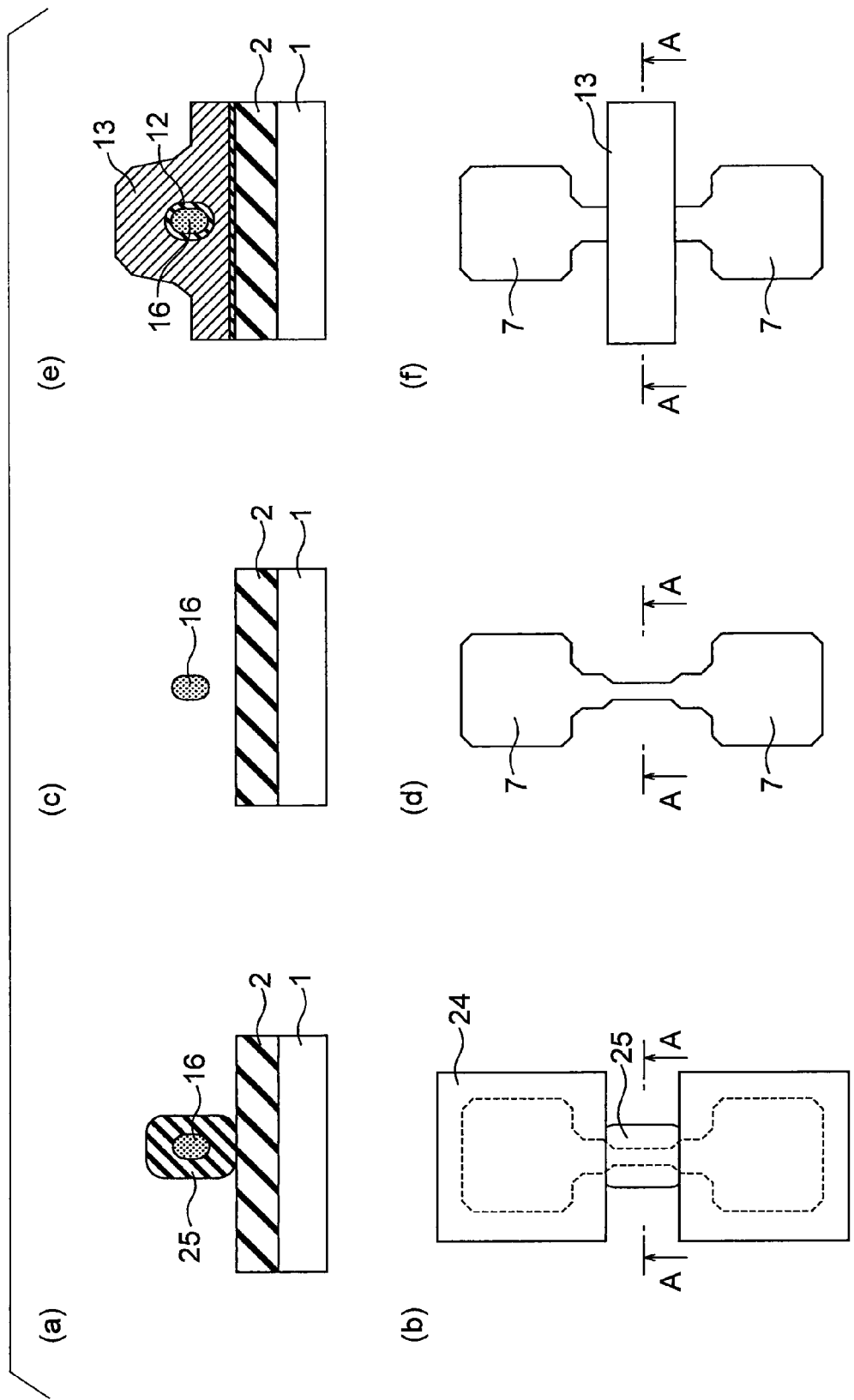

Referring now to FIGS. 4(a) to 6(f), a method for manufacturing a field effect transistor in accordance with a second embodiment of the present invention is described. FIGS. 4(a) to 4(c) are cross-sectional views illustrating the procedures to be carried out by the manufacture method in accordance with this embodiment. FIGS. 5(a), 5(c), 5(e), 6(a), 6(c), and 6(e) are cross-sectional views illustrating procedures to be carried out by the method for manufacturing the field effect transistor in accordance with this embodiment. FIGS. 5(b), 5(d), 5(f), 6(b), 6(d), and 6(f) are plan views. FIGS. 5(a), 5(c), 5(e), 6(a), 6(c), and 6(e) are cross-sectional views, taken along each line A-A of FIGS. 5(b), 5(d), 5(f), 6(b), 6(d), and 6(f).

The manufacture method in accordance with this embodiment is a method for manufacturing a nanowire MOSFET having nanowires formed with strained SiGe.

First, as shown in FIG. 4(a), a SOI substrate 4 having a supporting substrate 1, a buried oxide film 2, and a 20-nm thick SOI layer 3 having a (001) plane as the principal surface is prepared. A 30-nm thick $Si_{0.9}Ge_{0.1}$ film 20 and a 5-nm thick Si film 21 are formed through epitaxial growth in this order on the SOI substrate 4. The Si film 21 functions as a cap film to prevent the Ge in the $Si_{0.9}Ge_{0.1}$ film 20 from becoming volatile GeO and evaporating. The Si film 21 may not be provided.

Thermal oxidation is then performed at 1150° C. As a result, a 30-nm thick $Si_{0.9}Ge_{0.1}$ film 22 is formed on the buried oxide film 2 due to the Ge-condensation and interdiffusion between Si and Ge, and a silicon oxide film 23 is formed on the $Si_{0.9}Ge_{0.1}$ film 22, as shown in FIG. 4(b).

The silicon oxide film 23 is then removed with diluted hydrofluoric acid, and a 5-nm thick silicon oxide film 5 and a 20-nm thick silicon nitride film 6 are deposited by CVD in this order, as shown in FIG. 4(c). Here, the silicon oxide film 5 may be formed through thermal oxidation.

A hard mask 9 formed with the silicon oxide film 5 and the silicon nitride film 6 is formed on source and drain portions 7 and a portion 8 by a lithography technique using an electron beam or an excimer laser and reactive ion etching (RIE), as shown in FIGS. 5(a) and 5(b). The portion 8 is to be a channel region. Here, the channel direction is the <1-10> direction, and the width of the hard mask 9 is 40 nm. With the hard mask 9 being used as a mask, RIE is performed to form the $Si_{0.9}Ge_{0.1}$ film 22 of the source and drain portions 7 and the portion 8 to be the channel region into a mesa shape.

After the native oxide film on each sidewall of the mesa is removed with the use of diluted hydrofluoric acid, the SOI substrate is subjected to 5-minute annealing in a 100%-hydrogen atmosphere with atmospheric pressure at 1000° C. As a result, the sidewalls of the mesa are thermally etched with hydrogen, and flat (110) and (-1-10) planes that are perpendicular to the principal surface of the substrate 4 appears on each sidewall of the channel portion (the fin portion) 10A of the mesa, as shown in FIGS. 5(c) and 5(d). This is the effect of etching of the sidewalls (thermal etching with hydrogen) that is caused as hydrogenated silicon and hydrogenated germanium are generated from a reaction between hydrogen and Si and Ge, and the hydrogenated silicon and germanium vaporize. Since the etching rate of the {110} planes is lower than those of the other high-index planes, the (110) plane appears on each sidewall. The etching effect is in a competitive relationship with the surface migration of Si and Ge. To make the etching effect dominant, it is preferable that the temperature is increased to 950° C. or higher, and the hydrogen partial pressure is to $0.2 \times 10^5$ Pa or higher. Further, to maintain the mesa structure, particularly, to maintain the fin structure having a high aspect ratio at the channel portion, it is preferable that the hard mask 9 is formed on the upper face. If one of those requirements is not satisfied, the appearance of the (110) plane is not observed. After the thermal etching with hydrogen, the width of the fin 10A becomes 20 nm. Eaves 9a are formed at the lower portion of the hard mask 9, as shown in FIG. 5(c) after the hydrogen thermal etching of the sidewalls.

Etching with hot phosphoric acid and diluted hydrofluoric acid is then performed to remove the hard mask 9. After that, a silicon oxide film and a silicon nitride film are again deposited in this order on the entire surface, and patterning is performed on the insulating layer formed with the silicon oxide film and the silicon nitride film by a photo-lithography and etching techniques. In this manner, the source and drain portions 7 are covered with the insulating layer 24, and the fin 10A to be the channel portion is exposed (see FIGS. 5(e) and 5(f)).

Next, as shown in FIGS. 6(a) and 6(b), the channel portion is thermally oxidized at 950° C., so as to form a $Si_{0.25}Ge_{0.75}$ wire channel 16 of 10 nm in diameter through the Ge-condensation mechanism. At this point, the wire channel 16 is coated with a thermal oxide film 25.

After the silicon nitride film 24 is removed with hot phosphoric acid, the thermal oxide film 25 around the wire channel 16 is removed by etching, so as to expose the wire channel 16, as shown in FIGS. 6(c) and 6(d).

A gate oxide film 12 made of $HfO_2$ is then formed to cover the surrounding area of the wire channel 16, and a polysilicon film is deposited on the front face of the substrate. Patterning is then performed on the polysilicon film by a photolithography technique, so as to form a gate electrode 13 (FIGS. 6(e) and 6(f)). After that, the same procedures as those of the first embodiment are carried out to complete a field effect transistor.

The manufacture method in accordance with this embodiment can be used to produce p-channel MOSFET, as the channel is formed with compressively strained SiGe having high hole mobility. In this manner, the driving current can be increased.

The manufacture method can also be used to produce a CMOSFET circuit consisting of many p-channel and n-channel Fin FETs.

The manufacture method in accordance with this embodiment can be used to produce a field effect transistor having a channel patterned in one of the [100] directions on a (001) substrate. In such a case, flat {010} plane appear on each sidewall of the fin.

The manufacture method can also be used to produce a field effect transistor having a channel in the <-110> direction on a (110) substrate. In such a case, flat {001} planes appear on each sidewall of the fin.

The manufacture method can also be used to produce a field effect transistor having a channel patterned in the <-112> direction on a (110) substrate. In such a case, flat {1-11} planes appear on each sidewall of the fin.

The manufacture method in accordance with this embodiment can also be used to produce a field effect transistor having a channel in the <001> direction on a (110) substrate. In such a case, flat {110} planes appear on each sidewall of the fin.

The manufacture method in accordance with this embodiment can also be used to produce a field effect transistor having a channel in the <−211> direction on a (111) substrate. In such a case, a flat {0-11} planes appear on each sidewall of the fin.

As described above, in accordance with this embodiment, size and shape variations among channels are made as small as possible, and field effect transistors having the smallest possible channel widths can be obtained.

Third Embodiment

Figure 7:
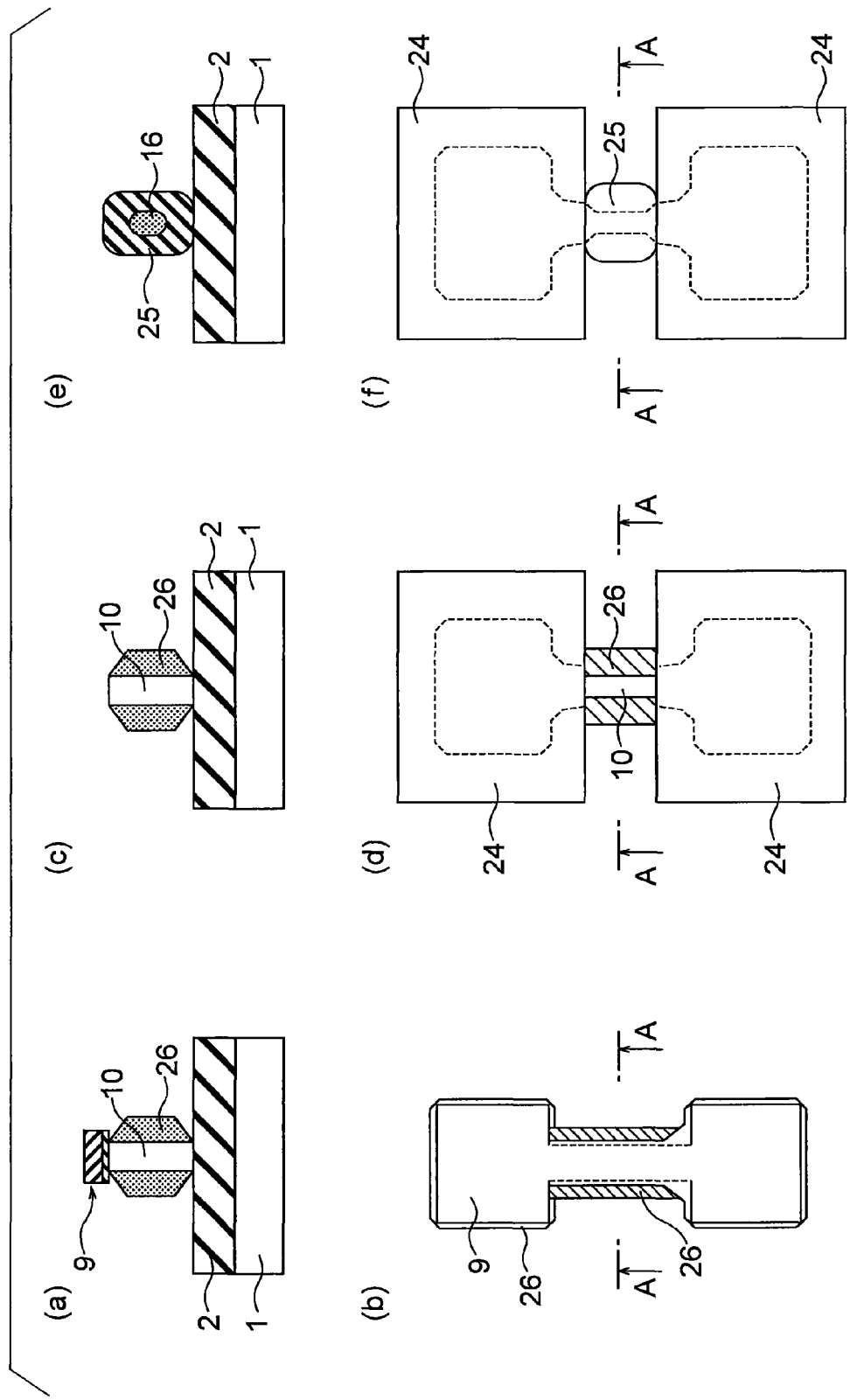
FIGS. 7(a) to 7(f) illustrate the manufacturing procedures according to a manufacture method of a third embodiment.
Figure 8:
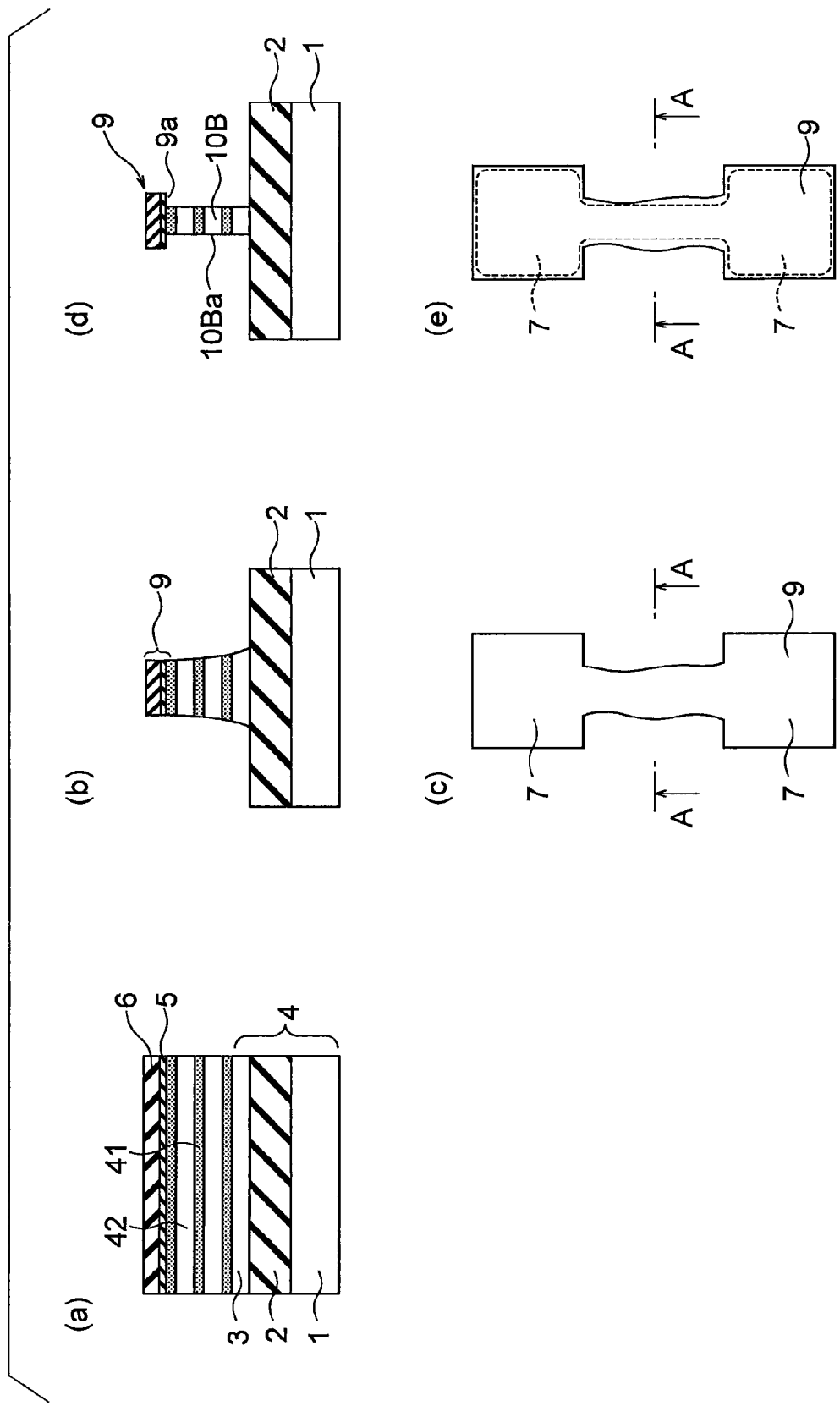
Figure 9:
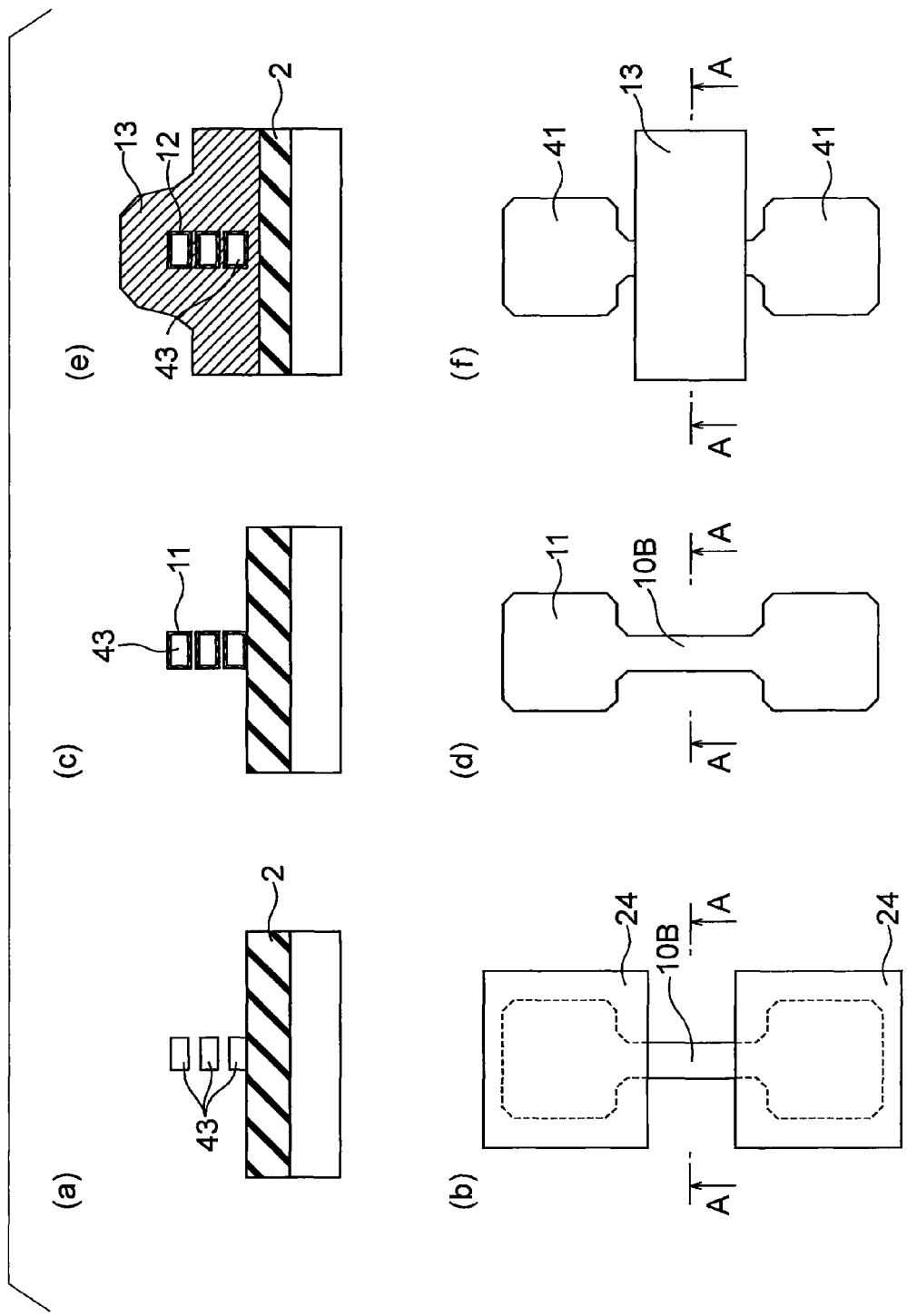
Figure 10:
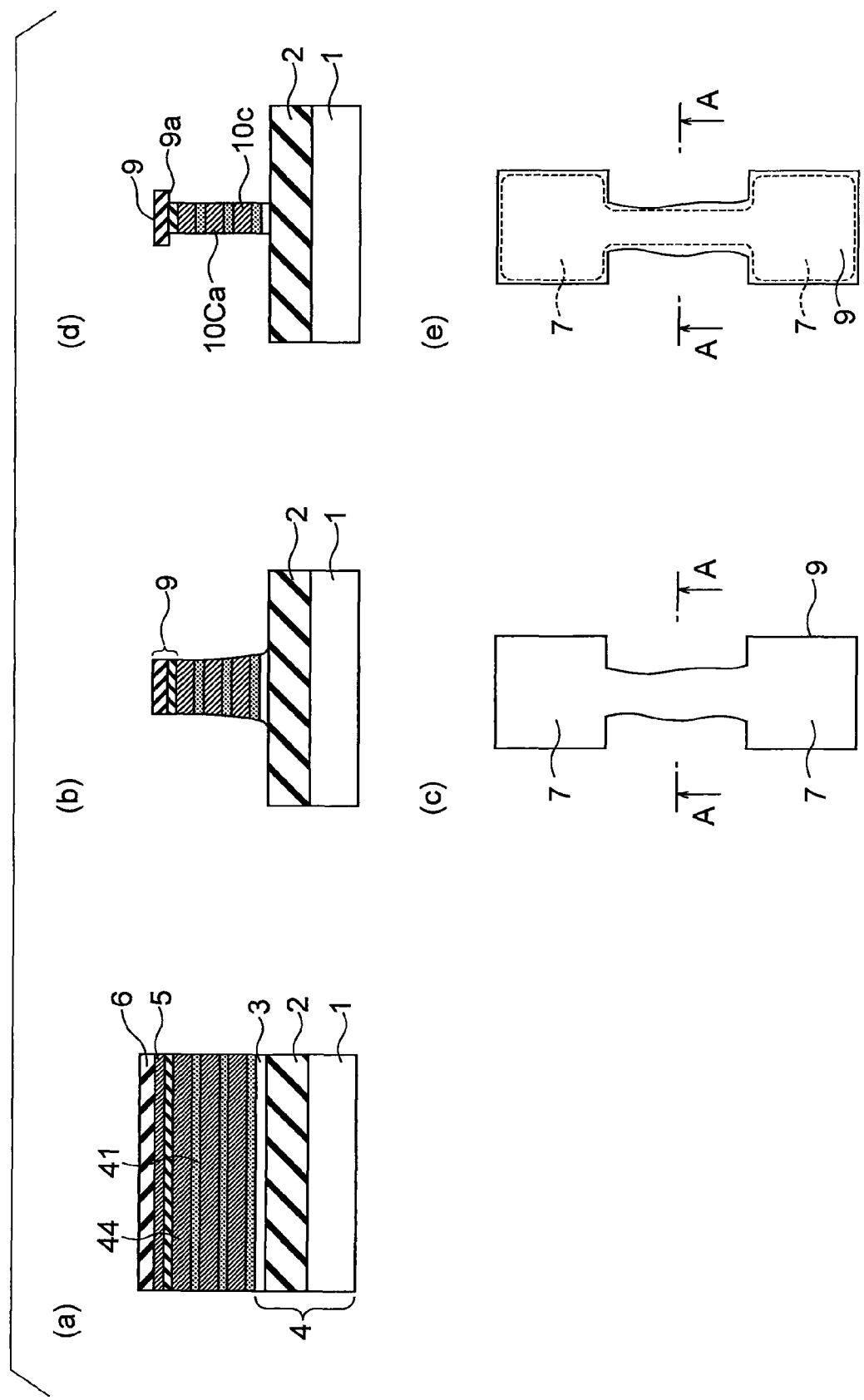
Figure 11:
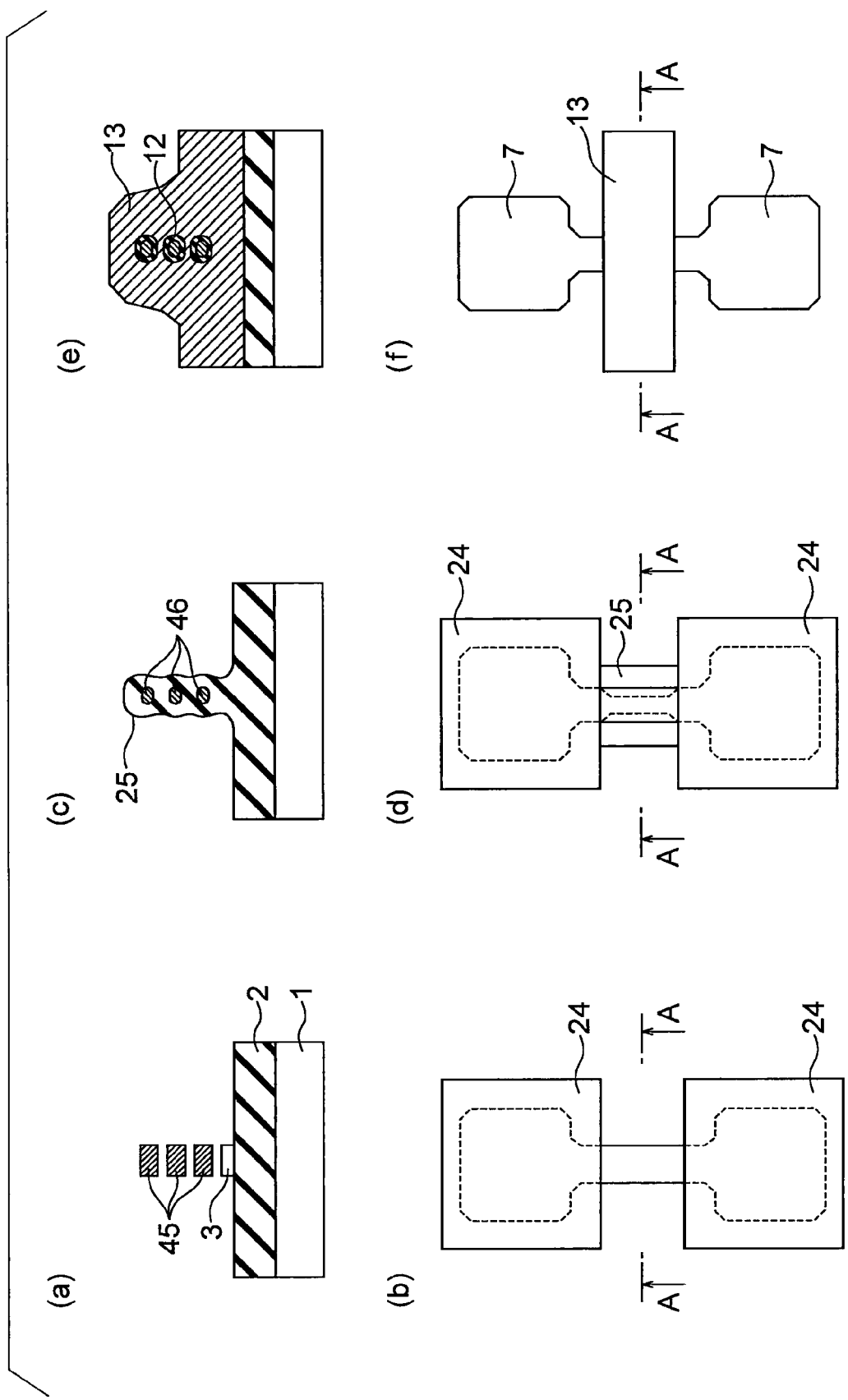
Figure 12:
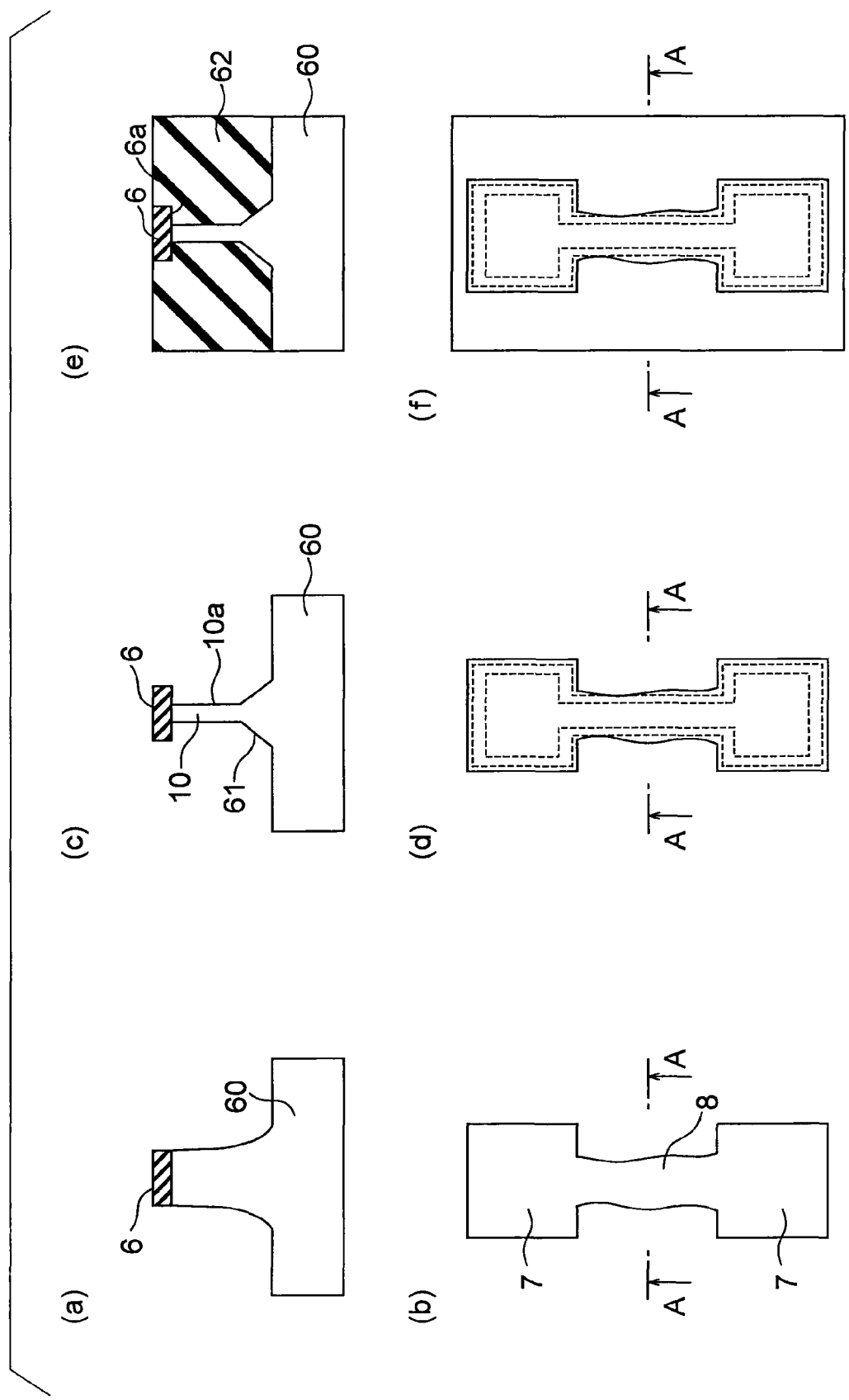
Figure 13:
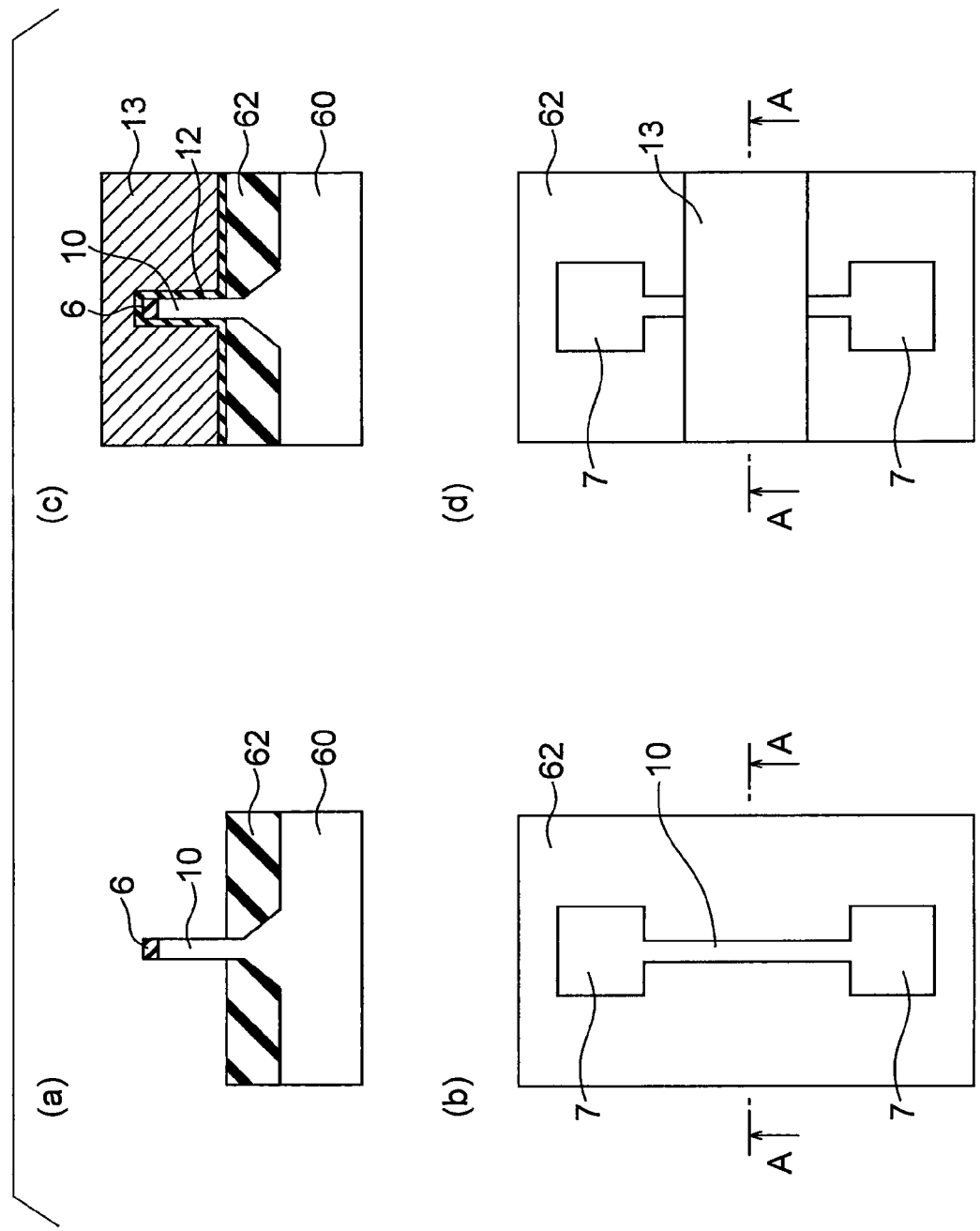
Figure 14:
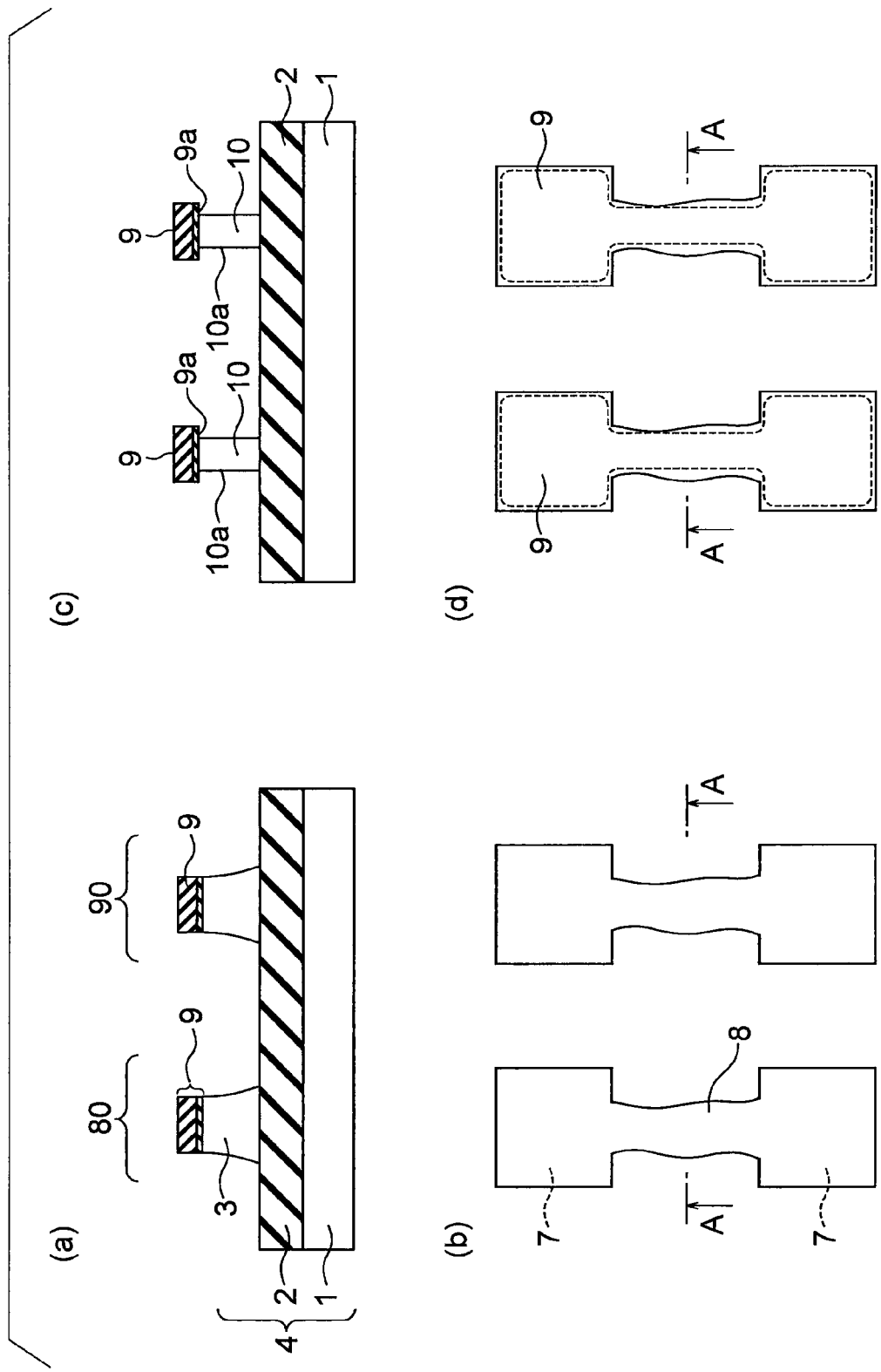
Figure 15:
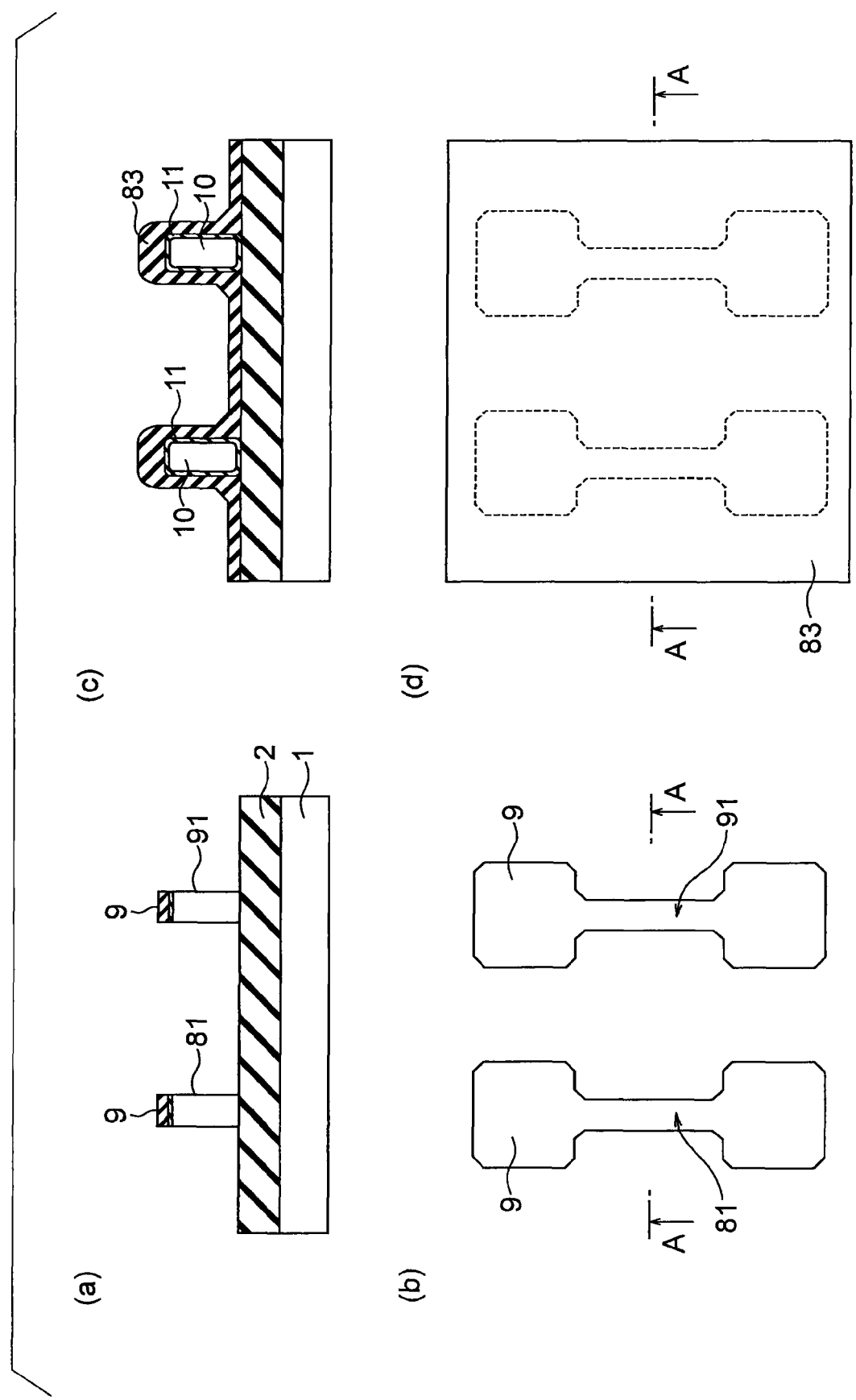
Figure 16:
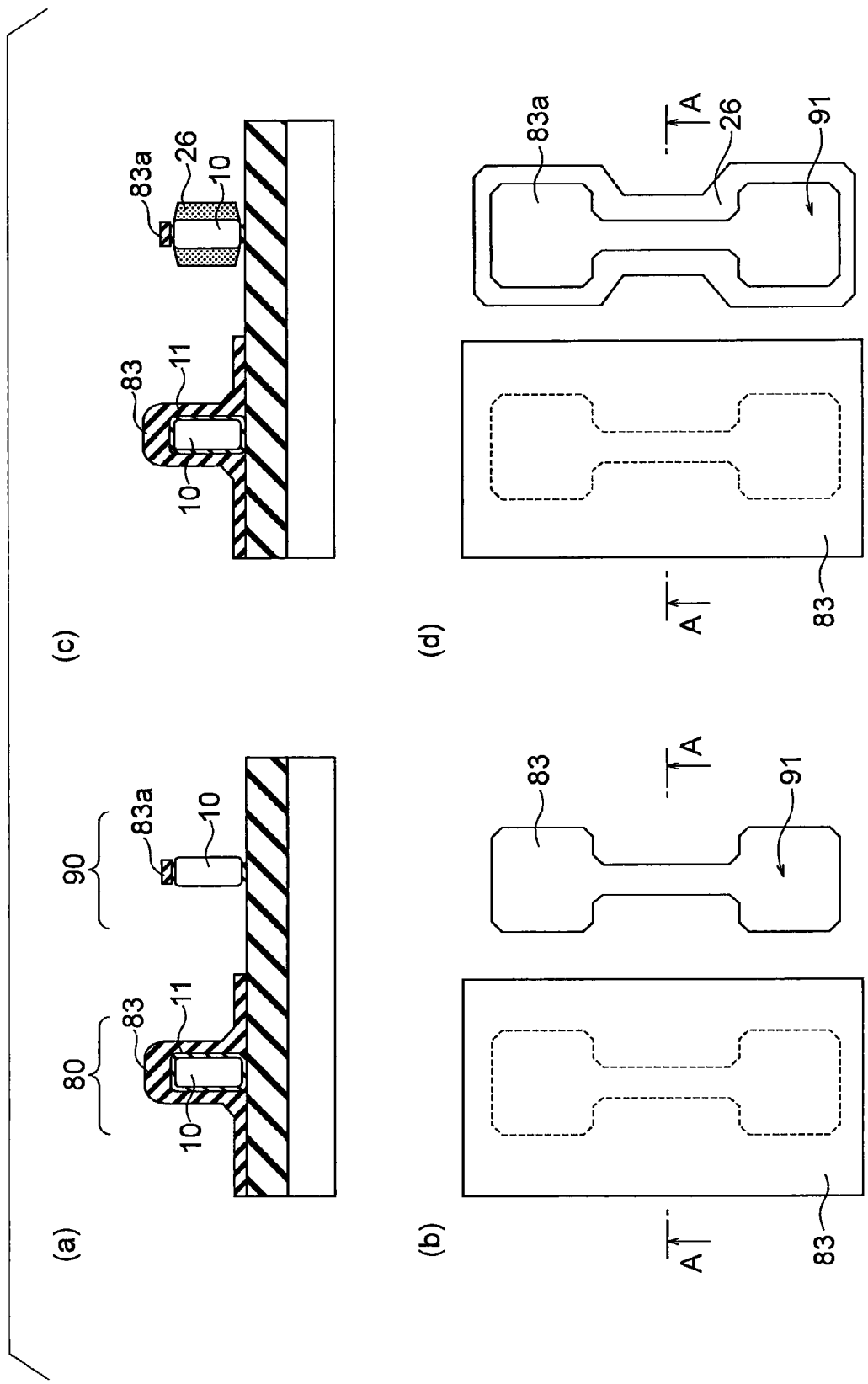
Figure 17:
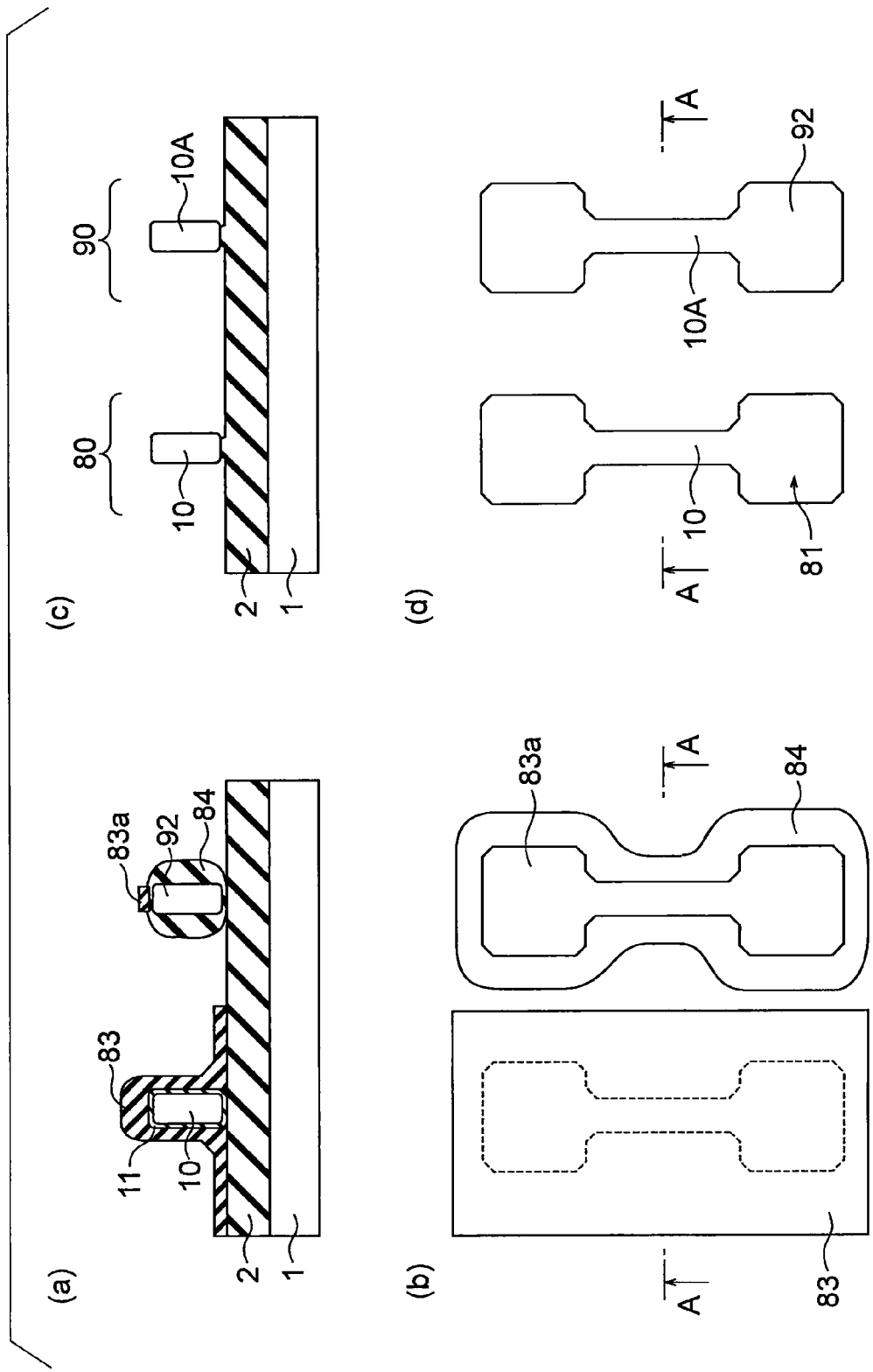
Figure 18:
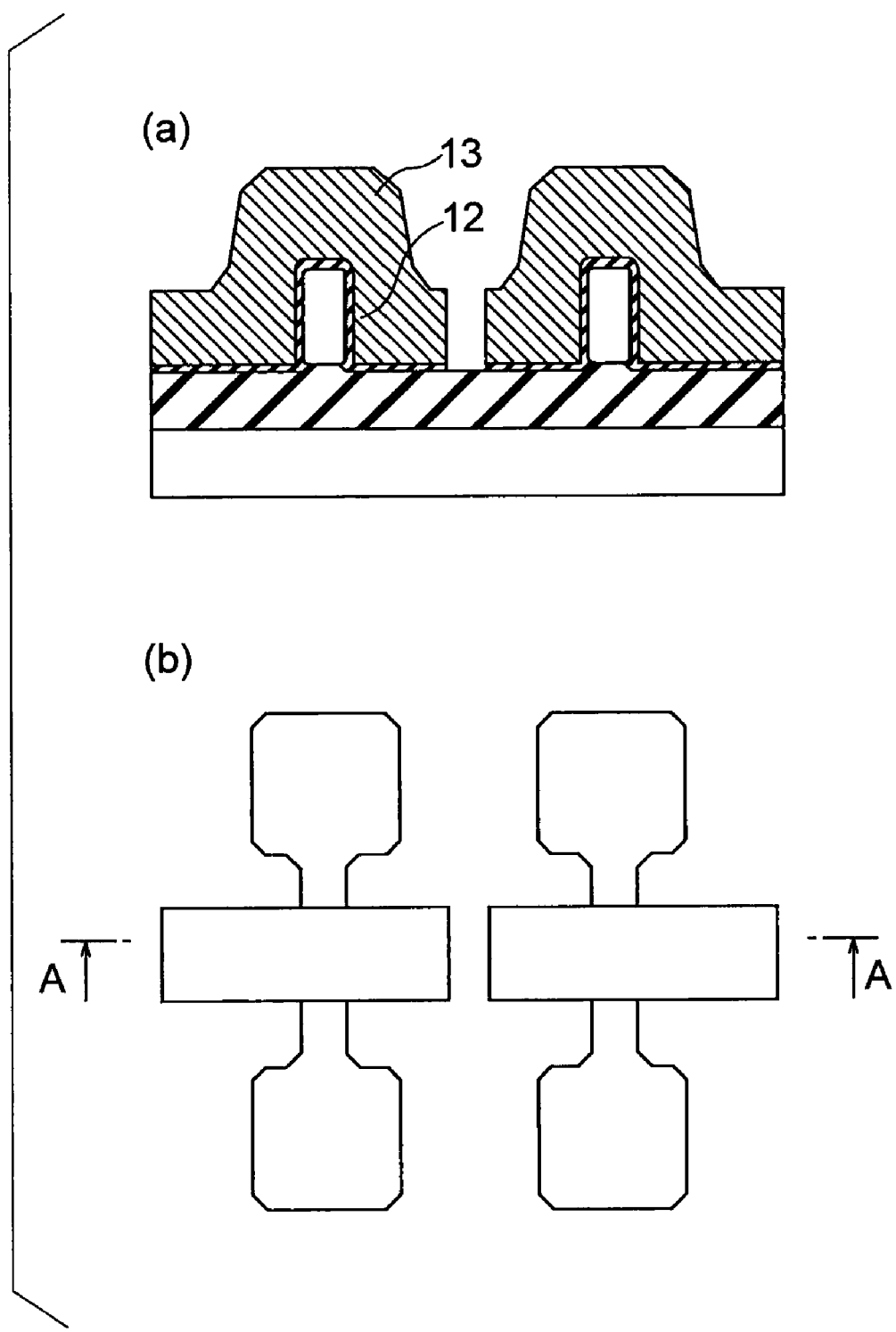
Figure 19:
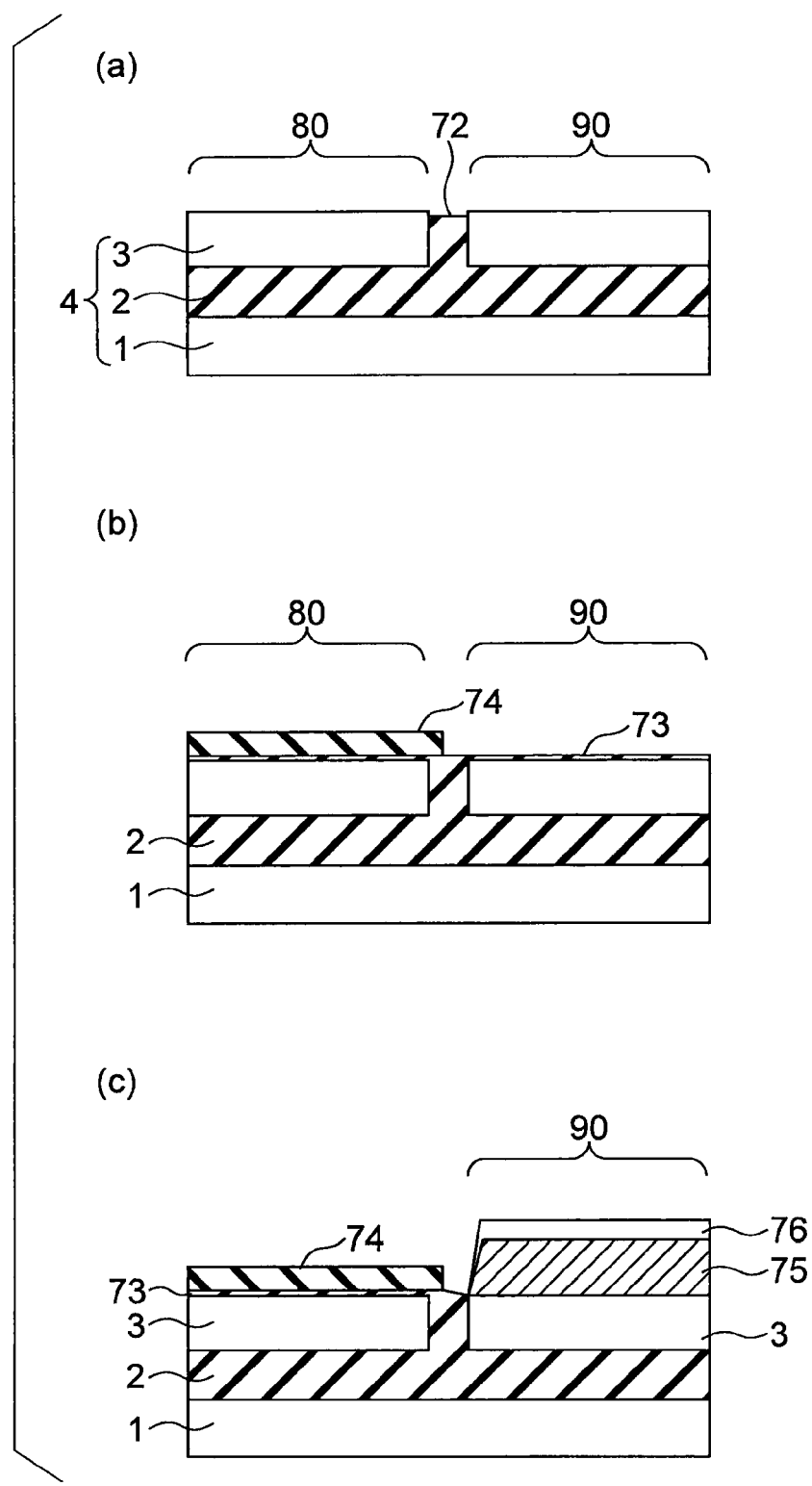
Figure 20:
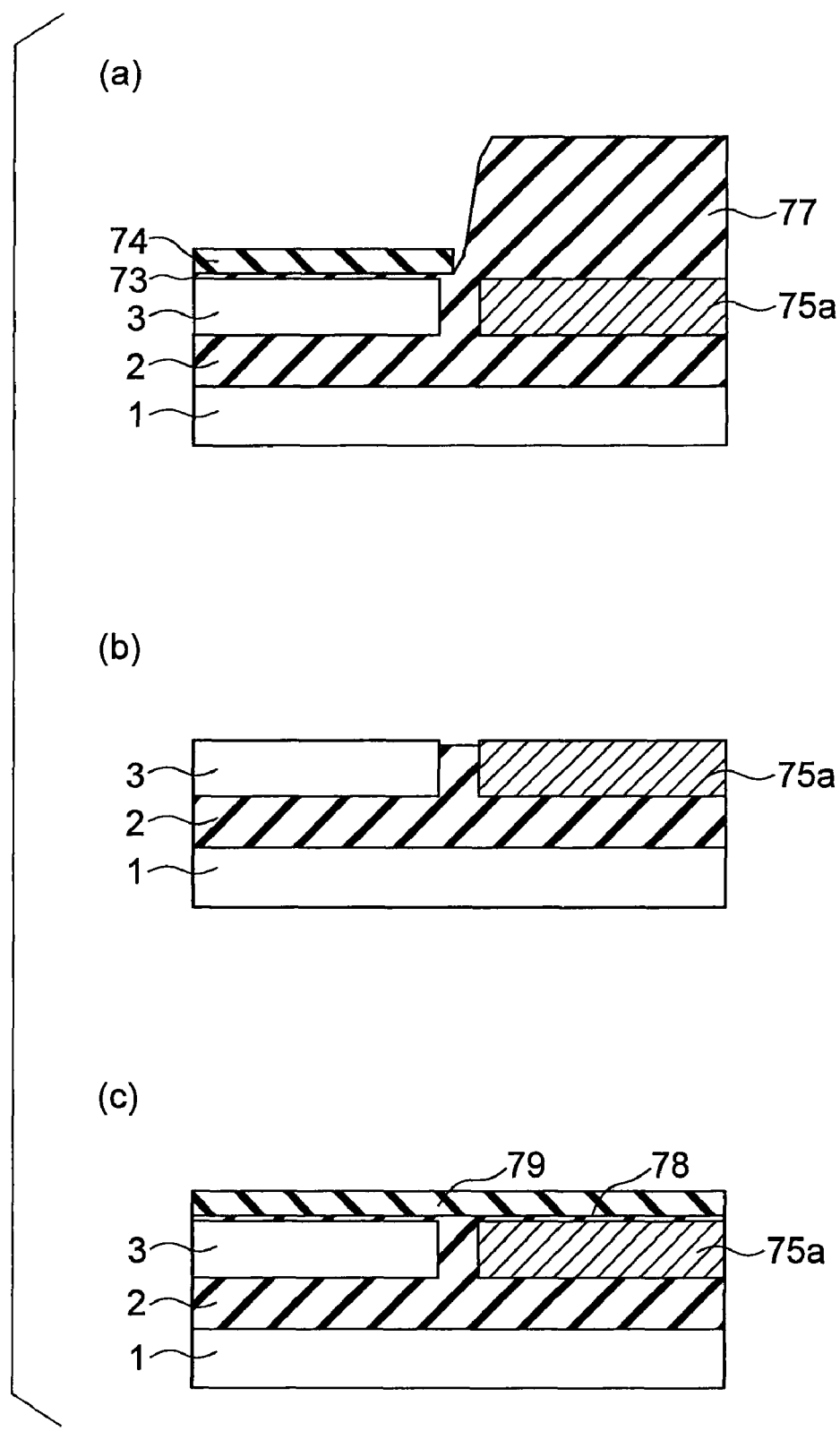
Figure 21:
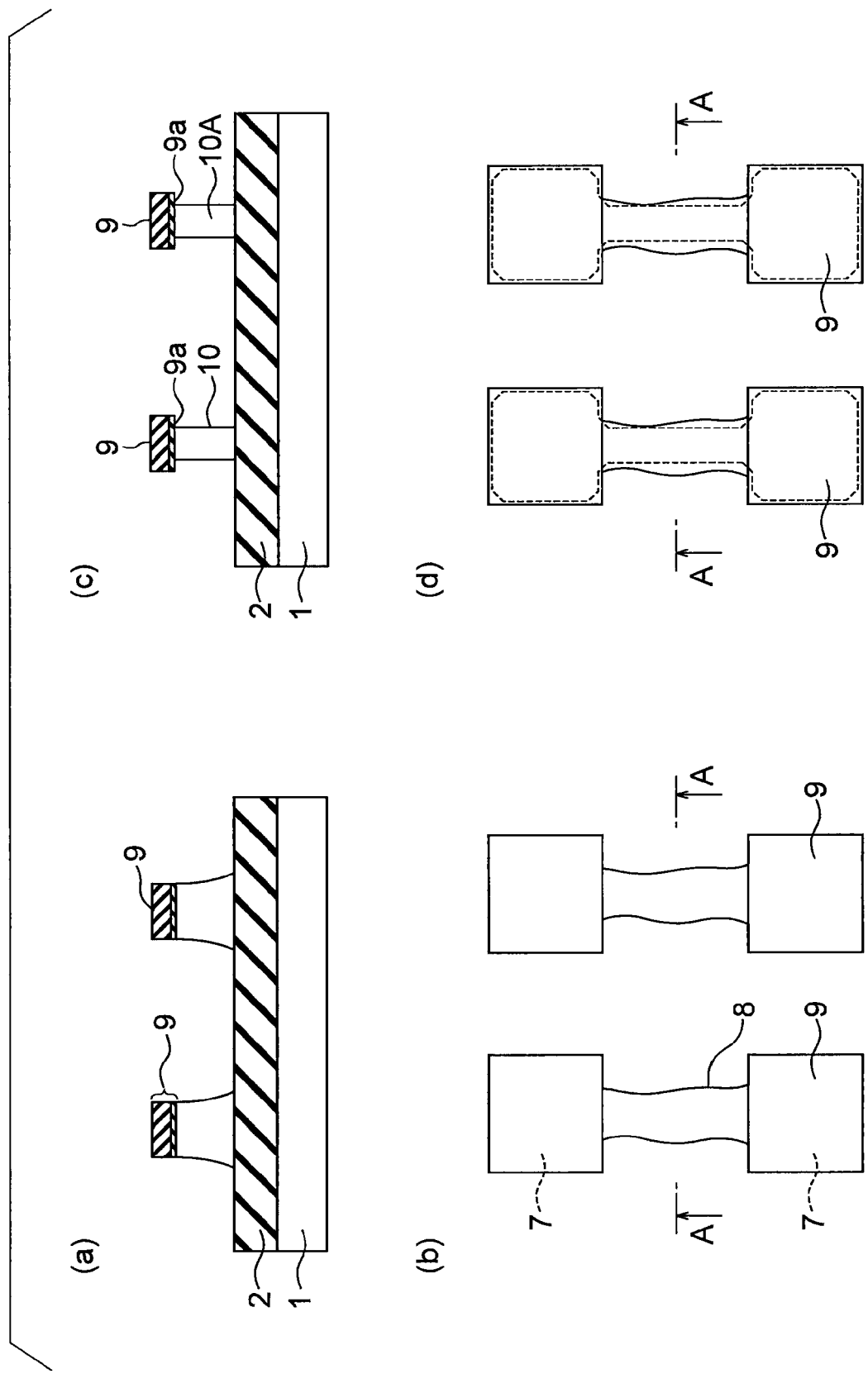
Figure 22:
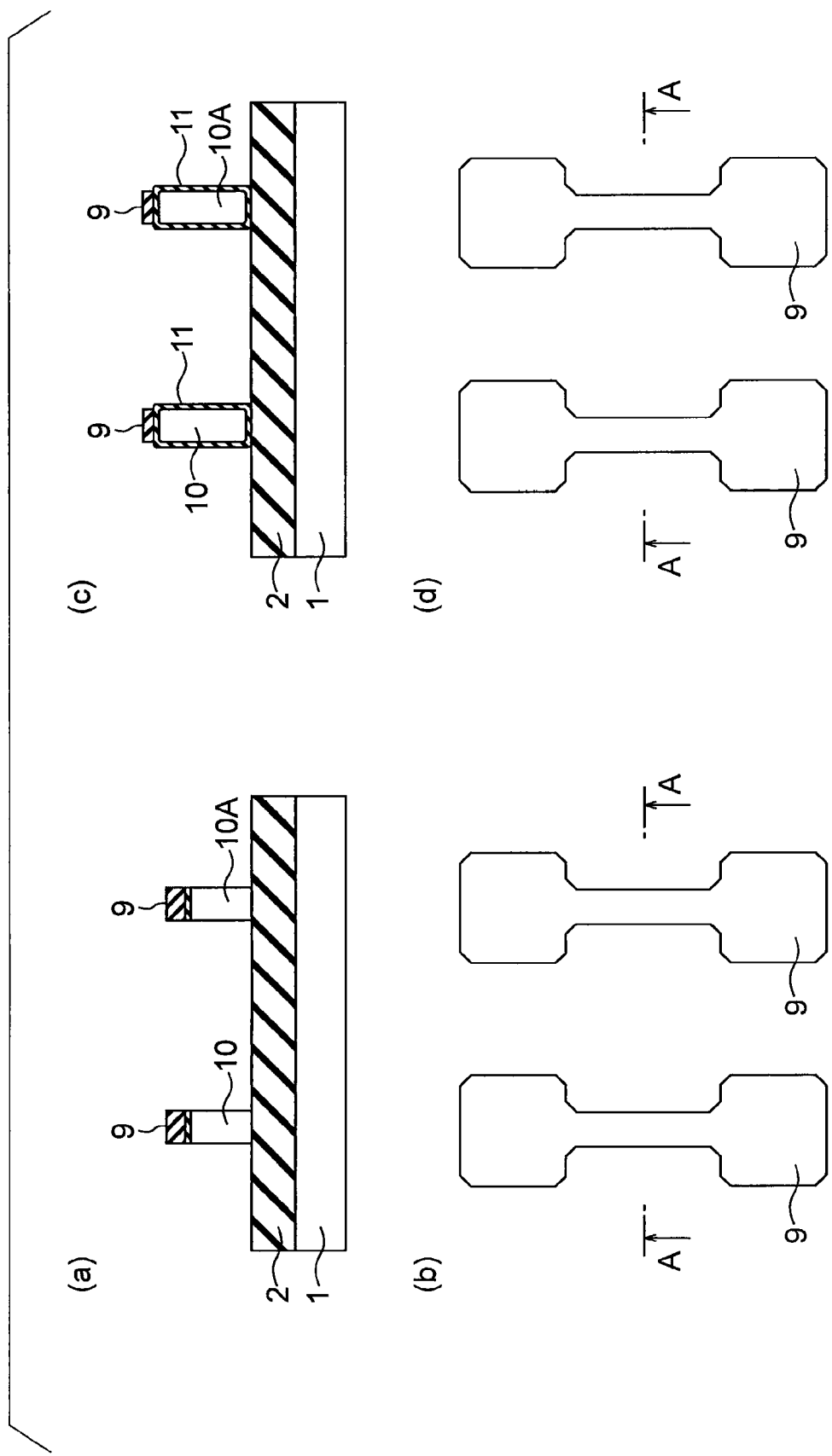
Figure 23:
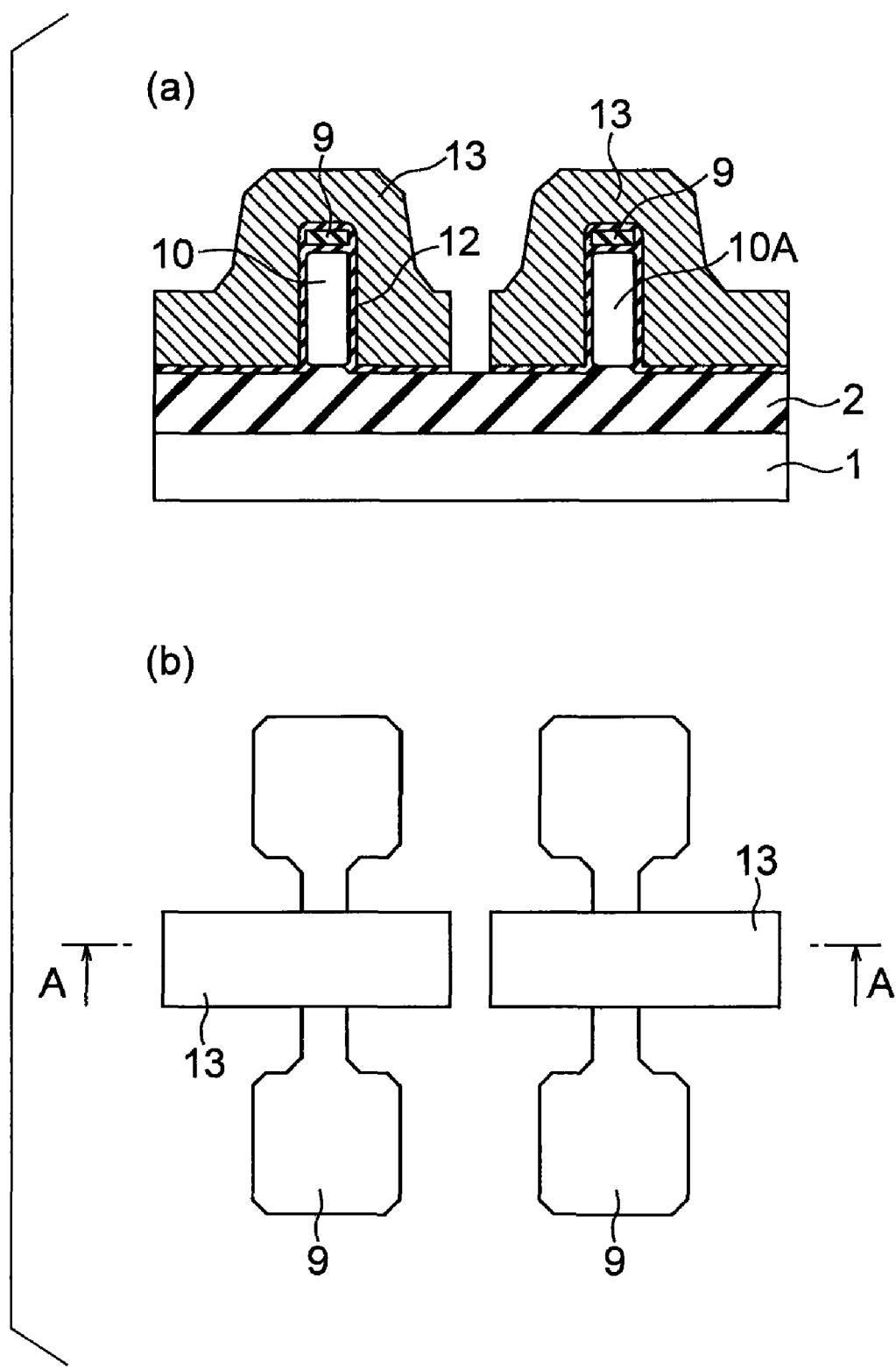

Referring now to FIGS. 7(a) to 7(f), a method for manufacturing a field effect transistor in accordance with a third embodiment of the present invention is described. FIGS. 7(a), 7(c), and 7(e) are cross-sectional views illustrating procedures to be carried out by the method for manufacturing the field effect transistor in accordance with this embodiment. FIGS. 7(b), 7(d), and 7(f) are plan views. FIGS. 7(a), 7(c), and 7(e) are cross-sectional views, taken along each line A-A of FIGS. 7(b), 7(d), and 7(f).

The manufacture method in accordance with this embodiment is another method for manufacturing a nanowire MOSFET having nanowires formed with strained SiGe.

First, a SOI substrate 4 having a supporting substrate 1, a buried oxide film 2, and a 30-nm thick SOI layer 3 having a (001) plane as the principal surface is prepared. The same procedures as those of the first embodiment illustrated in FIGS. 1(d) and 1(e) are then carried out. More specifically, the same procedures as those procedures for performing thermal etching with hydrogen are carried out so as to form the fin 10 having the (110) plane 10a on each sidewall of the mesa structure and the eaves 9a in the hard mask 9. The (110) plane 10a is perpendicular to the principal surface of the substrate.

Next, as shown in FIGS. 7(a) and 7(b), a 10-nm thick $Si_{0.9}Ge_{0.1}$ film 26 is formed through epitaxial growth on each sidewall of the fin 10. Etching with hot phosphoric acid and diluted hydrofluoric acid is then performed to remove the hard mask 9. After that, a silicon oxide film and a silicon nitride film are again deposited in this order on the entire surface, and patterning is performed on the insulating layer 24 formed with the silicon oxide film and the silicon nitride film by a lithography technique and RIE. In this manner, the source and drain portions 7 are covered with the insulating layer 24, and the channel portion is exposed (see FIGS. 7(c) and 7(d)).

Next, as shown in FIGS. 7(e) and 7(f), the channel portion is thermally oxidized at 950° C., so as to form a $Si_{0.25}Ge_{0.75}$ wire channel 16 of 10 nm in diameter through the Ge-condensation and the interdiffusion between Si and Ge. At this point, the wire channel 16 is coated with a thermal oxide film 25.

The same procedures as those of the second embodiment illustrated in FIGS. 6(c) and 6(d) are then carried out. More specifically, after the silicon nitride film 24 is removed with hot phosphoric acid, the thermal oxide film 25 around the wire channel 16 is removed by etching, so as to expose the wire channel 16. The same procedures as those of the second embodiment are carried out thereafter, so as to complete a field effect transistor.

The manufacture method in accordance with this embodiment can be used to produce p-channel MOSFET, as the channel is formed with compressively strained SiGe having high hole mobility. In this manner, the driving current can be increased.

The manufacture method can also be used to produce a CMOSFET circuit consisting of many p-channel and n-channel Fin FETs.

The manufacture method in accordance with this embodiment can be used to produce p-channel MOSFET, as the channel is formed with compressively strained SiGe having high hole mobility. In this manner, the driving current can be increased.

The manufacture method in accordance with this embodiment can be used to produce a field effect transistor having a channel patterned in one of the [100] directions on a (001) substrate. In such a case, flat {010} plane appear on each sidewall of the fin.

The manufacture method can also be used to produce a field effect transistor having a channel in the <−110> direction on a (110) substrate. In such a case, flat {001} planes appear on each sidewall of the fin.

The manufacture method can also be used to produce a field effect transistor having a channel patterned in the <−112> direction on a (110) substrate. In such a case, flat {1-11} planes appear on each sidewall of the fin.

The manufacture method in accordance with this embodiment can also be used to produce a field effect transistor having a channel in the <001> direction on a (110) substrate. In such a case, flat {110} planes appear on each sidewall of the fin.

The manufacture method in accordance with this embodiment can also be used to produce a field effect transistor having a channel in the <−211> direction on a (111) substrate. In such a case, a flat {0-11} planes appear on each sidewall of the fin.

As described above, in accordance with this embodiment, size and shape variations among channels are made as small as possible, and field effect transistors having the smallest possible channel widths can be obtained.

Fourth Embodiment

Referring now to FIGS. 8(a) to 9(f), a method for manufacturing a field effect transistor in accordance with a fourth embodiment of the present invention is described. FIGS. 8(a), 8(b), 8(d), 9(a), 9(c), and 9(e) are cross-sectional views illustrating procedures to be carried out by the method for manufacturing the field effect transistor in accordance with this embodiment. FIGS. 8(c), 8(e), 9(b), 9(d), and 9(f) are plan views. FIGS. 8(b), 8(d), 9(a), 9(c), and 9(e) are cross-sectional views, taken along each line A-A of FIGS. 8(c), 8(e), 9(b), 9(d), and 9(f).

This embodiment relates to a method for manufacturing a multiwire MOSFET.

First, as shown in FIG. 8(a), a SOI substrate 4 having a supporting substrate 1, a buried oxide film 2, and a 12-nm thick SOI layer 3 having a (001) plane as the principal surface is prepared. Two sets of a 10-nm thick $Si_{0.7}Ge_{0.3}$ film 41 and a 12-nm thick Si film 42 are alternately formed through epitaxial growth on the SOI layer 3. Another 10-nm thick $Si_{0.7}Ge_{0.3}$ film 41 is formed through epitaxial growth at the uppermost portion. After that, a 5-nm thick silicon oxide film 5 and a 20-nm thick silicon nitride film 6 are deposited in this order.

Next, as shown in FIGS. 8(b) and 8(c), a mesa structure having a hard mask 9 formed with the silicon oxide film 5 and the silicon nitride film 6 at the top is produced in the same manner as in the first embodiment. Here, the channel direction is the <1-10> direction, and the width of the hard mask 9 is 32 nm.

After the native oxide film on each sidewall of the mesa is removed with the use of diluted hydrofluoric acid, the SOI substrate is subjected to 5-minute annealing in a 100%-hydrogen atmosphere with atmospheric pressure at 1000° C. As a result, the sidewalls of the mesa structure are thermally etched with hydrogen, and flat {110} planes that are perpendicular to the principal surface of the substrate appear on each sidewall of the fin 10B to be the channel, as shown in FIGS. 8(d) and 8(e). In this embodiment, the fin 10B has a stacked structure formed with the SOI layer 3, a $Si_{0.7}Ge_{0.3}$ film 41, a Si film 42, another $Si_{0.7}Ge_{0.3}$ film 41, another Si film 42, and yet another $Si_{0.7}Ge_{0.3}$ film 41. After the thermal etching with hydrogen, the width of the fin 10B becomes 12 nm. After the hydrogen thermal etching of the sidewalls, eaves 9a are formed at the lower portion of the hard mask 9, as shown in FIG. 8(d).

Etching with hot phosphoric acid and diluted hydrofluoric acid is then performed to remove the hard mask 9. After that, an insulating layer formed with a silicon oxide film and a silicon nitride film is again deposited on the entire surface, and patterning is performed on the insulating layer by a photolithography and etching technique. In this manner, the source and drain portions 7 are covered with the insulating layer 24, and the fin 10B to be the channel portion is exposed. Chemical dry etching (CDE) with the use of $CF_4$ or $SF_6$ is then performed to selectively remove the $Si_{0.7}Ge_{0.3}$ films 41, and wire channels 43 formed with three Si wires are formed (see FIGS. 9(a) and 9(b)). In the selective etching procedure, wet etching with the use of an etching solution containing a mixed acid of hydrofluoric acid and nitric acid may be performed, instead of CDE.

As shown in FIGS. 9(c) and 9(d), to round the corners of the wire channels 43 made of Si, a thermal oxide film 11 to cover the surrounding area of the wire channels 43 and the surfaces of the source and drain portions 7 is formed through 30-second RTO at 1050° C. After that, the thermal oxide film 11 is removed with diluted hydrofluoric acid, and the lowermost Si wire of the wire channels 43 is put into a floating state with respect to the buried oxide film 2. As a result, the width and height of the wire channels 43 formed with three Si wires become 10 nm.

A gate oxide film 12 made of $HfO_2$ is then formed to cover the surrounding area of the three wire channels 43, and a polysilicon film is further deposited on the entire surface (FIG. 9(e)). The polysilicon film is patterned by a photolithography technique, so as to form a gate electrode 13. The same procedures as those of the first embodiment are carried out thereafter, so as to complete a field effect transistor.

The manufacture method can also be used to produce a CMOSFET circuit consisting of many p-channel and n-channel Fin FETs.

The manufacture method in accordance with this embodiment can be used to produce a field effect transistor having a channel patterned in one of the [100] directions on a (001) substrate. The manufacture method in accordance with this embodiment is particularly effective in producing an n-channel MOSFET to achieve greater driving current, as a flat {010} planes appear on each sidewall, the top and the bottom surface of the wire.

The manufacture method can also be used to produce a field effect transistor having a channel in the <-110> direction on a (110) substrate. In such a case, the manufacture method is effective in producing both n-channel and p-channel MOSFETs to achieve greater driving current, as flat {001} planes appear on each sidewall of the wire and flat {110} planes appear on the top and bottom of the wire.

The manufacture method can also be used to produce a field effect transistor having a channel patterned in the <-112> direction on a (110) substrate. In such a case, flat {1-11} planes appear on each sidewall of the wire, and therefore, the same driving current can be achieved in both a p-channel MOSFET and an n-channel MOSFET. Thus, the circuit design becomes simpler.

The manufacture method in accordance with this embodiment can also be used to produce a field effect transistor having a channel in the <001> direction on a (110) substrate. In such a case, the manufacture method is particularly effective in producing a p-channel MOSFET to achieve greater driving current, as flat {-110} planes appear on each sidewall of the wire.

The manufacture method in accordance with this embodiment can also be used to produce a field effect transistor having a channel in the <-211> direction on a (111) substrate. In such a case, the manufacture method is particularly effective in producing a p-channel MOSFET to achieve greater driving current, as flat (0-11) planes appear on each sidewall of the wire.

In this embodiment, if a SOI substrate including a SOI layer that is a silicon layer having tensile strain in the plane (a strained SOI substrate) is used, a multiwire MOSFET having tensile strain in the channel direction is formed through the same procedures as above. In such a case, the electron mobility becomes high by virtue of the uniaxial stain in the channel direction, and the ON current of an n-channel MOSFET becomes higher.

As described above, in accordance with this embodiment, size and shape variations among channels are made as small as possible, and field effect transistors having the smallest possible channel widths can be obtained.

In this embodiment, the Ge composition of the $Si_{1-x}Ge_x$ films 41 to be removed is 0.3. If the composition is 0.25 or greater, the etching rate of SiGe rapidly increases. Therefore, it is preferable that the Ge composition x of the $Si_{1-x}Ge_x$ films 41 is in the range of 0.25 to 0.6. The upper limit value is determined by the following reasons. In a case where a $Si_{1-x}Ge_x$ film is grown on a Si substrate, the lattice mismatch between the Si and the SiGe film becomes larger as the composition x is greater, and large compressive strain is caused in the SiGe film. Where the SiGe film thickness is 10 nm as in this embodiment, if the composition x is larger than 0.6, the stain in the SiGe film exceeds a critical value, and a lattice defect is formed during the epitaxial growth.

Fifth Embodiment

Referring now to FIGS. 10(a) to 11(f), a method for manufacturing a field effect transistor in accordance with a fifth embodiment of the present invention is described. FIGS. 10(a), 10(b), 10(d), 11(a), 11(c), and 11(e) are cross-sectional views illustrating procedures to be carried out by the method for manufacturing the field effect transistor in accordance with this embodiment. FIGS. 10(c), 10(e), 11(b), 11(d), and 11(f) are plan views. FIGS. 10(b), 10(d), 11(a), 11(c), and 11(e) are cross-sectional views, taken along each line A-A of FIGS. 10(c), 10(e), 11(b), 11(d), and 11(f).

This embodiment relates to a method for manufacturing a multiwire MOSFET that has multiwires formed with strained SiGe to be the channel. Since the strained SiGe has high hole mobility, a higher driving current than the driving current obtained in a case where the channel is made of Si can be obtained, especially when the manufacture method in accordance with this embodiment is used to produce a p-cannel MOSFET.

First, as shown in FIG. 10(a), a SOI substrate 4 having a supporting substrate 1, a buried oxide film 2, and a 10-nm thick SOI layer 3 having a (001) plane as the principal surface is prepared. Three sets of a 10-nm thick $Si_{0.7}Ge_{0.3}$ film 41 and a 30-nm thick $Si_{0.95}Ge_{0.05}$ film 44 are alternately formed through epitaxial growth on the SOI layer 3. Another 10-nm thick $Si_{0.7}Ge_{0.3}$ film 41 is formed through epitaxial growth at the uppermost portion. After that, a 5-nm thick silicon oxide film 5 and a 20-nm thick silicon nitride film 6 are deposited in this order.

Next, as shown in FIGS. 10(b) and 10(c), a mesa structure having a hard mask 9 formed with the silicon oxide film 5 and the silicon nitride film 6 at the top is produced in the same manner as in the first embodiment. Here, the channel direction is the <1-10> direction, and the width of the hard mask 9 is 40 nm.

After the native oxide film on each sidewall of the mesa structure is removed with the use of diluted hydrofluoric acid, the SOI substrate is subjected to 5-minute annealing in a 100%-hydrogen atmosphere with atmospheric pressure at 1000° C. As a result, the sidewalls of the mesa structure are thermally etched with hydrogen, and flat {110} planes 10Ca that are perpendicular to the principal surface of the substrate appear on each sidewall of the fin 10C to be the channels, as shown in FIGS. 10(d) and 10(e). After the thermal etching with hydrogen, the width of the fin 10C becomes 20 nm. After the hydrogen thermal etching of the sidewalls, eaves 9a are formed at the lower portion of the hard mask 9, as shown in FIG. 10(d).

Etching with hot phosphoric acid and diluted hydrofluoric acid is then performed to remove the hard mask 9. After that, an insulating layer formed with a silicon oxide film and a silicon nitride film is again deposited on the entire surface, and patterning is performed on the insulating layer by a photolithography and an etching techniques. In this manner, the source and drain portions 7 are covered with the insulating layer 24, and the fin 10C to be the channel portion is exposed. Chemical dry etching (CDE) with the use of $CF_4$ or $SF_6$ is then performed to selectively remove the $Si_{0.7}Ge_{0.3}$ films 41, and wire channels 45 formed with three $Si_{0.95}Ge_{0.05}$ wires is formed (see FIGS. 11(a) and 11(b)). In the selective etching procedure, wet etching with the use of an etching solution containing a mixed acid of hydrofluoric acid and nitric acid may be performed, instead of CDE.

As shown in FIGS. 11(c) and 11(d), the fin 10C to be the channel is thermally oxidized at 950° C., so that three wire channels 46 that are 10 nm in diameter and are made of $Si_{0.62}Ge_{0.38}$ are formed through the Ge-condensation process. At this point, the surrounding area of the three wire channels 46 is covered with a thermal oxide film 25.

After the silicon nitride film of the insulating layer 24 is removed with thermal phosphoric acid, etching with diluted hydrofluoric acid is performed to remove the thermal oxide film 25 covering the surrounding area of the three wire channels 46, and to expose the surfaces of the three wire channels 46. A gate oxide film 12 made of $HfO_2$ is then formed to cover the surrounding area of the three wire channels 46, and a polysilicon film is further deposited on the entire surface. As shown in FIGS. 11(e) and 11(f), the polysilicon film is then patterned by a photolithography technique, so as to form a gate electrode 13. The same procedures as those of the first embodiment are carried out thereafter, so as to complete a field effect transistor.

The manufacture method can also be used to produce a CMOSFET circuit consisting of many p-channel and n-channel Fin FETs.

The manufacture method in accordance with this embodiment can be used to produce a field effect transistor having a channel patterned in one of the [100] directions on a (001) substrate. In such a case, flat (010) planes appear on each sidewall of the wire.

The manufacture method can also be used to produce a field effect transistor having a channel in the <-110> direction on a (110) substrate. In such a case, flat (001) planes appear on each sidewall of the wire.

The manufacture method can also be used to produce a field effect transistor having a channel patterned in the <-112> direction on a (110) substrate. In such a case, flat {1-11} planes appear on each sidewall of the wire.

The manufacture method in accordance with this embodiment can also be used to produce a field effect transistor having a channel in the <001> direction on a (110) substrate. In such a case, flat {-110} planes appear on each sidewall of the wire.

The manufacture method in accordance with this embodiment can also be used to produce a field effect transistor having a channel in the <-211> direction on a (111) substrate. In such a case, flat {0-11} planes appear on each sidewall of the wire.

As described above, in accordance with this embodiment, size and shape variations among channels are made as small as possible, and field effect transistors having the smallest possible channel widths can be obtained.

In this embodiment, it is also preferable that the Ge composition x of the $Si_{1-x}Ge_x$ films 41 to be removed is in the range of 0.25 to 0.6, as in the fourth embodiment. Meanwhile, it is preferable that the Ge composition x of the $Si_{1-x}Ge_x$ films 44 to remain is less than 0.25, and, more preferably, 0.1 or less.

Sixth Embodiment

Referring now to FIGS. 12(a) to 13(d), a method for manufacturing a field effect transistor in accordance with a sixth embodiment of the present invention is described. FIGS. 12(a), 12(c), 12(e), 13(a), and 13(c) are cross-sectional views illustrating procedures to be carried out by the method for manufacturing the field effect transistor in accordance with this embodiment. FIGS. 12(b), 12(d), 12(f), 13(b), and 13(d) are plan views. FIGS. 12(a), 12(c), 12(e), 13(a), and 13(c) are cross-sectional views, taken along each line A-A of FIGS. 12(b), 12(d), 12(f), 13(b), and 13(d).

First, a 20-nm thick silicon nitride film is deposited on a silicon substrate 60 having a (001) plane as the principal surface. Patterning is performed on the silicon nitride film by a lithography technique using an electron beam or an excimer laser and a reactive ion etching (RIE), and a hard mask 6 is formed on source and drain portions 7 and a portion 8 to be the channel region. Here, the channel direction is the <1-10> direction, and the width of the hard mask 6 is 40 nm. With the hard mask 6 being used as a mask, RIE is performed to form the source and drain portions 7 and the channel region 8 into a mesa shape (FIGS. 12(a) and 12(b)).

After the native oxide film on each sidewall of the mesa structure is removed with the use of diluted hydrofluoric acid, the silicon substrate 60 is subjected to 5-minute annealing in a 100%-hydrogen atmosphere with atmospheric pressure at 950° C. As a result, the sidewalls of the mesa structure 10 are thermally etched, and flat {110} planes 10a that are perpendicular to the principal surface of the substrate appear on each sidewall of the fin 10 to be the channel portion 8, as shown in FIGS. 12(c) and 12(d).

Further, {111} planes appear on a connecting portion 61 that is located at the lower portion of the mesa structure and between the fin 10 and the substrate 60. The {111} planes cross the {110} planes 10a at the upper portion of the mesa. This is the effect of etching of the sidewalls of the fin 10 and the surface of the substrate 60 (thermal etching with hydrogen) that is caused as hydrogenated silicon is generated from a reaction between hydrogen and Si, and the hydrogenated silicon vaporizes. Since the etching rates of the {110} planes and the {111} planes are lower than those of the other high-index planes, the {110} planes and the {111} planes appear. After the thermal etching with hydrogen, the width of the fin 10 becomes 15 nm. Here, the position of the lower end of the fin 10 is represented by two straight lines defined by the intersection lines between the (111) plane and the (110) plane and between the (−1-11) plane and the (−1-10) plane. Accordingly, the fin 10 having a very small variation in width is formed. After the hydrogen etching of the sidewalls, eaves 6a are formed at the lower portion of the hard mask 6, as shown in FIG. 12(c).

After the fin 10 is filled with an interlayer insulating film 62, flattening is performed by CMP (Chemical Mechanical Polishing) until the top portion of the hard mask 6 is exposed, as shown in FIGS. 12(e) and 12(f).

Etchback is then performed on the interlayer insulating film 62 by RIE, and the {110} planes as the sidewalls of the fin 10 are again exposed with the use of diluted hydrofluoric acid, as shown in FIGS. 13(a) and 13(b). After that, the eaves 6a of the hard mask 6 are removed. At this point, the silicon nitride film 6 is not completely removed, but is partially left on the mesa structure.

A gate oxide film 12 made of $HfO_2$ is then formed on the sidewalls of the fin 10, and a polysilicon film is deposited. Patterning is then performed on the polysilicon film by a photolithography technique, so as to form a gate electrode 13 (FIGS. 13(c) and 13(d)). After that, the same procedures as those of the first embodiment are carried out to complete a field effect transistor.

As described above, in accordance with this embodiment, size and shape variations among channels are made as small as possible, and field effect transistors having the smallest possible channel widths can be obtained.

In a field effect transistor manufactured by the manufacture method in accordance with this embodiment, the width of the bottom portion of the fin having the {110} planes as each sidewall are uniquely defined by the intersection lines between the {111} planes and the {110} planes. Accordingly, the variations in width along fins are restricted to a value equivalent to several atoms or less.

The manufacture method can also be used to produce a CMOSFET circuit consisting of many p-channel and n-channel Fin FETs.

Seventh Embodiment

Referring now to FIGS. 14(a) to 18(b), a method for manufacturing a complementary MOSFET (CMOSFET) in accordance with a seventh embodiment of the present invention is described. This embodiment relates to a method for manufacturing a CMOSFET that includes an n-channel Fin FET having the channel formed with a SOI layer, and a p-channel Fin FET having the channel formed with a strained SGOI layer. Here, a SGOI substrate is a substrate that has the same structure as a SOI substrate, except that the SOI layer is replaced with a SiGe layer. FIGS. 14(a), 14(c), 15(a), 15(c), 16(a), 16(c), 17(a), 17(c), and 18(a) are cross-sectional views illustrating procedures to be carried out by the method for manufacturing the field effect transistor in accordance with this embodiment. FIGS. 14(b), 14(d), 15(b), 15(d), 16(b), 16(d), 17(b), 17(d), and 18(b) are plan views. FIGS. 14(a), 14(c), 15(a), 15(c), 16(a), 16(c), 17(a), 17(c), and 18(a) are cross-sectional views, taken along each line A-A of FIGS. 14(b), 14(d), 15(b), 15(d), 16(b), 16(d), 17(b), 17(d), and 18(b).

First, a SOI substrate 4 having a supporting substrate 1, a buried oxide film 2, and a SOI layer 3 having a (001) plane as the principal surface is prepared. The same procedures as those of the first embodiment are then carried out to form a SOI mesa structure in each of an n-channel transistor formation region 80 and a p-channel transistor formation region 90, as shown in FIGS. 14(a) and 14(b). The same procedures as those of the first embodiment are still carried out to perform thermal etching with hydrogen on the sidewalls of the mesa structures, as shown in FIGS. 14(c) and 14(d). As a result, a fin 10 having a flat surface 10a on each sidewall of each mesa structure is formed. The flat surface 10a is perpendicular to the substrate. At this point, eaves 9a are formed at the lower portion of each hard mask 9.

The same procedures as those of the first embodiment are carried out to remove the eaves 9a of the hard mask 9, and an n-channel mesa 81 and a p-channel mesa 91 are formed, as shown in FIGS. 15(a) and 15(b). After the hard mask 9 is removed by etching, a thermal oxide film 11 to cover the surfaces of the mesa structures is formed by 30-second rapid thermal oxidation (RTO) at 1050° C., and a 20-nm thick silicon nitride film 83 is further formed by CVD on the entire surface, as shown in FIGS. 15(c) and 15(d).

Next, as shown in FIGS. 16(a) and 16(b), the silicon nitride film 83 on the p-channel transistor formation region 90 is removed by wet etching with thermal phosphoric acid, and the thermal oxide film 11 on each sidewall of the p-channel fin 10 is removed by etching with diluted hydrofluoric acid, so as to expose the surfaces of the fins 10. At this point, a silicon nitride film 83a is left on the p-channel mesa 91. As shown in FIGS. 16(c) and 16(d), a 10-nm thick $Si_{0.85}Ge_{0.15}$ film 26 is formed through epitaxial growth on each sidewall of the p-channel mesa 91.

Next, as shown in FIGS. 17(a) and 17(b), the sidewalls of the p-channel mesa 91 are thermally oxidized until the width of the mesa 91 becomes 10 nm. As a result, a mesa structure 92 made of $Si_{0.7}Ge_{0.3}$ is formed through the Ge-condensation process. At this point, the surrounding area of the mesa structure 92 is covered with a thermal oxide film 84. As shown in FIGS. 17(c) and 17(d), the silicon nitride films 83 and 83a are removed with hot phosphoric acid, and the silicon oxide film 11 and the thermal oxide film 84 are removed with diluted hydrofluoric acid. As a result, a mesa structure 81 having a fin 10 made of silicon appears on the n-channel transistor formation region, and the mesa structure 92 having a fin 10A made of $Si_{0.7}Ge_{0.3}$ appears on the p-channel transistor formation region.

Next, as shown in FIGS. 18(a) and 18(b), a gate oxide film 12 made of $HfO_2$ is deposited on the entire surface, and a polysilicon film is further deposited on the entire surface. Patterning is then performed on the polysilicon film by a photolithography technique, so as to form gate electrodes 13. After that, the same procedures as those of the first embodiment are carried out to complete a CMOSFET.

As described above, in accordance with this embodiment, size and shape variations among channels are made as small as possible, and field effect transistors having the smallest possible channel widths can be obtained.

In this embodiment that involves a substrate having a (001) plane as the principal surface, the direction of the fin to be the channel of an n-channel MOSFET is the same as the direction of the fin to be the channel of a p-channel MOSFET. However, the directions of the two fins may differ from each other by 45 degrees or 90 degrees. In a case where the principal surface of the substrate is a (110) plane and one of the channels extends in the [−110] direction, the directions of the two fins may differ from each other by 90 degrees. This also applies to the following eighth to tenth embodiments.

Eighth Embodiment

Referring now to FIGS. 19(a) to 23(b), a method for manufacturing a CMOSFET in accordance with an eighth embodiment of the present invention is described. The CMOSFET to be manufactured by the manufacture method in accordance with this embodiment includes an n-channel Fin FET having the channel formed with a SOI layer, and a p-channel Fin FET having the channel formed with a strained SGOI layer. The manufacture method in accordance with this embodiment differs from the manufacture method in accordance with the seventh embodiment. FIGS. 19(a) to 20(c) are cross-sectional views illustrating procedures to be carried out by the manufacture method in accordance with this embodiment. FIGS. 21(a), 21(c), 22(a), 22(c), and 23(a) are cross-sectional views illustrating manufacturing procedures. FIGS. 21(b), 21(d), 22(b), 22(d), and 23(b) are plan views. FIGS. 21(a), 21(c), 22(a), 22(c), and 23(a) are cross-sectional views, taken along each line A-A of FIGS. 21(b), 21(d), 22(b), 22(d), and 23(b).

First, as shown in FIG. 19(a), a SOI substrate 4 having a supporting substrate 1, a buried oxide film 2, and a 50-nm thick SOI layer 3 is prepared. A device isolation region 72 is then formed on the SOI layer 3 by the known shallow trench isolation (STI) process. An n-channel transistor formation region 80 and a p-channel transistor formation region 90 are isolated from each other by the device isolation region 72.

As shown in FIG. 19(b), a 5-nm thick thermal oxide film 73 and a 20-nm thick silicon nitride film 74 are formed on the 50-nm thick SOI layer 3, and the portion of the silicon nitride film 74 located on the p-channel transistor formation region 90 is removed by a photolithography technique and RIE.

As shown in FIG. 19(c), the portion of the thermal oxide film 73 located on the p-channel transistor formation region 90 is then removed by etching with diluted hydrofluoric acid. After that, a 50-nm thick $Si_{0.85}Ge_{0.15}$ film 75 and a 10-nm thick Si film 76 are formed on the p-channel transistor formation region 90 through epitaxial growth in this order.

As shown in FIG. 20(a), the p-channel transistor formation region 90 is subjected to thermal oxidization, and an oxide film 77 is formed. Further, a 50-nm thick SiGe film 75a is formed through the Ge-condensation process.

As shown in FIG. 20(b), the thermal oxide films 77 and 73 and the silicon nitride film 74 are removed with diluted hydrofluoric acid and thermal phosphoric acid, so as to expose the surface of the SOI layer 3 in the n-channel transistor formation region 80 and the surface of the SiGe film 75a in the p-channel transistor formation region 90.

As shown in FIG. 20(c), a 2-nm thick thermal oxide film 78 and a 20-nm thick silicon nitride film 79 are again formed on the respective surfaces of the n-channel transistor formation region 80 and the p-channel transistor formation region 90.

Patterning is then performed on the silicon nitride film 79 and the thermal oxide film 78, so as to form hard masks 9 formed with the thermal oxide film 78 and the silicon nitride film 79 on the n-channel transistor formation region 80 and the p-channel transistor formation region 90, respectively. With the hard masks 9 being used, RIE is performed to form the source and drain portions and the channel region 8 into mesa shapes, as shown in FIGS. 21(a) and 21(b).

The thermal etching with the use of hydrogen described in the first embodiment is then performed, so as to form mesa structures that include a fin 10 and a fin 10A on the n-channel transistor formation region 80 and the p-channel transistor formation region 90, respectively. The fin 10 and the fin 10A have flat sidewalls that are perpendicular to the substrate (FIGS. 21(c) and 21(d)). At this point, eaves 9a are formed in the hard masks 9.

The same procedures as those of the first embodiment are then carried out to remove the eaves 9a of the hard masks 9 (FIGS. 22(a) and 22(b)). A thermal oxide film 11 is then formed on each sidewall of the fin 10 and the fin 10A, and the edge portions of the fins 10 and 10A are rounded. Further, the widths of the fins 10 and 10A are adjusted to appropriate values (FIGS. 22(c) and 22(d)).

The thermal oxide films 11 are then removed to expose the sidewalls of the fins 10 and 10A in the same manner as in the first embodiment. After that, a gate oxide film 12 is formed on each of the exposed sidewalls, and a polysilicon film is further deposited on the entire surface. In the same manner as in the first embodiment, the polysilicon film is then patterned by a photolithography technique and RIE, so as to form gate electrodes 13 (FIGS. 23(a) and 23(b)). The same procedures as those of the first embodiment are carried out thereafter, so as to complete a CMOSFET.

The manufacture method in accordance with this embodiment can be used to produce a field effect transistor having a fin-like channel patterned in one of the [110] directions on a (001) substrate. The manufacture method in accordance with this embodiment is particularly effective in producing a p-channel MOSFET to achieve greater driving current, as the sidewalls of the fin are formed with {110} planes having higher hole mobility than on the {100} planes.

Other than that, the manufacture method in accordance with this embodiment can be used to produce a field effect transistor having a channel patterned in one of the [100] directions on a (001) substrate. In such a case, the manufacture method is particularly effective in producing an n-channel MOSFET to achieve greater driving current, as flat {010} planes appear on each sidewall of the fin.

The manufacture method can also be used to produce a field effect transistor having a channel in the <−110> direction on a (110) substrate. In such a case, the manufacture method is particularly effective in producing an n-channel MOSFET to achieve greater driving current, as flat {001} plane appears on each sidewall of the fin.

The manufacture method can also be used to produce a field effect transistor having a channel patterned in the <−112> direction on a (110) substrate. In such a case, flat {111} planes appears on each sidewall of the fin, and therefore, the same driving current can be achieved in both a p-channel MOSFET and an n-channel MOSFET. Thus, the circuit design becomes simpler.

The manufacture method in accordance with this embodiment can also be used to produce a field effect transistor having a channel in the <001> direction on a (110) substrate. In such a case, the manufacture method is particularly effective in producing a p-channel MOSFET to achieve greater driving current, as flat {110} planes appear on each sidewall of the fin.

The manufacture method in accordance with this embodiment can also be used to produce a field effect transistor having a channel in the [−211] direction on a (111) substrate. In such a case, the manufacture method is particularly effective in producing a p-channel MOSFET to achieve greater driving current, as flat {011} planes appear on each sidewall of the fin.

As described above, in accordance with this embodiment, size and shape variations among channels are made as small as possible, and field effect transistors having the smallest possible channel widths can be obtained.

As a modification of this embodiment, a SOI substrate (strained SOI substrate) that includes a silicon layer as a SOI layer having tensile strain $\in$ in the plane may be used, and the same procedures as those of this embodiment are then carried out to form a CMOSFET. In this CMOSFET, the channel of the n-channel MOSFET is formed with strained Si having tensile strain in the channel direction, and the channel of the p-channel MOSFET is formed with strained $Si_{1-x}Ge_x$ having compressive strain in the channel direction. However, to maintain the compressive strain of the p-channel, $\in/\in_0$ should be satisfied. Here, $\in_0$ is the strain caused by the lattice mismatch between Si and Ge, and is 0.042. The in equation means that the lattice constant of the lattice-relaxed $Si_{1-x}Ge_x$ becomes larger than the in-plane lattice constant of the original strained SOI substrate.

Ninth Embodiment

Figure 24:
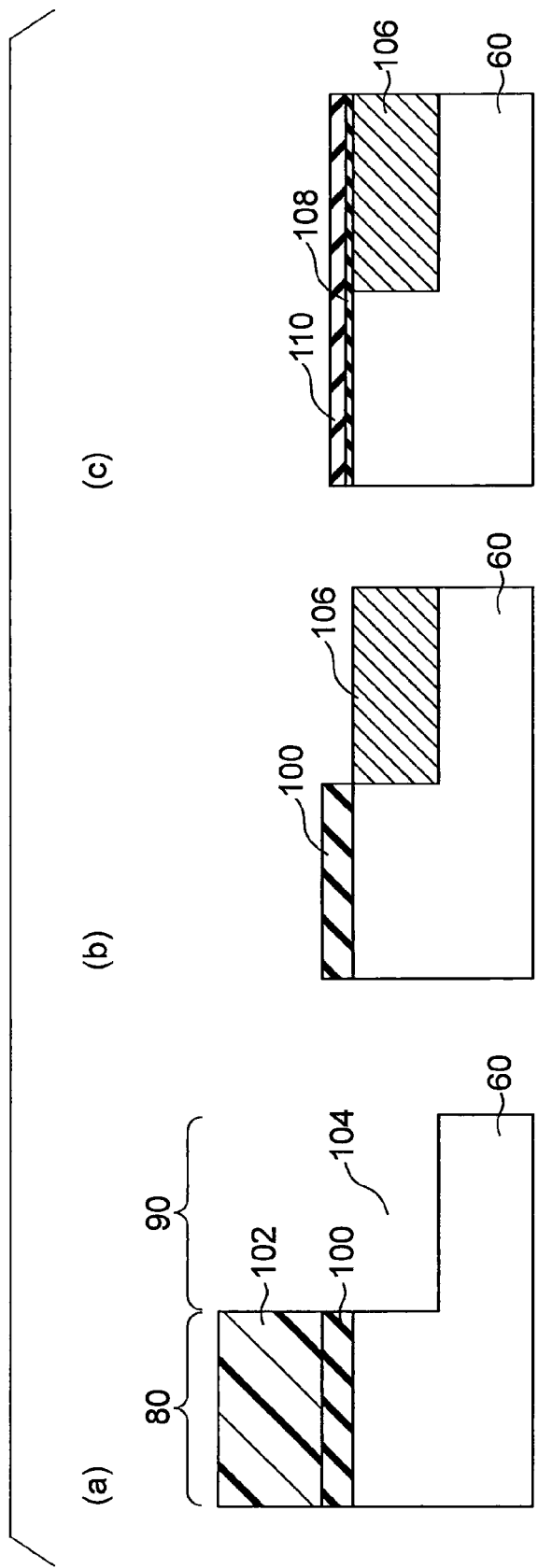
Figure 25:
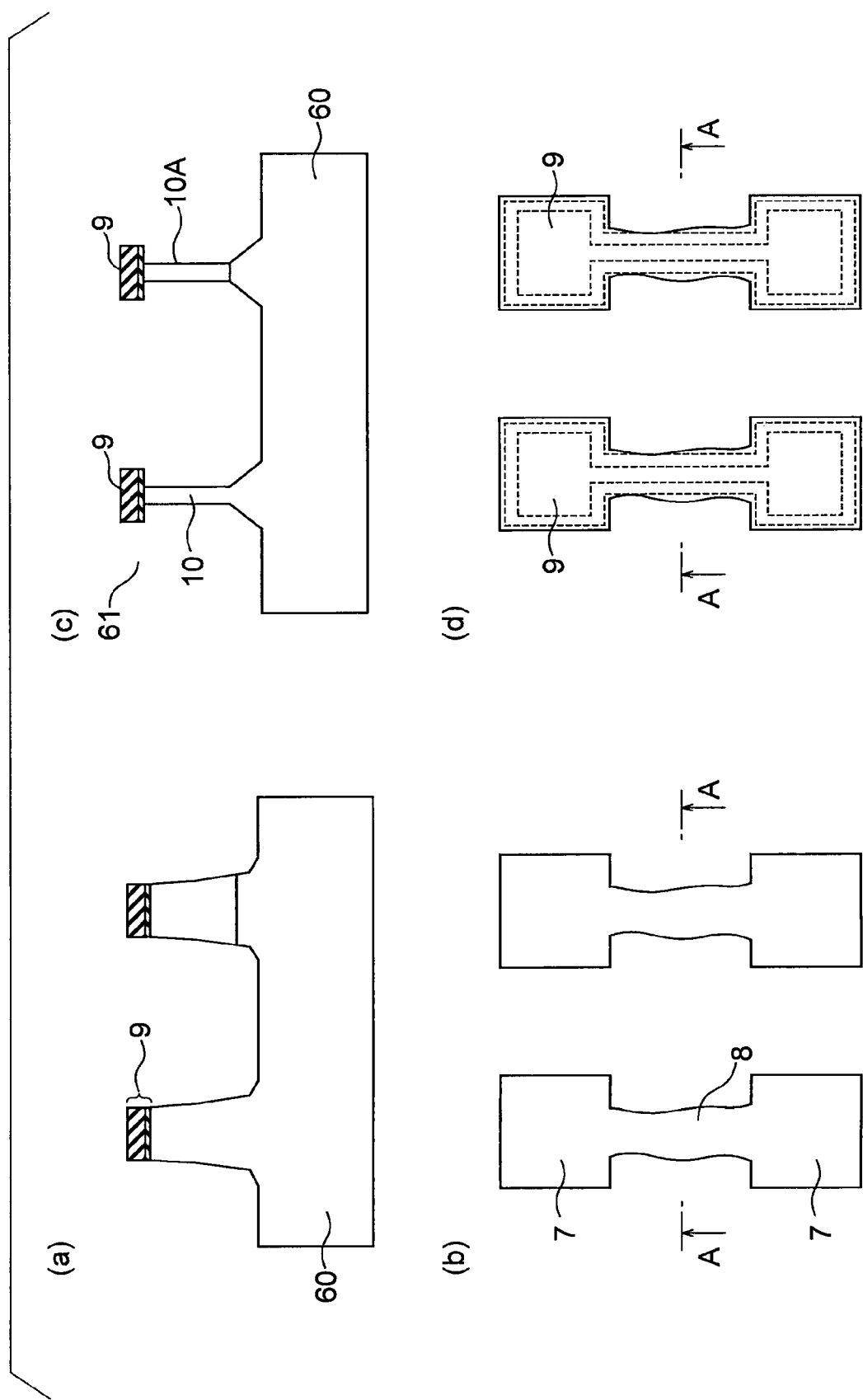
Figure 26:
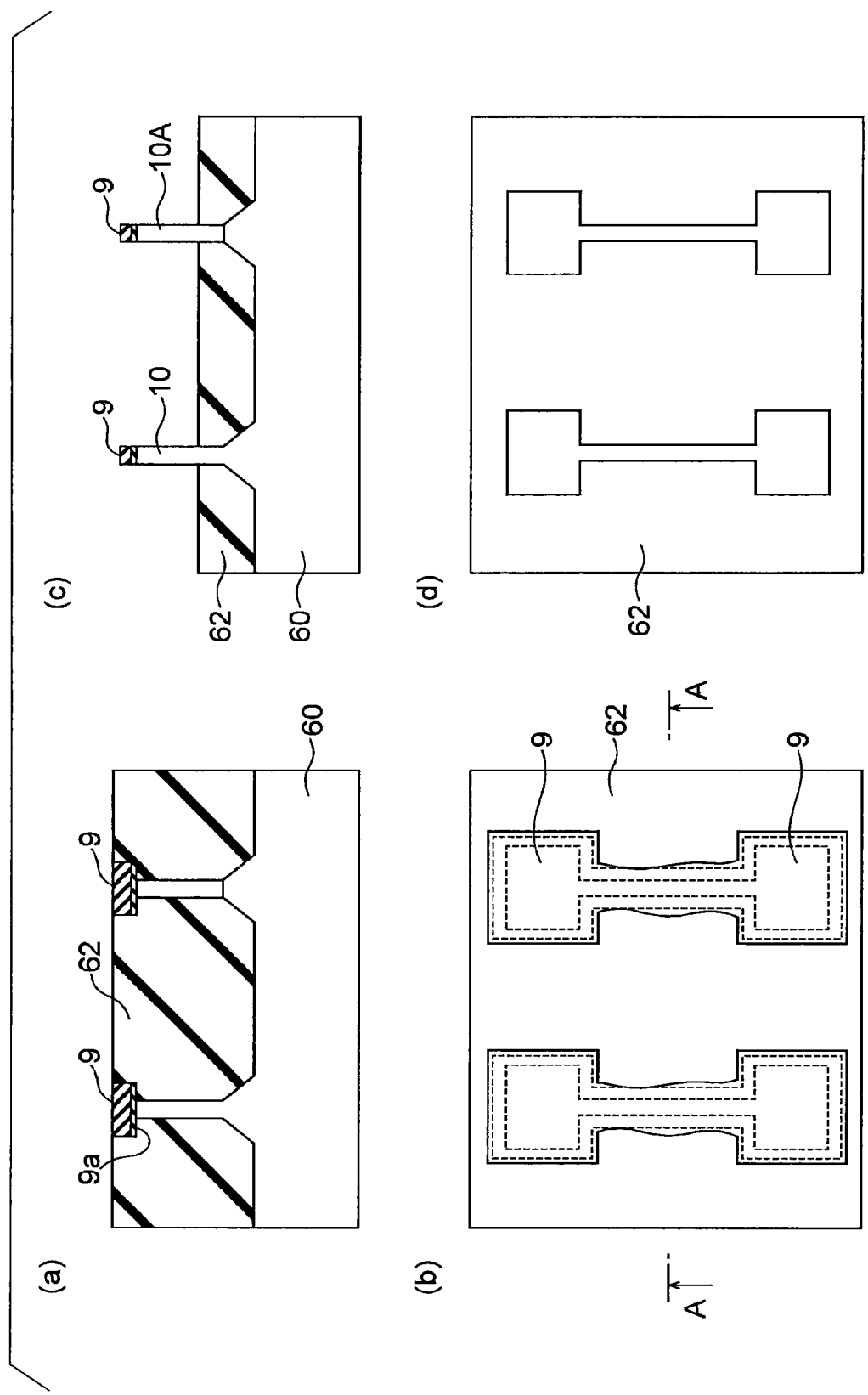
Figure 27:
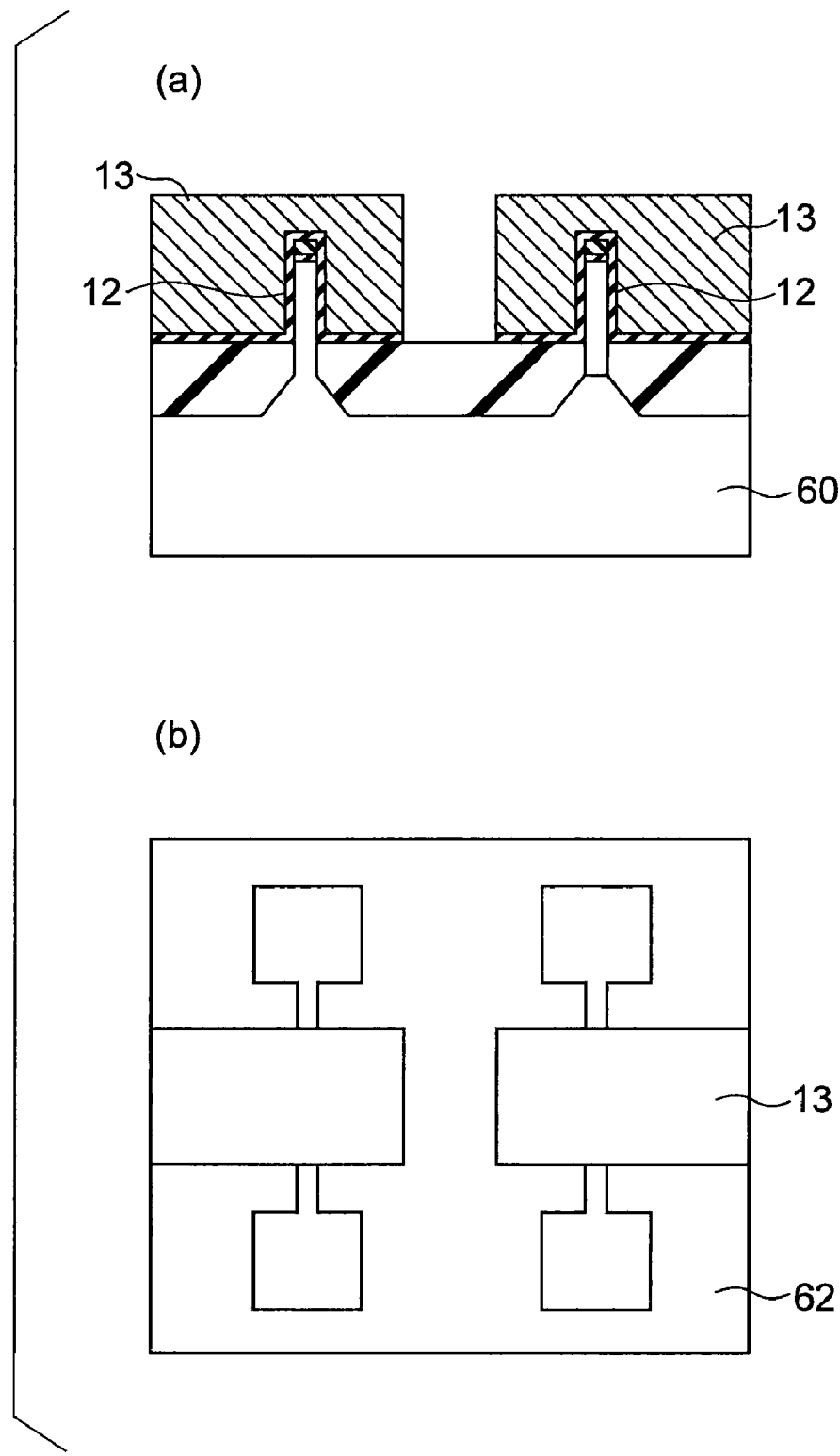
Figure 28:
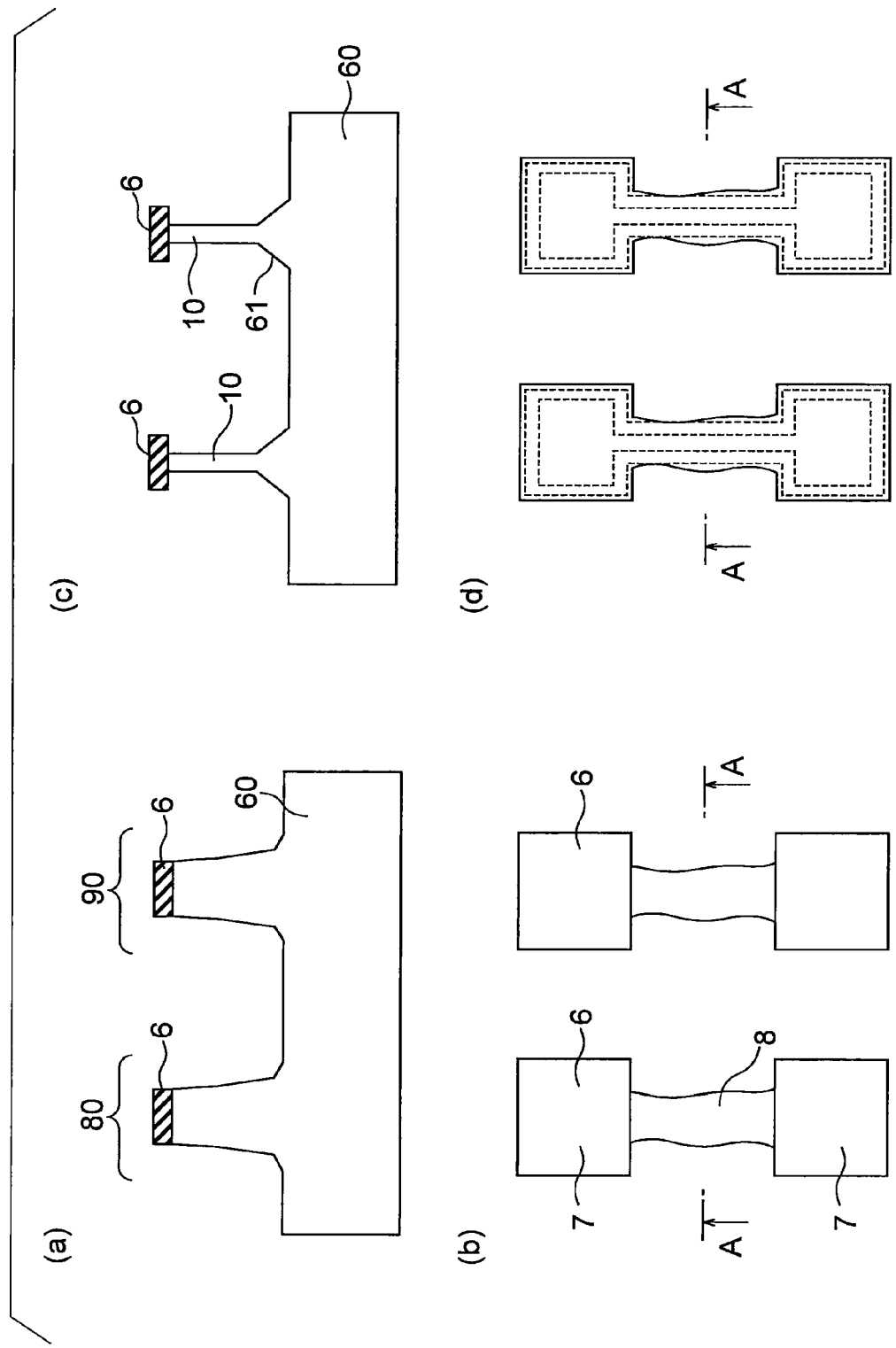
Figure 29:
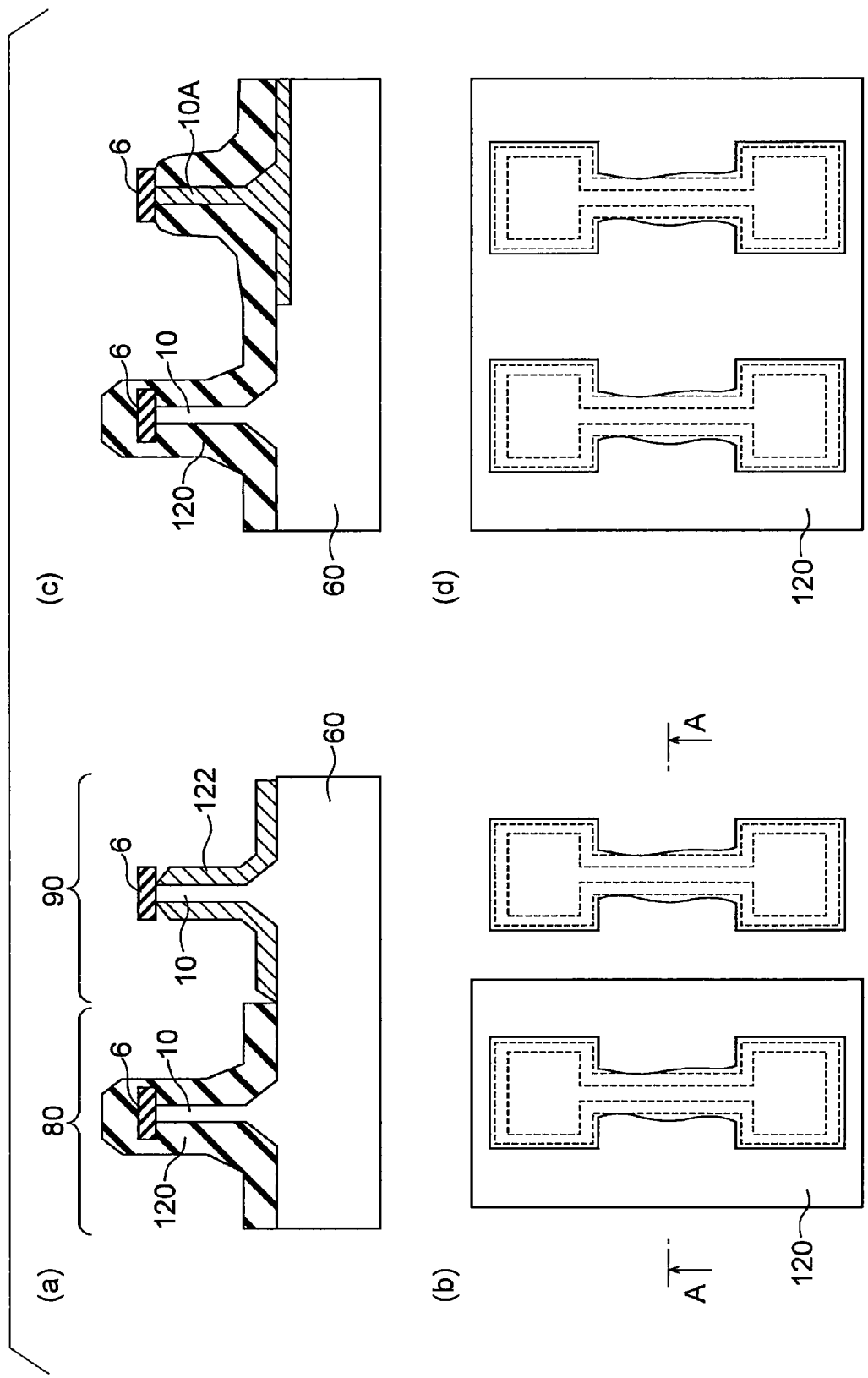
Figure 30:
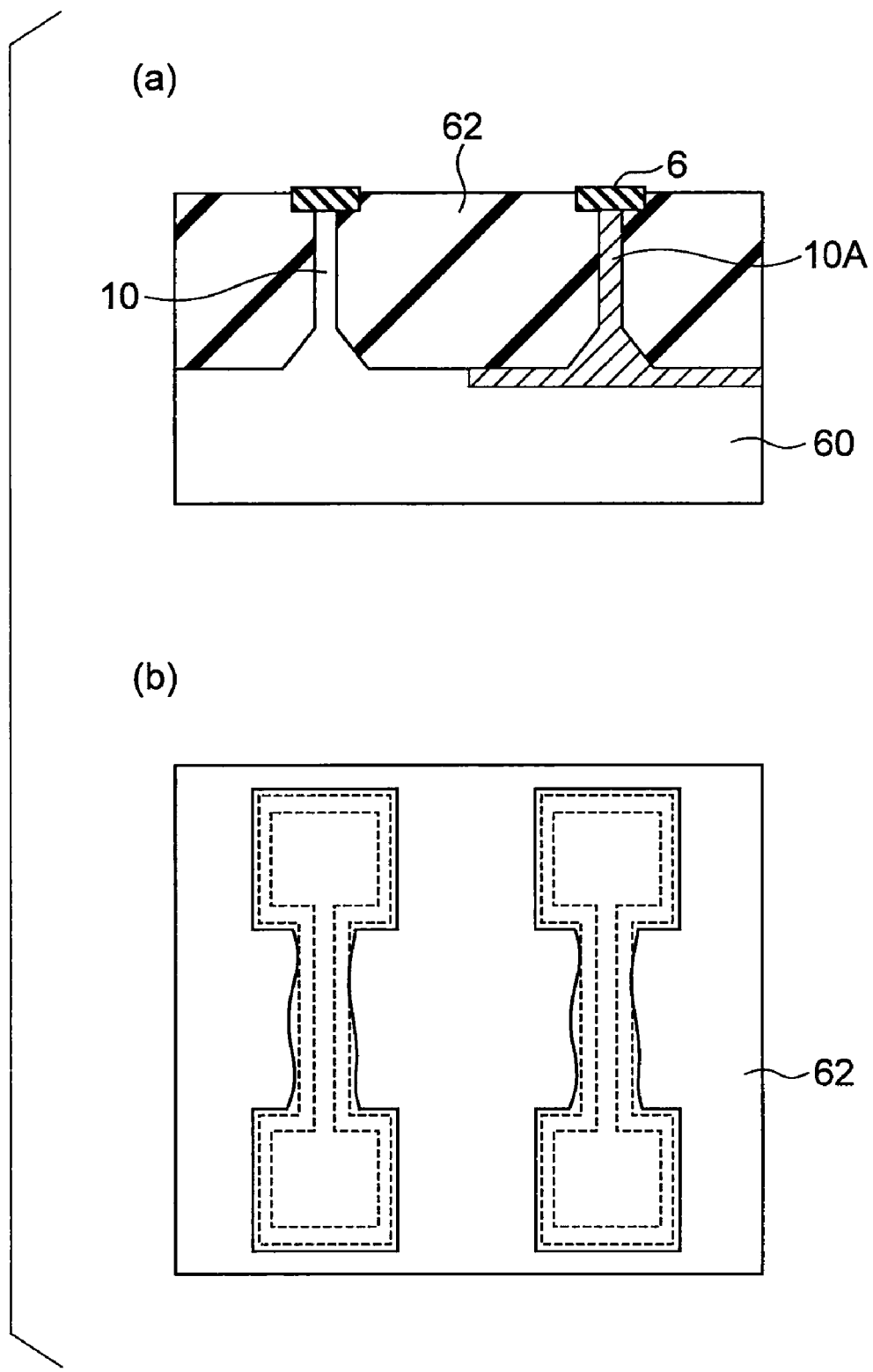

Referring now to FIGS. 24(a) to 27(b), a method for manufacturing a CMOSFET in accordance with a ninth embodiment of the present invention is described. This embodiment relates to a method for manufacturing a CMOSFET that includes an n-channel Fin FET having the channel formed with a Si layer, and a p-channel Fin FET having the channel formed with a strained SiGe layer. In this CMOSFET, the n-channel Fin FET and the p-channel Fin FET are formed on a bulk Si substrate. FIGS. 24(a) to 24(c) are cross-sectional views illustrating procedures to be carried out by the manufacture method in accordance with this embodiment. FIGS. 25(a), 25(c), 26(a), 26(c), and 27(a) are cross-sectional views illustrating manufacturing procedures. FIGS. 25(b), 25(d), 26(b), 26(d), and 27(b) are plan views. FIGS. 25(a), 25(c), 26(a), 26(c), and 27(a) are cross-sectional views, taken along each line A-A of FIGS. 25(b), 25(d), 26(b), 26(d), and 27(b).

First, as shown in FIG. 24(a), a 20-nm thick thermal oxide film 100 is formed on a bulk Si substrate 60 having the (001) plan as the principal surface. After that, a photoresist is applied onto the thermal oxide film 100, and a resist pattern 102 is left on an n-channel transistor formation region 80 by a photolithography technique. With the resist pattern 102 serving as a mask, RIE is performed to remove the thermal oxide film 100 on a p-channel transistor formation region 90, and form a 60-nm deep groove 104 in the Si substrate 60.

Next, as shown in FIG. 24(b), the resist pattern 102 is removed, and a $Si_{0.7}Ge_{0.3}$ film 106 is formed through epitaxial growth in the groove 104, so that the surface of the p-channel transistor formation region 90 is in the same plane as the Si surface of the n-channel transistor formation region 80. After the thermal oxide film 100 on the n-channel transistor formation region 80 is removed, a 2-nm thick thermal oxide film 108 is formed on the entire surface, and a 20-nm thick silicon nitride film 110 is deposited on the entire surface, as shown in FIG. 24(c).

Patterning is then performed on the silicon nitride film 110 and the thermal oxide film 108 by a lithography technique and RIE using an electron beam or an excimer laser. As a result, as shown in FIGS. 25(a) and 25(b), hard masks 9 formed with the thermal oxide film 108 and the silicon nitride film 110 are formed at the source and drain portions 7 and the portion 8 to be the channel region on the n-channel transistor formation region 80 and the p-channel transistor formation region 90, respectively. Here, the channel direction is the <1-10> direction, and the width of each of the hard masks 9 is 40 nm. With the hard masks 9 being used, RIE is performed to form the source and drain portions 7 and the portion 8 to be the channel region into mesa shapes.

The same procedures as those of the sixth embodiment illustrated in FIGS. 12(c) and 12(d) are then carried out, so as to form mesa structures that include a fin 10 and a fin 10A on the n-channel transistor formation region 80 and the p-channel transistor formation region 90, respectively. The fin 10 and the fin 10A have flat {110} planes as sidewalls that are perpendicular to the principal surface of the substrate (FIGS. 25(c) and 25(d)). At this point, {111} planes appear at the connecting portions between the fins and the substrate at the bottom portions of the mesa structures. The {111} planes cross the {110} planes of the sidewalls of the fins.

Next, as shown in FIGS. 26(a) and 26(b), an interlayer insulating film 62 is deposited on the entire surface, and flattening is performed on the interlayer insulating film 62 by CMP until the upper faces of the hard masks 9 are exposed. As shown in FIGS. 26(c) and 26(d), the interlayer insulating film 62 is further etched to expose the sidewalls of the fins 10 and 10A, and the eaves 9a (see FIG. 26(a)) of the hard masks 9 are removed.

The same procedures as those of the sixth embodiment are then carried out to form a gate oxide film 12 on each of the channel regions of the fins 10 and 10A, and form gate electrodes 13 to cover the gate oxide films 12, as shown in FIGS. 27(a) and 27(b). After that, the same procedures as those of the sixth embodiment are continued, so as to form a CMISFET.

As described above, in accordance with this embodiment, size and shape variations among channels are made as small as possible, and field effect transistors having the smallest possible channel widths can be obtained, as in the sixth embodiment.

Tenth Embodiment

Referring now to FIGS. 28(a) to 30(b), a method for manufacturing a CMOSFET in accordance with a tenth embodiment of the present invention is described. This embodiment relates to a method for manufacturing a CMOSFET that includes an n-channel Fin FET having the channel formed with a Si layer, and a p-channel Fin FET having the channel formed with a strained SiGe layer. In this CMOSFET, the n-channel Fin FET and the p-channel Fin FET are formed on a bulk Si substrate. FIGS. 28(a), 28(c), 29(a), 29(c), and 30(a) are cross-sectional views illustrating manufacturing procedures. FIGS. 28(b), 28(d), 29(b), 29(d), and 30(b) are plan views. FIGS. 28(a), 28(c), 29(a), 29(c), and 30(a) are cross-sectional views, taken along each line A-A of FIGS. 28(b), 28(d), 29(b), 29(d), and 30(b).

First, the same procedures as those of the sixth embodiment are carried out to form hard masks 6 formed with silicon nitride film on a bulk Si substrate 60 having a (001) plane as the principal surface. With the hard masks 6 being used, RIE is performed to form source and drain portions 7 and a portion 8 to be the channel region into mesa shapes on an n-channel transistor formation region 80 and a p-channel transistor formation region 90, respectively.

The same procedures as those of the sixth embodiment illustrated in FIGS. 12(c) and 12(d) are then carried out, so as to form mesa structures that include a fin 10 on each of the n-channel transistor formation region 80 and the p-channel transistor formation region 90. The fins 10 have flat {110} planes as sidewalls that are perpendicular to the principal surface of the substrate (FIGS. 28(c) and 28(d)). At this point, {111} planes appear at the connecting portions between the fins and the substrate at the bottom portions of the mesa structures. The {111} planes cross the {110} planes of the sidewalls of the fins 10.

After a silicon oxide film is deposited on the entire surface, the silicon oxide film on the p-channel transistor formation region 90 is removed by a photolithography technique and chemical dry etching or wet etching, and a silicon oxide film 120 is left only on the n-channel transistor formation region 80, as shown in FIGS. 29(a) and 29(b). After that, a 10-nm $Si_{0.85}Ge_{0.15}$ film 122 is formed through selective epitaxial growth on each sidewall of the fin 10 on the p-channel transistor formation region 90 (FIG. 29(a)).

Next, as shown in FIGS. 29(c) and 29(d) the p-channel transistor formation region 90 is thermally oxidized, and the Ge-condensation process are performed until the width of the fin 10A on the p-channel transistor formation region 90 becomes 10 nm. In this manner, the Ge composition is increased to 30%. At this point, the side portions of the fin 10A are covered with the silicon oxide film 120.

After the entire surface of the Si substrate is filled with a silicon oxide film 62, flattening is performed by CMP until the upper faces of the hard masks 6 are exposed, as shown in FIGS. 30(a) and 30(b). After that, the same procedures as those of the ninth embodiment are carried out, so as to form a CMOSFET.

In each of the above described first to tenth embodiments, modifications may be made to the gate insulating film, the gate electrode, and the source and drain structure. As for the gate insulating film, it is possible to use a high permittivity (high-k) dielectric material other than $HfO_2$ mentioned in each embodiment, such as HfSiON, $HfSiO_2$, $HfO_2$, $HfArO_x$, or $ZrO_2$. It is also possible to use a stacked structure formed with one of those high-k dielectric materials and an interface layer made of $SiO_2$ or $GeO_2$. Alternatively, a Si oxynitride film (SiON) may be used. Also, it is of course possible to use a $SiO_2$ film.

As for the gate electrode, it is possible to use Ni silicide, TiN, Ni germanide ($Ni_{1-x}Ge_x$), Ni germano silicide (NiSi (Ge)), W silicide, TiSiN, TaN, TaSiN, WN, AlN, or the like. Also, it is possible to combine techniques for reducing the parasitic resistance in the source and drain portions used in conventional CMOS manufacturing processes. For example, a Si layer, a SiGe layer, or a Ge layer can be made thicker through selective epitaxial growth. Alternatively, the source and drain portions may be entirely or partially formed with metal silicides.

The appropriate temperature for performing hydrogen thermal etching is in the range of 950° C. to 1100° C. This is because the etching effect becomes smaller if the temperature is lower than 950° C., and each fin does not maintain its rectangular shape and is put into a dot-like state if the temperature becomes higher than 1100° C. To achieve a sufficient etching effect, the hydrogen partial pressure should be $0.2 \times 10^5$ Pa or higher. The effective etching time, or the total of the time during which the above thermal etching conditions are satisfied in a ramping up and down processes and the time during which etching is performed at a fixed temperature, is in the range of one minute to 30 minutes.

At the time of hydrogen annealing, it is possible to add annealing under conditions other than the temperature and pressure for the above thermal etching (for example, annealing at a temperature lower than 950° C. with a hydrogen partial pressure of $1 \times 10^5$ Pa, or annealing at 1000° C. with a hydrogen partial pressure of $0.1 \times 10^5$ Pa). By doing so, the flattening effect of surface migration can be achieved as well as the effect of anisotropic hydrogen thermal etching.

The hydrogen partial pressure in either a ramping up or a ramping down processes or in both a ramping up and a ramping down processes may be set at a value smaller than $0.2 \times 10^5$ Pa. By doing so, the etching in a ramping up or a ramping down processes can be restricted, and the etching controllability can be increased.

The pre-processing of the hydrogen thermal etching may involve not only the processing with diluted hydrofluoric acid but also formation of a silicon oxide film of 1 nm to 5 nm in thickness. The oxide film may be formed through thermal oxidization, or may be formed with ozone water or hydrogen peroxide. In that case, the oxide film vaporizes during a ramping up process in a hydrogen annealing furnace, and accordingly, the Si or SiGe surface is not exposed to the atmosphere. Thus, the reproducibility of the thermal etching is increased.

Also, fins or an array of stacked nanowires may be connected to a pair of source and drain regions, and be regarded as a single transistor. Further, the procedures according to any of the first to fifth embodiments may be carried out to form a structure including a bulk Si substrate. In that case, the filling procedure involving an interlayer insulating film and the procedure for removing the interlayer insulating film to expose the top of the fin, as illustrated in FIGS. 12(e) to 13(b), are added to the procedures according to any of the first to fifth embodiments.

According to the manufacture method of any embodiment of the present invention, a semiconductor film containing Si or Ge is formed on a Si substrate or a SOI substrate, and a hard mask of an insulating film is formed at the uppermost portion of the semiconductor film. With the use of the hard mask, the semiconductor film is formed into a mesa structure, and is subjected to a heat treatment in a hydrogen atmosphere of $0.2 \times 10^5$ Pa or higher at a temperature between 950° C. and 1100° C. Through the heat treatment, the sidewalls of the mesa are etched and are flattened, as a low-index plane such as a (110) plane appears on each sidewall. Accordingly, the width of the mesa is reduced, while the sidewalls of the mesa are flattened. In the manufacture of Fin FETs, line edge roughness and variations in the cross-sectional shape caused by the lithography process are made smaller, and fins of 10 nm or less having uniform widths in width can be produced.

In the formation of a multi-nanowire channel in which nanowires are stacked in a direction perpendicular to the substrate, as in the fourth or fifth embodiment, the widths of the upper portion and the lower portion of the channel can be made equal to each other by virtue of the appearance of a crystal plane perpendicular to the substrate. As a result, variations in device characteristics among Fin FETs and multi-nanowire FETs are reduced, and higher driving current can be achieved.

Each of the embodiments of the present invention can provide field effect transistors and a method for manufacturing the field effect transistors among which size and shape variations among channels are made as small as possible, and channels having the smallest possible channel widths can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for manufacturing a field effect transistor, comprising:
   forming a mask comprising an insulating film on a semiconductor layer containing Si, the semiconductor layer being formed on a semiconductor substrate;
   forming the semiconductor layer into a mesa structure by performing etching with the use of the mask, the mesa structure having a pair of sidewalls extending in a first direction parallel to an upper face of the semiconductor substrate, the sidewalls facing each other;
   reducing a distance between the sidewalls to be less than a width of the mask in a second direction perpendicular to the first direction and flattening the sidewalls by performing a heat treatment in a hydrogen atmosphere, the flattened sidewalls being formed with one of a {110} plane or a {111} plane;
   forming a gate insulating film covering the flattened sidewalls;
   forming a gate electrode covering the gate insulating film; and
   forming source and drain regions at portions of the mesa structure, the portions being located on two sides of the gate electrode.

2. The method according to claim 1, further comprising:
   oxidizing the flattened sidewalls of the mesa structure to form an oxide film on the flattened sidewalls and to thin the mesa structure; and
   removing the oxide film,
   being carried out before the forming the gate insulating film.

3. The method according to claim 1, wherein the semiconductor substrate is a SOI substrate having a Si layer formed on an insulating layer, the method further comprising:
   forming a SiGe film on the Si layer;
   performing thermal oxidation to turn a stacked structure of the Si layer and the SiGe film into a stacked structure of a SiGe layer and a silicon oxide layer; and
   removing the silicon oxide layer to leave the SiGe layer on the insulating layer,
   being carried out prior to the forming the mask.

4. The method according to claim 1, wherein the mesa structure having the flattened sidewalls is made of Si, the method further comprising:
   forming a SiGe film on each of the flattened sidewalls of the Si mesa structure;
   performing thermal oxidization to turn the Si mesa structure and the SiGe film into a SiGe mesa structure and a silicon oxide film, the SiGe mesa structure being thinner than the Si mesa structure and the silicon oxide film covering sidewalls of the SiGe mesa structure; and
   removing the silicon oxide film,
   being carried out prior to the forming the gate insulating film.

5. The method according to claim 1, wherein the mesa structure having the flattened sidewalls has a stacked structure of a Si film and a SiGe film, the method further comprising removing the SiGe film from the mesa structure prior to the forming the gate insulating film.

6. The method according to claim 1, wherein the mesa structure having the flattened sidewalls has a stacked structure of a first SiGe film and a second SiGe film having a higher Ge composition than that of the first SiGe film, the method further comprising removing the second SiGe film from the mesa structure prior to the forming the gate insulating film.

7. The method according to claim 1, wherein:
   the semiconductor substrate is a bulk Si substrate having a {001} plane as a principal surface; and
   each of the flattened sidewalls of the mesa structure is formed with a {110} plane, and a connecting portion between each of the flattened sidewalls and the Si substrate have a {111} plane as a surface.

8. The method according to claim 7, wherein the mesa structure is a SiGe mesa structure.

9. The method according to claim 1, wherein the heat treatment in the hydrogen atmosphere is carried out at a temperature between 950° C. and 1100° C. with a hydrogen partial pressure of $0.2 \times 10^5$ Pa or higher.

* * * * *